United States Patent
Yoon et al.

(10) Patent No.: US 11,201,156 B2
(45) Date of Patent: Dec. 14, 2021

(54) SEMICONDUCTOR DEVICES AND METHODS FOR FABRICATING THE SAME

(71) Applicant: SAMSUNG ELECTRONICS CO., LTD., Suwon-si (KR)

(72) Inventors: Chan-Sic Yoon, Anyang-si (KR); Dongoh Kim, Daegu (KR); Kiseok Lee, Hwaseong-si (KR); Sunghak Cho, Hwanseong-si (KR); Jemin Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/934,874

(22) Filed: Jul. 21, 2020

(65) Prior Publication Data

US 2020/0350319 A1 Nov. 5, 2020

Related U.S. Application Data

(63) Continuation of application No. 16/053,315, filed on Aug. 2, 2018, now Pat. No. 10,748,910.

(30) Foreign Application Priority Data

Jan. 8, 2018 (KR) .......................... 10-2018-0002384

(51) Int. Cl.
*H01L 27/108* (2006.01)
*H01L 21/762* (2006.01)
*H01L 21/311* (2006.01)

(52) U.S. Cl.
CPC .. *H01L 27/10897* (2013.01); *H01L 21/76229* (2013.01); *H01L 27/10814* (2013.01);
(Continued)

(58) Field of Classification Search
CPC ................................................. H01L 27/10897
See application file for complete search history.

(56) References Cited

U.S. PATENT DOCUMENTS 6,215,197 B1   4/2001   Iwamatsu
6,303,460 B1  10/2001   Iwamatsu
(Continued)

FOREIGN PATENT DOCUMENTS

KR    10-2005-0002063    1/2005
KR    10-2005-0052006    6/2005
(Continued)

*Primary Examiner* — William A Harriston
(74) *Attorney, Agent, or Firm* — F. Chau & Associates, LLC

(57) ABSTRACT

A semiconductor device includes a substrate that includes a cell region and a peripheral circuit region, a cell insulating pattern disposed in the cell region of the substrate that defines a cell active region, and a peripheral insulating pattern disposed in the peripheral circuit region of the substrate that defines a peripheral active region. The peripheral insulating pattern includes a first peripheral insulating pattern having a first width and a second peripheral insulating pattern having a second width greater than the first width. A topmost surface of at least one of the first peripheral insulating pattern and the second peripheral insulating pattern is positioned higher than a topmost surface of the cell insulating pattern.

20 Claims, 44 Drawing Sheets

(52) U.S. Cl.
CPC .. *H01L 27/10823* (2013.01); *H01L 27/10847* (2013.01); *H01L 27/10876* (2013.01); *H01L 27/10891* (2013.01); *H01L 27/10894* (2013.01); *H01L 21/31111* (2013.01); *H01L 21/31144* (2013.01)

(56) References Cited

U.S. PATENT DOCUMENTS

| | | |
|---|---|---|
| 6,462,428 B2 | 10/2002 | Iwamatsu |
| 6,509,232 B1 | 1/2003 | Kim et al. |
| 6,939,777 B2 | 9/2005 | Ohto et al. |
| 7,902,037 B2 | 3/2011 | Eun |
| 8,766,355 B2 | 7/2014 | Lee et al. |
| 9,721,830 B2 | 8/2017 | Park |
| 2005/0085048 A1* | 4/2005 | Hsiao ............... H01L 27/115 438/424 |
| 2005/0230780 A1 | 10/2005 | Ito et al. |
| 2013/0221427 A1 | 8/2013 | Siemieniec et al. |
| 2015/0357232 A1 | 12/2015 | Ujihara |
| 2015/0380484 A1 | 12/2015 | Yoshimochi |
| 2017/0012098 A1 | 1/2017 | Park |
| 2019/0214391 A1* | 7/2019 | Yoon ............... H01L 27/10897 |

FOREIGN PATENT DOCUMENTS

| | | |
|---|---|---|
| KR | 10-2006-0001126 | 1/2006 |
| KR | 10-2006-0025463 | 3/2006 |
| KR | 10-0567070 | 3/2006 |
| KR | 10-2006-0059414 | 6/2006 |
| KR | 10-0645460 | 11/2006 |
| KR | 10-0881135 | 2/2009 |
| KR | 10-2009-0022807 | 3/2009 |
| KR | 10-2009-0045668 | 5/2009 |
| KR | 10-0955677 | 5/2010 |
| KR | 10-0971432 | 7/2010 |

\* cited by examiner

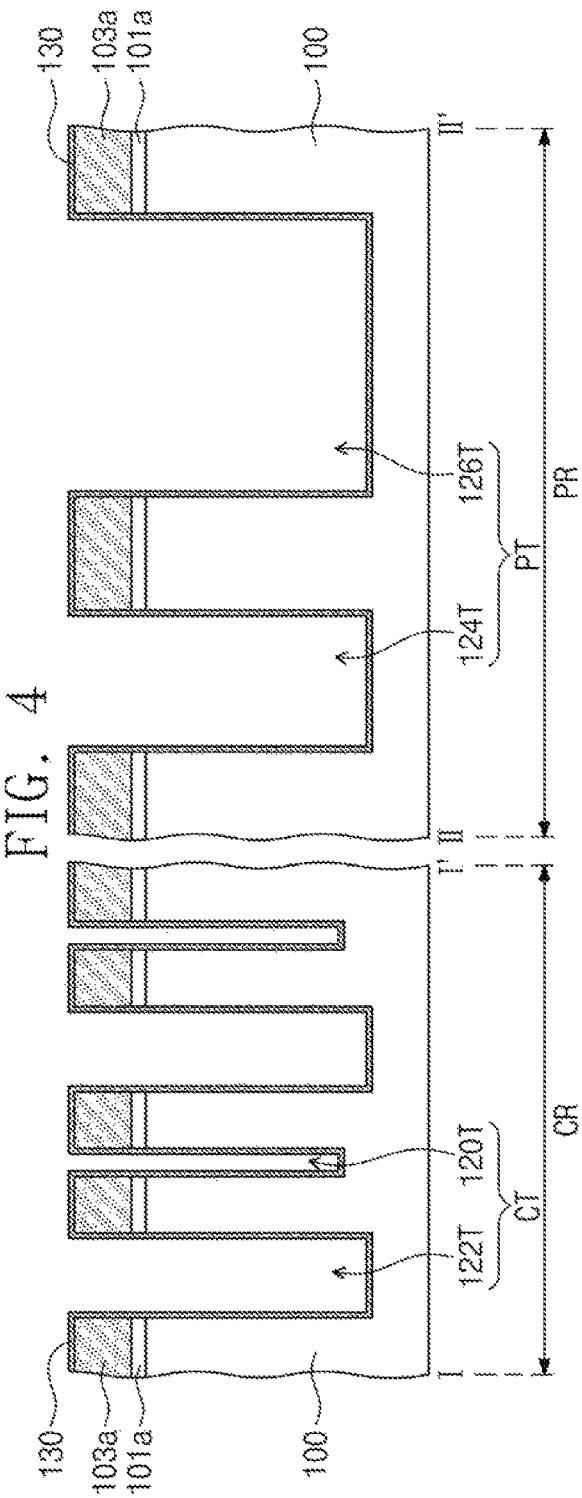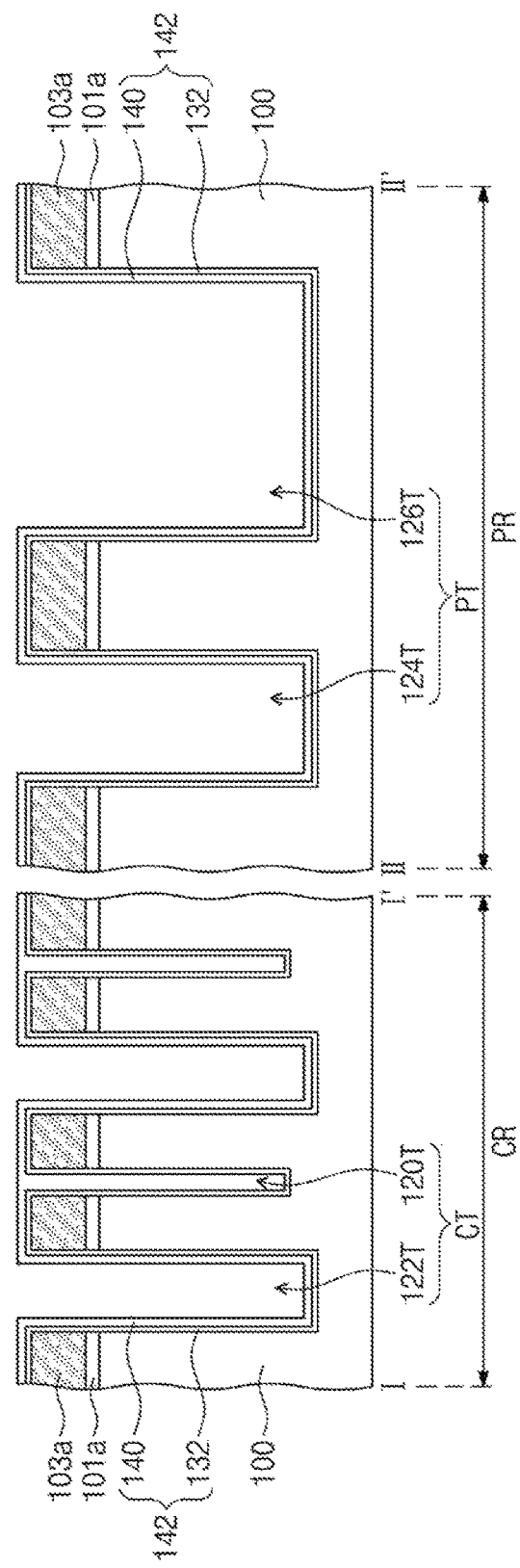

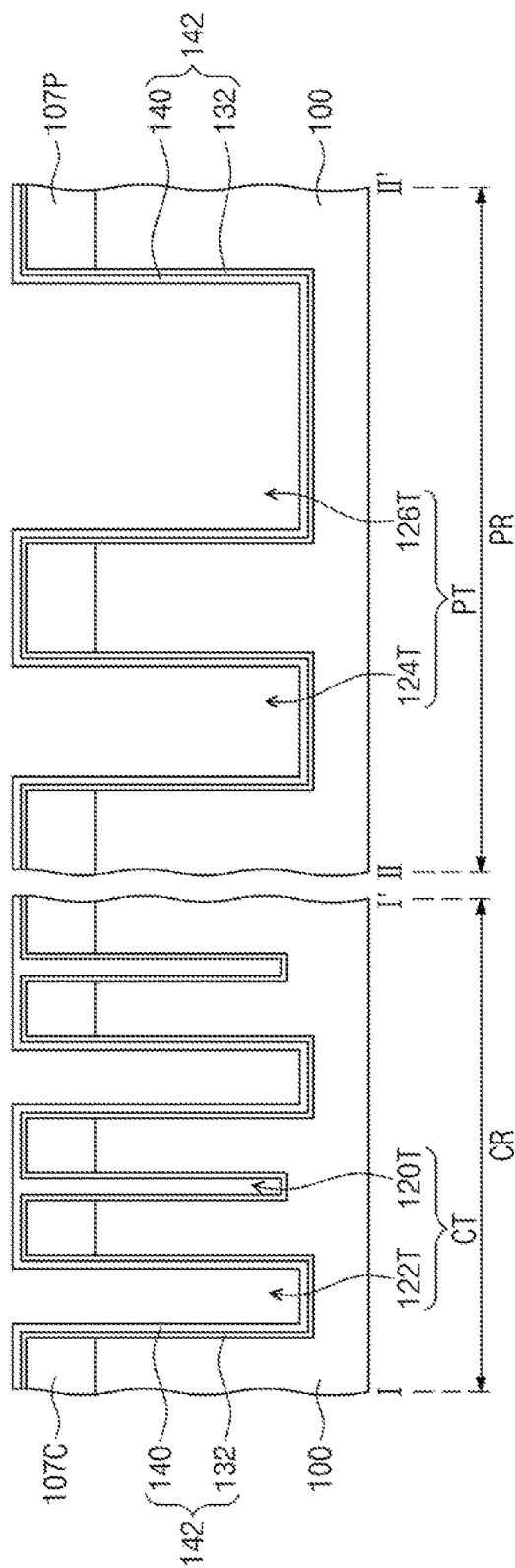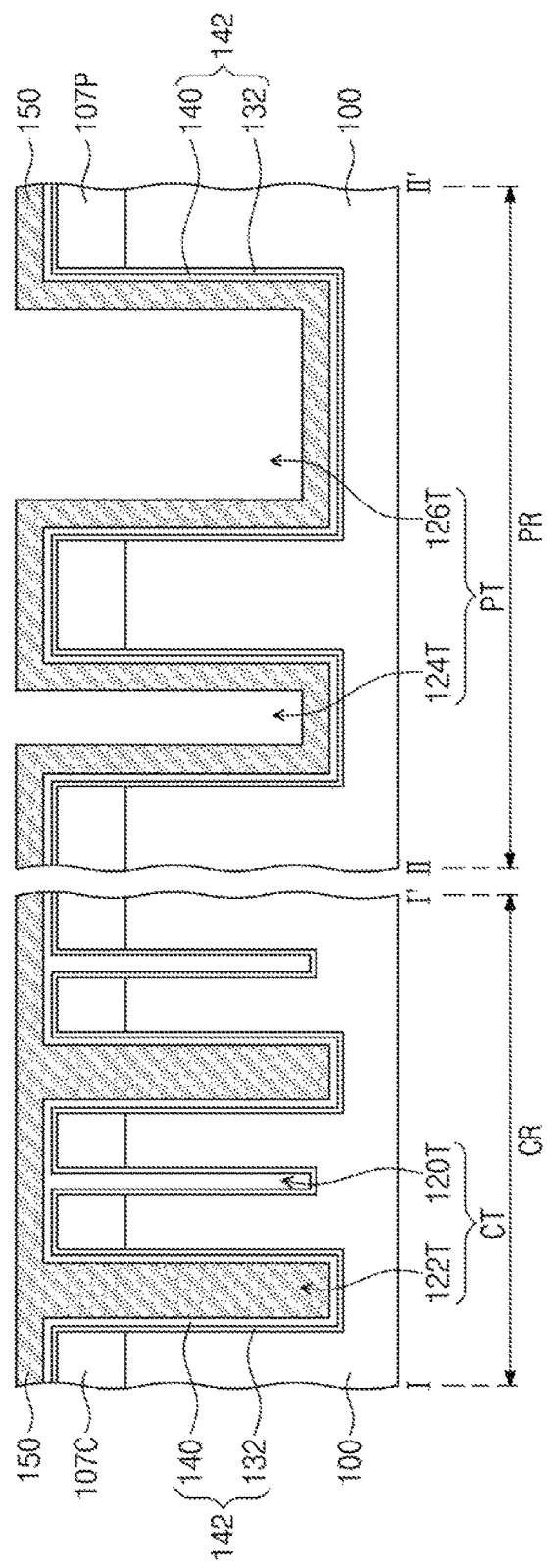

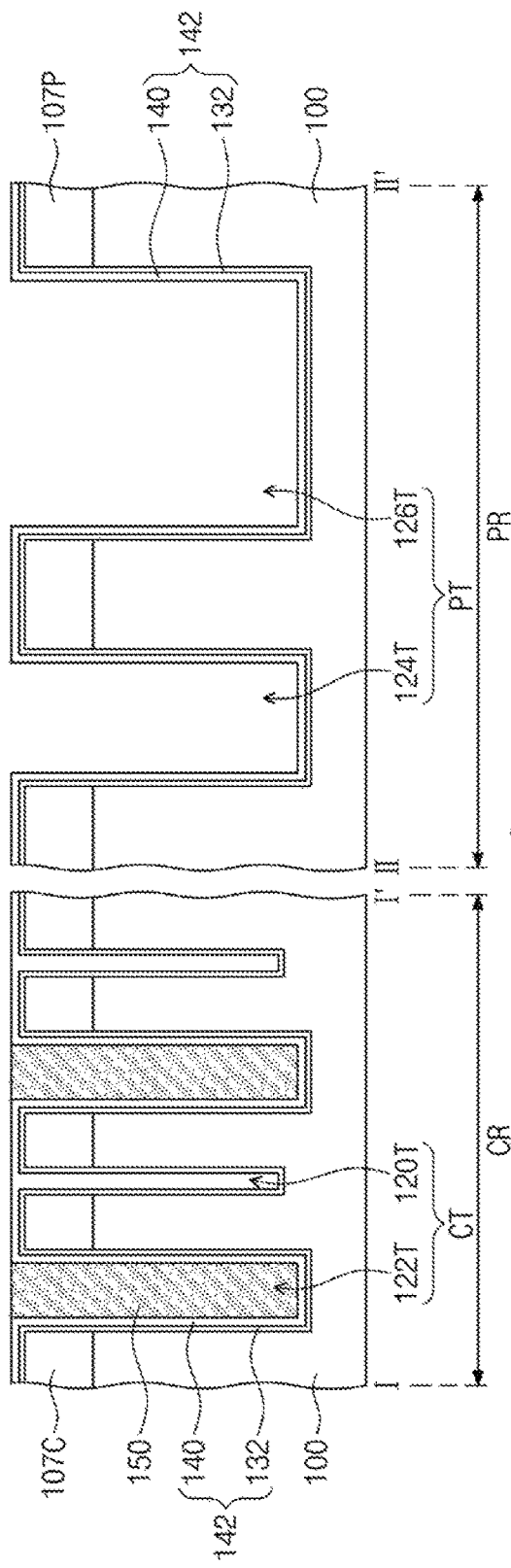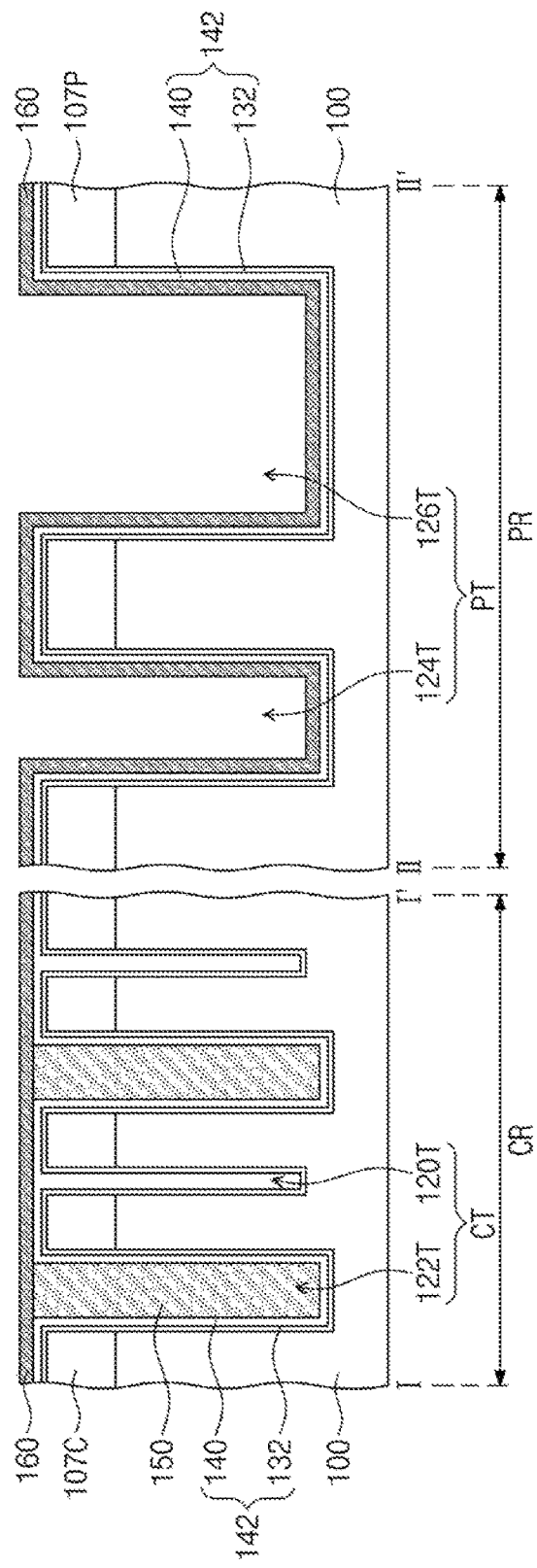

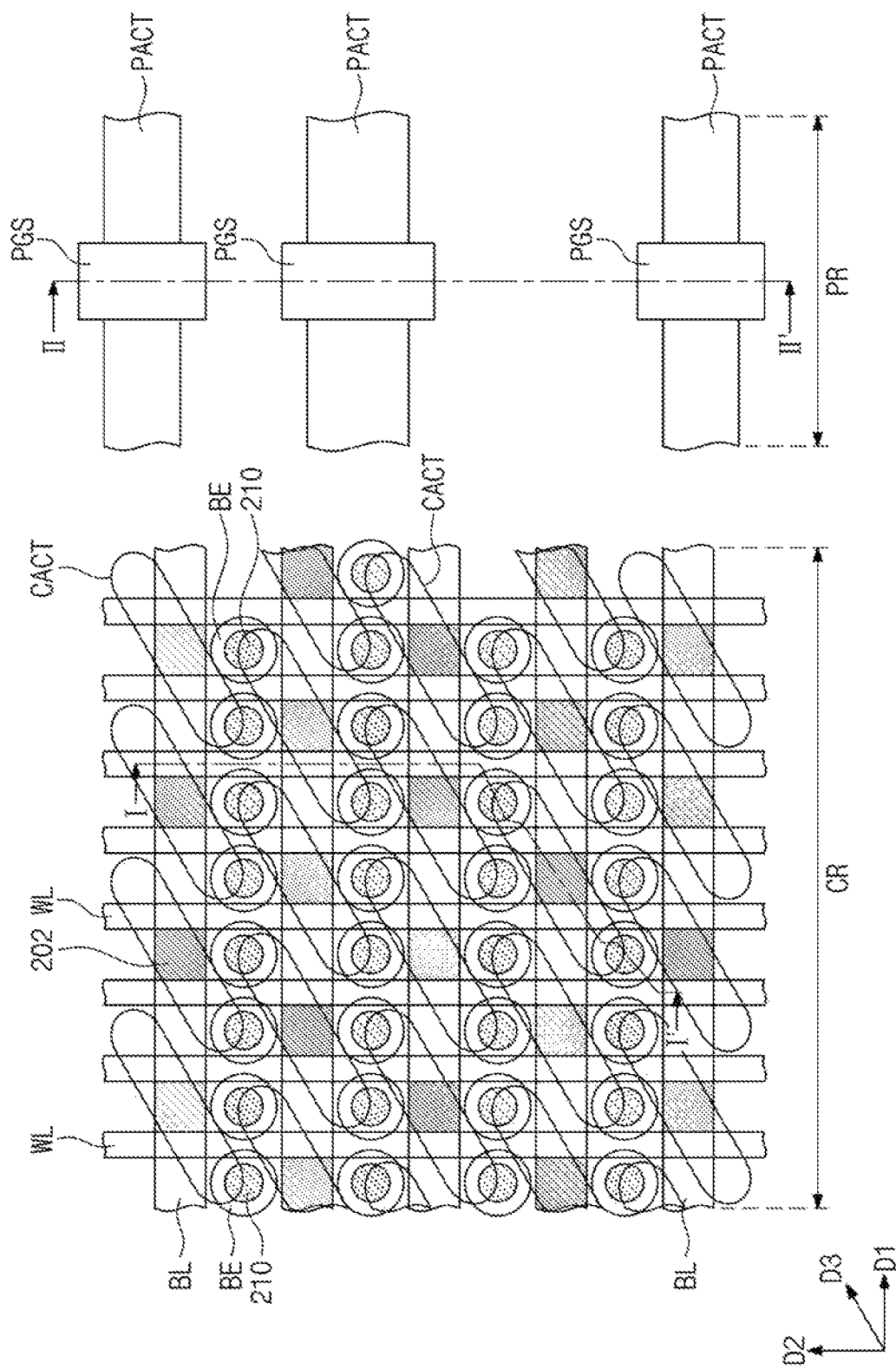

SEMICONDUCTOR DEVICES AND METHODS FOR FABRICATING THE SAME

CROSS-REFERENCE TO RELATED APPLICATION

This U.S. non-provisional patent application is a continuation of U.S. application Ser. No. 16/053,315, filed on Aug. 2, 2018 in the U.S. Patent and Trademark Office, which claims priority under 35 U.S.C. § 119 from, and the benefit of, Korean Patent Application No. 10-2018-0002384, filed on Jan. 8, 2018 in the Korean Intellectual Property Office, the contents of both of which are herein incorporated by reference in their entireties.

BACKGROUND

Embodiments of the inventive concepts are directed to semiconductor devices and methods for fabricating the same, and more particularly, to semiconductor devices that include field effect transistors and methods for fabricating the same.

Semiconductor devices include integrated circuits that include metal-oxide-semiconductor field effect transistors (MOSFETs). As sizes and design rules of semiconductor devices have been reduced, MOSFETs have been scaled down. Operating characteristics of semiconductor devices may deteriorate by the size reduction of the MOSFETs.

A semiconductor device may have a cell region and a peripheral region around the cell region, and a shallow-trench isolation (STI) layer of a cell region and a STI layer of a peripheral circuit region may each include a liner nitride layer. A liner nitride layer of the STI layer of the peripheral circuit region can function as an electron trap layer when a transistor is formed thereon. Thus, an effective channel length of the transistor is reduced. In addition, the STI layers of the cell region and the peripheral circuit region may be recessed from top surfaces of active regions. When the STI layer is recessed from the top surface of the active region, a gate electrode layer on the STI layer may not be completely etched during a gate patterning process. In this case, a portion of the gate electrode layer remains on the STI layer, which can cause an electrical short between adjacent gate electrodes.

SUMMARY

Embodiments of the inventive concepts provide semiconductor devices with improved electrical characteristics and methods for fabricating the same.

According to an embodiment of the disclosure, a semiconductor device includes a substrate that includes a cell region and a peripheral circuit region, a cell insulating pattern disposed in the cell region of the substrate that defines a cell active region, and a peripheral insulating pattern disposed in the peripheral circuit region of the substrate that defines a peripheral active region. The peripheral insulating pattern includes a first peripheral insulating pattern having a first width and a second peripheral insulating pattern having a second width greater than the first width. A topmost surface of at least one of the first peripheral insulating pattern and the second peripheral insulating pattern is positioned higher than a topmost surface of the cell insulating pattern.

According to an embodiment of the disclosure, a method for fabricating a semiconductor device includes providing a substrate that includes a cell region and a peripheral circuit region, forming a cell insulating pattern that defines a cell active region in the cell region of the substrate, forming a peripheral insulating pattern that defines a peripheral active region in the peripheral circuit region of the substrate and includes first and second peripheral insulating patterns having different widths from each other, and removing an upper portion of the cell insulating pattern in which a topmost surface of at least one of the first peripheral insulating pattern and the second peripheral insulating pattern is positioned higher than a topmost surface of the cell insulating pattern.

According to an embodiment of the disclosure, a method for fabricating a semiconductor device includes providing a substrate that includes a cell region and a peripheral circuit region; forming a cell insulating pattern by forming a cell trench in the cell region of the substrate that defines a cell active region in the cell region of the substrate, wherein the cell trench comprises a first cell trench and a second cell trench that have different widths from each other; forming a peripheral insulating pattern by forming a peripheral trench in the peripheral circuit region of the substrate that defines a peripheral active region in the peripheral circuit region of the substrate; forming a first oxide layer on the substrate that completely fills the first cell trench and conformally covers an inner surface of the second cell trench and the peripheral trench; forming a first nitride layer on the first oxide layer that fills a remaining region of the second cell trench and conformally cover an inner surface of the peripheral trench; removing the first nitride layer from the peripheral trench; and forming a second oxide layer on the substrate that fills the peripheral trench.

BRIEF DESCRIPTION OF THE DRAWINGS

FIGS. 2 to 11 and 12A are cross-sectional views that correspond to lines I-I' and II-II' of FIG. 1 that illustrate a method for fabricating a semiconductor device according to some embodiments of the inventive concepts.

FIGS. 29 to 38 and 39A are cross-sectional views that correspond to lines I-I' and II-I' of FIG. 1 that illustrate a method for fabricating a semiconductor device according to some embodiments of the inventive concepts.

FIG. 40 is a plan view of a semiconductor device according to some embodiments of the inventive concepts.

DETAILED DESCRIPTION OF THE EMBODIMENTS

Hereinafter, embodiments of the inventive concepts will be described in detail with reference to the accompanying drawings.

Figure 1:
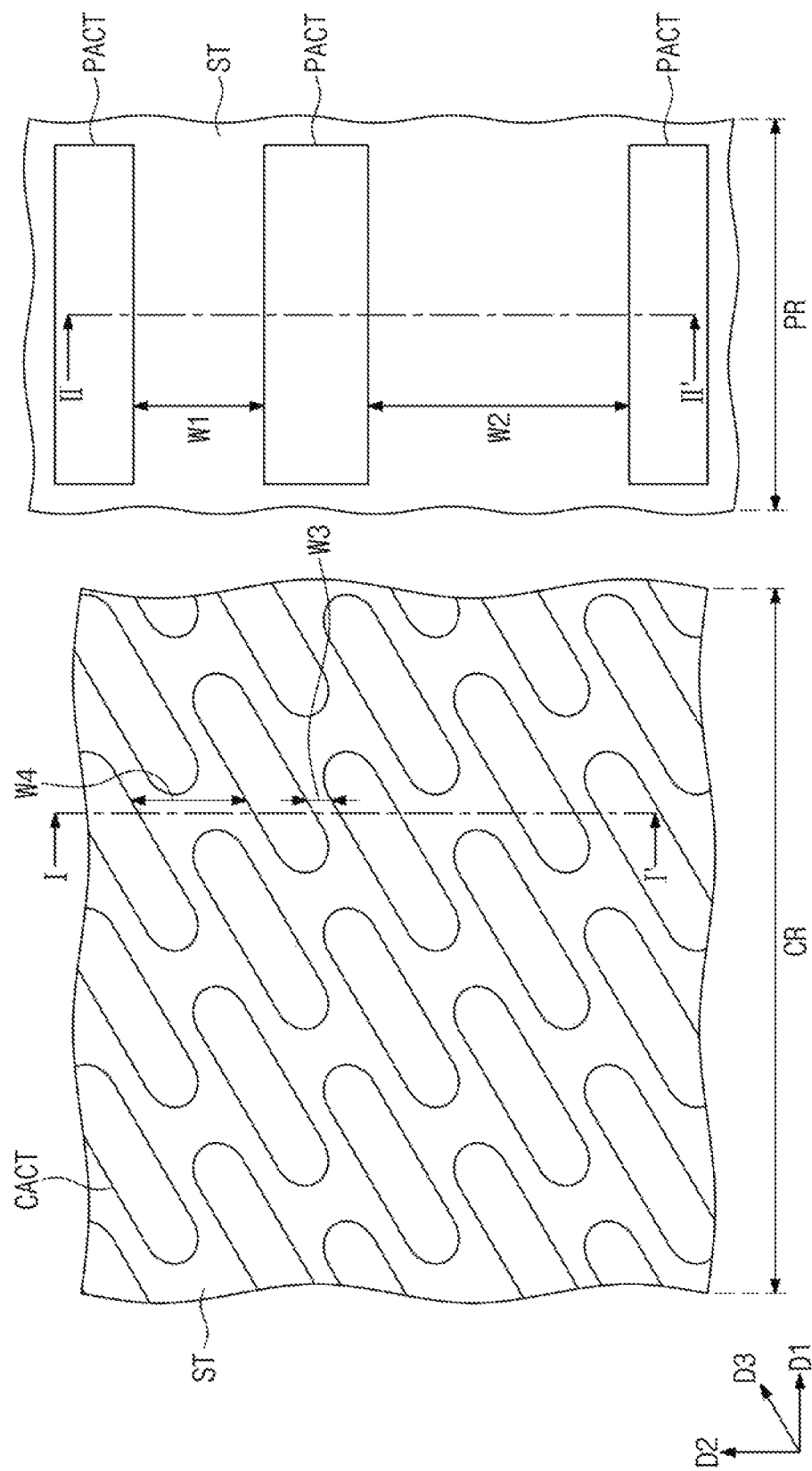
FIG. 1 is a plan view of a portion of a semiconductor device according to some embodiments of the inventive concepts that illustrates a method for fabricating a semiconductor device according to some embodiments of the inventive concepts.

FIG. 1 is a plan view of a portion of a semiconductor device according to some embodiments of the inventive concepts that illustrates a method for fabricating a semiconductor device according to some embodiments of the inventive concepts. FIGS. 2 to 11 and 12A are cross-sectional views that correspond to lines I-I' and II-II' of FIG. 1 that illustrate a method for fabricating a semiconductor device according to some embodiments of the inventive concepts.

Figure 2:
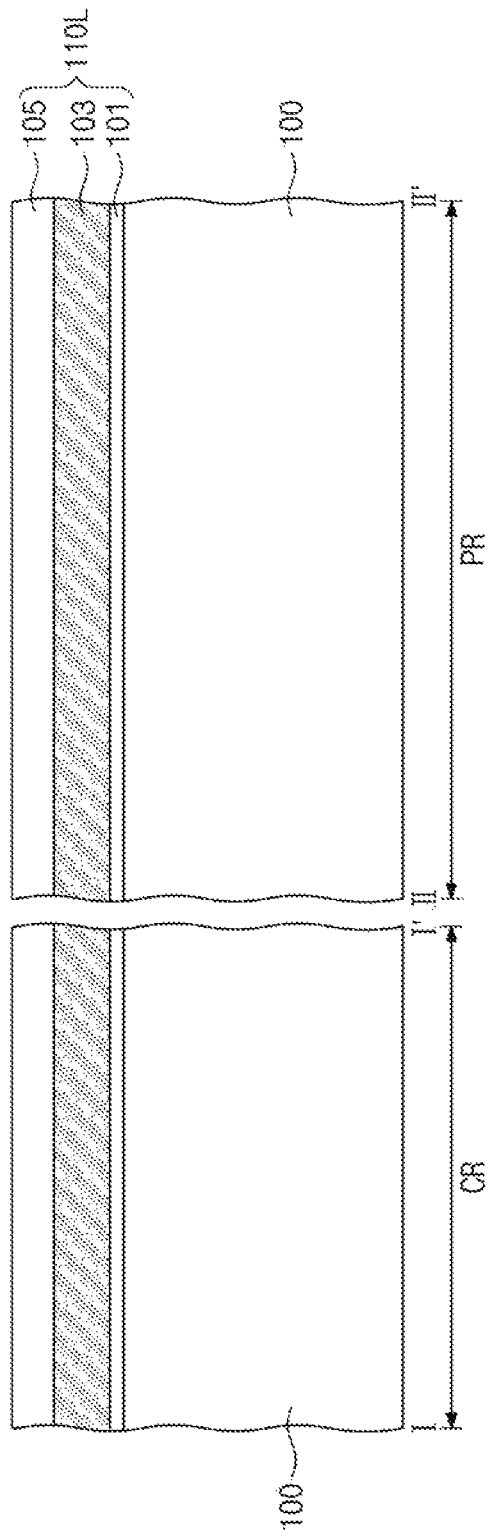

Referring to FIGS. 1 and 2, according to some embodiments, a mask layer 110L is formed on a substrate 100. The substrate 100 is a semiconductor substrate, such as a silicon substrate, a germanium substrate, or a silicon-germanium substrate. The substrate 100 includes a cell region CR on which memory cells are provided, and a peripheral circuit region PR on which peripheral circuits that drive the memory cells are provided. The mask layer 110L covers the cell region CR and the peripheral circuit region PR of the substrate 100. The mask layer 110L includes a first mask layer 101, a second mask layer 103 and a third mask layer 105, which are sequentially stacked on the substrate 100. The first and third mask layers 101 and 105 include an oxide, such as silicon oxide, and the second mask layer 103 includes a nitride, such as silicon nitride.

Figure 3:
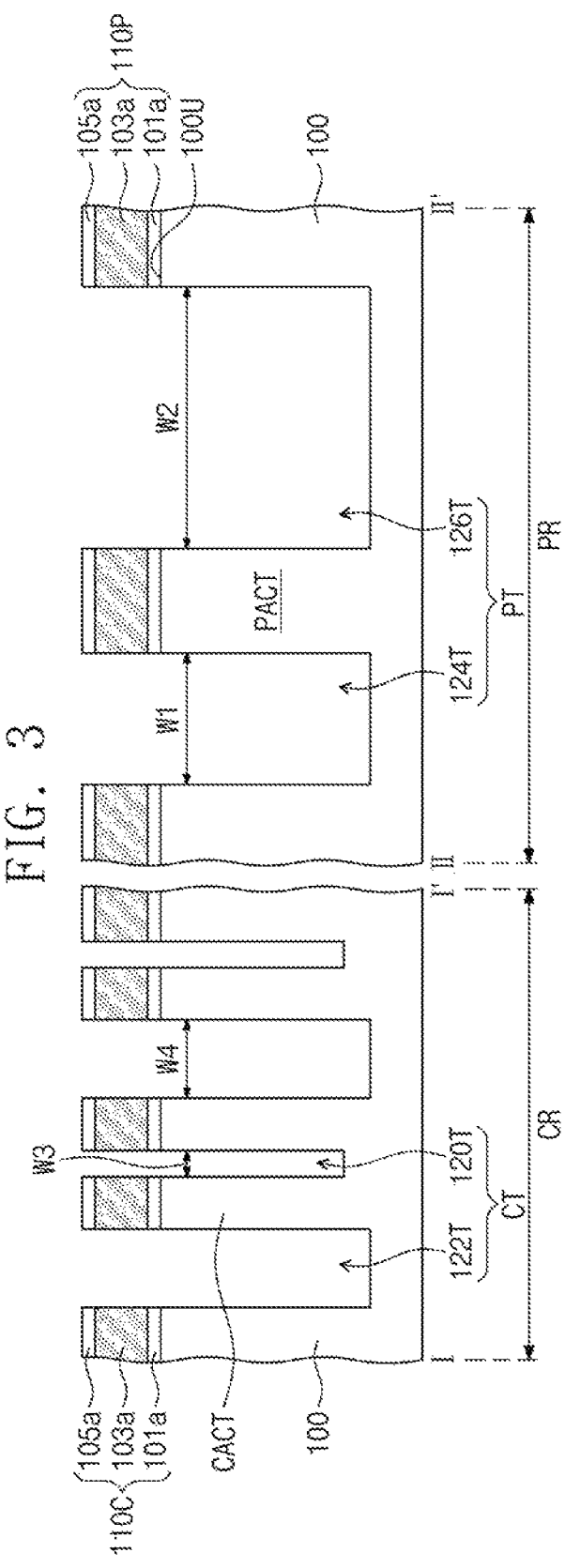

Referring to FIGS. 1 and 3, according to some embodiments, the mask layer 110L is patterned to form a cell mask pattern 110C and a peripheral mask pattern 110P. The cell mask pattern 110C defines a region on the cell region CR of the substrate 100 in which a cell active region CACT will be formed. The peripheral mask pattern 110P defines a region on the peripheral circuit region PR of the substrate 100 in which a peripheral active region PACT will be formed. Each of the cell mask pattern 110C and the peripheral mask pattern 110P includes a first mask pattern 101a, a second mask pattern 103a and a third mask pattern 105a, which are formed by patterning the first mask layer 101, the second mask layer 103 and the third mask layer 105, respectively.

According to some embodiments, a cell trench CT and a peripheral trench PT are formed in the cell region CR and the peripheral circuit region PR of the substrate 100, respectively. The formation of the cell trench CT and the peripheral trench PT includes performing an etching process using the cell mask pattern 110C and the peripheral mask pattern 110P as etch masks to etch the substrate 100. The cell trench CT defines the cell active region CACT and exposes a sidewall of the cell active region CACT. The peripheral trench PT defines the peripheral active region PACT and exposes a sidewall of the peripheral active region PACT. The cell active region CACT has a bar shape that extends in a third direction D3 that intersects a first direction D1 and a second direction D2 when viewed in a plan view. The first direction D1, the second direction D2 and the third direction D3 are parallel to a top surface 100U of the substrate 100, and the first direction D1 and the second direction D2 intersect each other. The peripheral active region PACT may have, but is not limited to, a plate shape when viewed in a plan view. After the cell trench CT and the peripheral trench PT are formed by the etching process, a portion of the third mask pattern 105a remains on the second mask pattern 103a.

According to some embodiments, the peripheral trench PT includes a first peripheral trench 124T having a first width W1 and a second peripheral trench 126T having a second width W2 greater than the first width W1. The cell trench CT includes a first cell trench 120T having a third width W3 and a second cell trench 122T having a fourth width W4 greater than the third width W3. In some embodiments, the third width W3 and the fourth width W4 are each less than the first width W1. Each of the first, second, third and fourth widths W1, W2, W3 and W4 is measured in one direction parallel to the top surface 100U of the substrate 100. The second cell trench 122T is deeper than the first cell trench 120T in the substrate 100.

Referring to FIGS. 1 and 4, according to some embodiments, the remaining portions of the third mask patterns 105a are removed. The remaining portions of the third mask patterns 105a can be removed by, for example, a strip process. Thereafter, a first semiconductor layer 130 is formed on the substrate 100. The first semiconductor layer 130 includes, for example, a poly-crystalline silicon layer. The first semiconductor layer 130 covers a top surface and a sidewall of the second mask pattern 103a and extends onto a sidewall of the first mask pattern 101a. The first semiconductor layer 130 partially fills each of the first cell trench 120T, the second cell trench 122T, the first peripheral trench 124T and the second peripheral trench 126T. The first semiconductor layer 130 conformally covers an inner surface of each of the first cell trench 120T, the second cell trench 122T, the first peripheral trench 124T and the second peripheral trench 126T.

Referring to FIGS. 1 and 5, according to some embodiments, the first semiconductor layer 130 is oxidized to form a first sub-oxide layer 132. A second sub-oxide layer 140 is formed on the first sub-oxide layer 132. The second sub-oxide layer 140 fills a remaining region of the first cell trench 120T. The second sub-oxide layer 140 includes, for example, silicon oxide. The second sub-oxide layer 140 can be formed by, for example, a chemical vapor deposition (CVD) process or an atomic layer deposition (ALD) process.

According to some embodiments, the second sub-oxide layer 140 covers the top surface and the sidewalls of the second mask pattern 103a and extends onto the sidewalls of the first mask pattern 101a. The second sub-oxide layer 140 completely fills the remaining region of the first cell trench 120T. The second sub-oxide layer 140 partially fills each of the second cell trench 122T, the first peripheral trench 124T and the second peripheral trench 126T. The second sub-oxide layer 140 conformally covers the inner surface of each of the second cell trench 122T, the first peripheral trench 124T and the second peripheral trench 126T. The first sub-oxide layer 132 is disposed between the second mask pattern 103a and the second sub-oxide layer 140 and between the first mask pattern 101a and the second sub-oxide layer 140. The first sub-oxide layer 132 is disposed between the second sub-oxide layer 140 and the inner surface of each of the first cell trench 120T, the second cell trench 122T, the first peripheral trench 124T and the second peripheral trench 126T.

According to some embodiments, the first sub-oxide layer 132 and the second sub-oxide layer 140 form a first oxide layer 142. The first oxide layer 142 completely fills the first cell trench 120T and conformally covers the inner surface of each of the second cell trench 122T, the first peripheral trench 124T and the second peripheral trench 126T.

Figure 6:
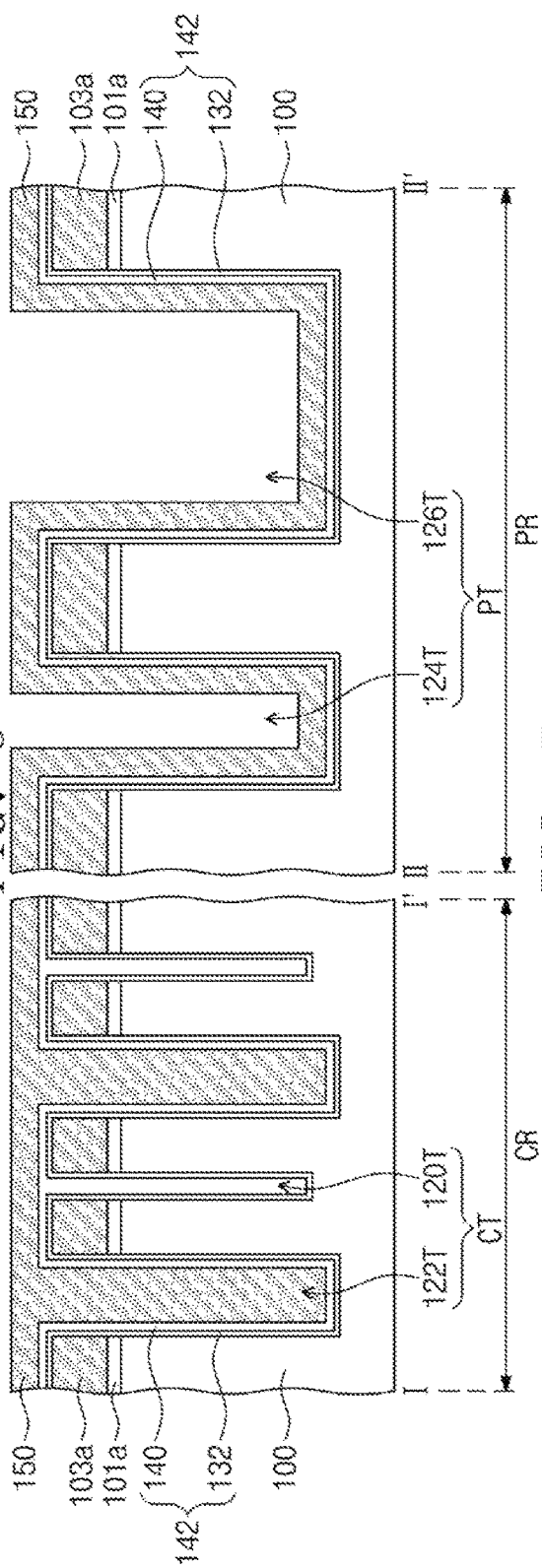

Referring to FIGS. 1 and 6, according to some embodiments, a first nitride layer 150 that fills a remaining region of the second cell trench 122T is formed on the first oxide layer 142. The first nitride layer 150 includes, for example, silicon nitride and may be formed by, for example, a CVD process or an ALD process. The first nitride layer 150 covers the second mask pattern 103a and the first mask pattern 101a and completely fills the remaining region of the second cell trench 122T. The first nitride layer 150 partially fills each of the first peripheral trench 124T and the second peripheral trench 126T. The first nitride layer 150 conformally covers the inner surface of each of the first peripheral trench 124T and the second peripheral trench 126T.

Figure 7:
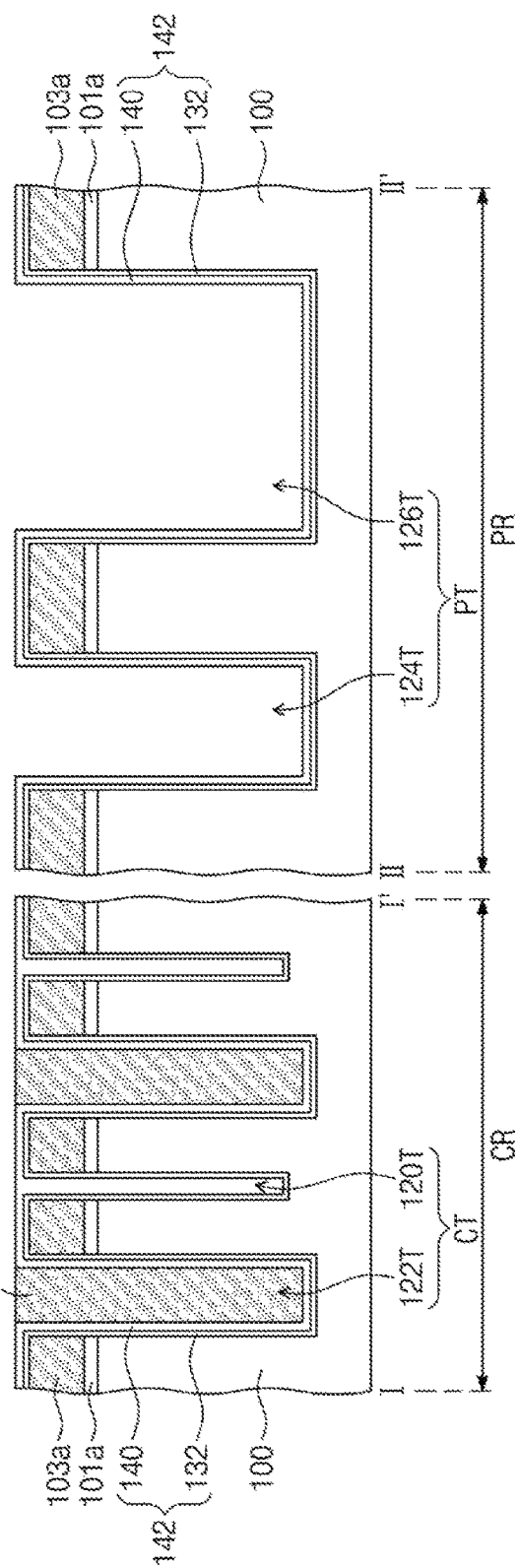

Referring to FIGS. 1 and 7, according to some embodiments, the first nitride layer 150 is removed from the first and second peripheral trenches 124T and 126T. For example, the removal of the first nitride layer 150 includes performing a wet etching process using an etching solution that includes phosphoric acid. The first nitride layer 150 on the peripheral circuit region PR is removed by the wet etching process, and thus the first oxide layer 142 on the peripheral circuit region PR is exposed. A portion of the first nitride layer 150 on the cell region CR is also removed by the wet etching process. Thus, a portion of the first oxide layer 142 on the cell region CR is exposed. A portion of the first nitride layer 150 that fills the second cell trench 122T is not removed by the wet etching process but remains on the cell region CR.

Figure 8:
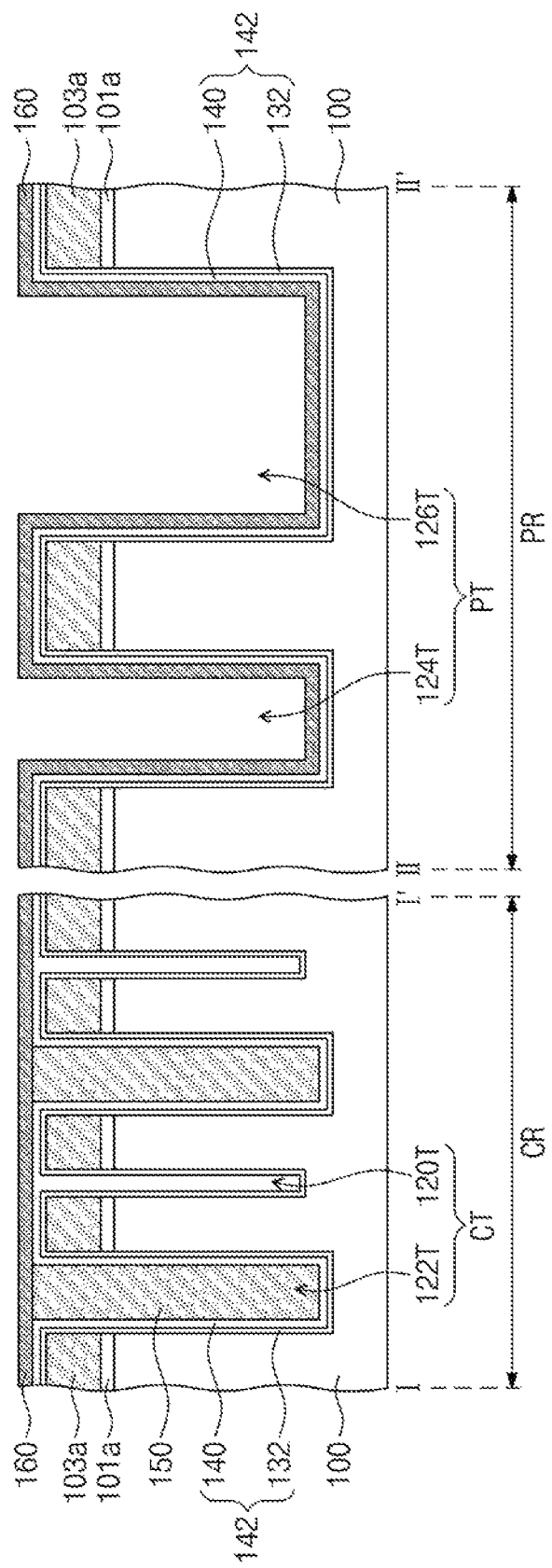

Referring to FIGS. 1 and 8, according to some embodiments, a second semiconductor layer 160 is formed on the substrate 100. The second semiconductor layer 160 includes, for example, a poly-crystalline silicon layer. The second semiconductor layer 160 covers the exposed portion of the first oxide layer 142 and the remaining portion of the first nitride layer 150 on the cell region CR. In addition, the second semiconductor layer 160 covers the first oxide layer 142 on the peripheral circuit region PR and partially fills each of the first and second peripheral trenches 124T and 126T. The second semiconductor layer 160 conformally covers the inner surface of each of the first and second peripheral trenches 124T and 126T.

Figure 9:
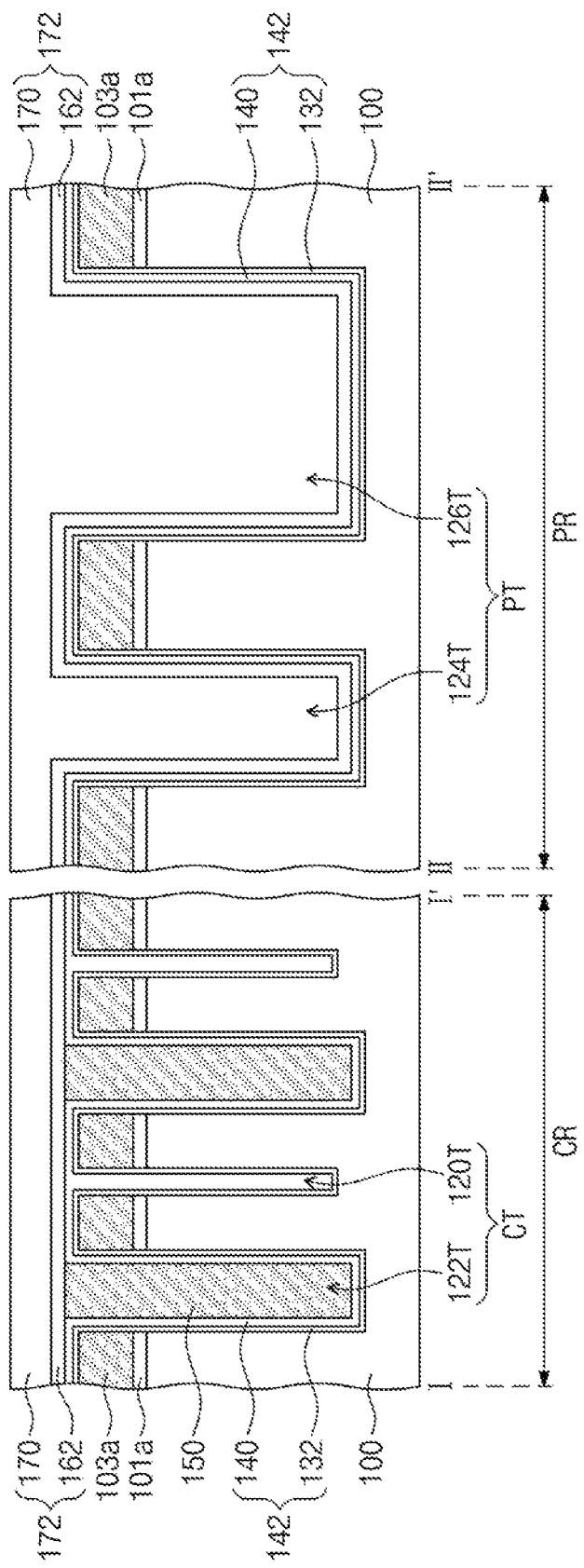

Referring to FIGS. 1 and 9, according to some embodiments, the second semiconductor layer 160 is oxidized to form a third sub-oxide layer 162. A fourth sub-oxide layer 170 is formed on the third sub-oxide layer 162 that covers the cell region CR and the peripheral circuit region PR of the substrate 100. The fourth sub-oxide layer 170 fills a remaining region of each of the first and second peripheral trenches 124T and 126T. The fourth sub-oxide layer 170 includes, for example, silicon oxide. The fourth sub-oxide layer 170 includes a material whose density is less than those of the first to third sub-oxide layers 132, 140 and 162. The fourth sub-oxide layer 170 is formed by, for example, a CVD process. The process of forming the fourth sub-oxide layer 170 can be performed at a relatively high temperature.

According to some embodiments, the fourth sub-oxide layer 170 completely fills the remaining regions of each of the first and second peripheral trenches 124T and 126T. The third sub-oxide layer 162 is disposed between the fourth sub-oxide layer 170 and the first oxide layer 142 on the peripheral circuit region PR. The third sub-oxide layer 162 is disposed between the fourth sub-oxide layer 170 and the inner surface of each of the first and second peripheral trenches 124T and 126T. In addition, on the cell region, the third sub-oxide layer 162 is disposed between the fourth sub-oxide layer 170 and the first oxide layer 142 and between the fourth sub-oxide layer 170 and the remaining portion of the first nitride layer 150.

According to some embodiments, the third sub-oxide layer 162 and the fourth sub-oxide layer 170 form a second oxide layer 172. The first oxide layer 142 and the second oxide layer 172 completely fill each of the first and second peripheral trenches 124T and 126T.

Figure 10:
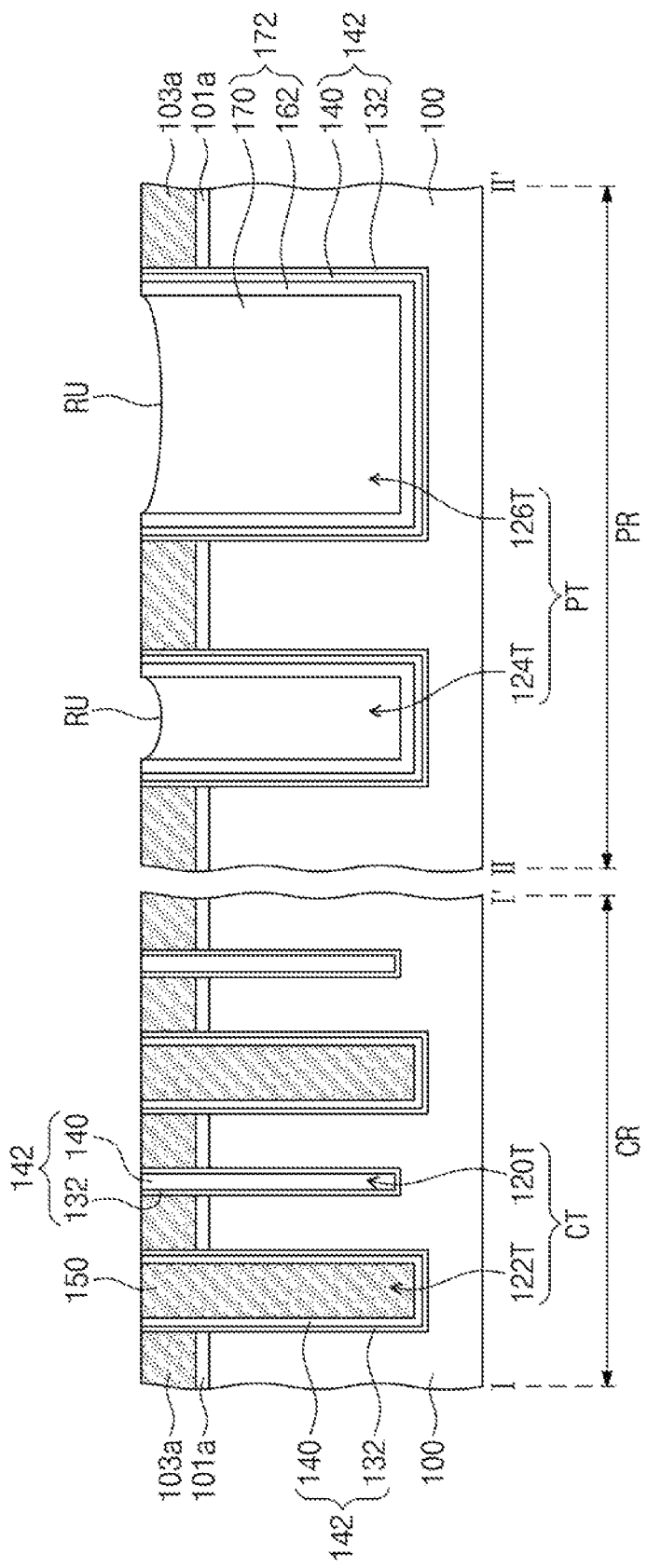

Referring to FIGS. 1 and 10, according to some embodiments, a planarization process is performed on the substrate 100 to remove a portion of the second oxide layer 172 and a portion of the first oxide layer 142. The planarization process is performed until the second mask pattern 103a is exposed. The remaining portion of the first nitride layer 150 is exposed by the planarization process.

After the planarization process, according to some embodiments, a portion of the first oxide layer 142 remains in each of the first cell trench 120T, the second cell trench 122T, the first peripheral trench 124T and the second peripheral trench 126T. The first cell trench 120T is completely filled with the remaining portion of the first oxide layer 142. The second cell trench 122T is completely filled with the remaining portion of the first oxide layer 142 and the remaining portion of the first nitride layer 150. After the planarization process, a portion of the second oxide layer 172 remains in each of the first and second peripheral trenches 124T and 126T. Each of the first and second peripheral trenches 124T and 126T is completely filled with the remaining portion of the first oxide layer 142 and the remaining portion of the second oxide layer 172. The remaining portion of the second oxide layer 172 includes a top surface RU that is recessed downward. In detail, the material of the fourth sub-oxide layer 170 is less dense than those of the first to third sub-oxide layers 132, 140 and 162, and thus the fourth sub-oxide layer 170 is recessed deeper than the first to third sub-oxide layers 132, 140 and 162 during the planarization process. The recessed top surface RU of the remaining portion of the second oxide layer 172 corresponds to a recessed top surface of the fourth sub-oxide layer 170.

Thereafter, according to some embodiments, a plasma treatment process is performed on the substrate 100. The plasma treatment process modifies a surface of the fourth sub-oxide layer 170. For example, since the fourth sub-oxide layer 170 includes a less dense material, more of the fourth sub-oxide layer 170 would be lost by a subsequent wet etching process. Thus, a plasma treatment process is performed on the surface of the fourth sub-oxide layer 170 to prevent the fourth sub-oxide layer 170 from being etched during a subsequent wet etching process. The plasma treatment process is performed using, for example, nitrogen.

Figure 11:
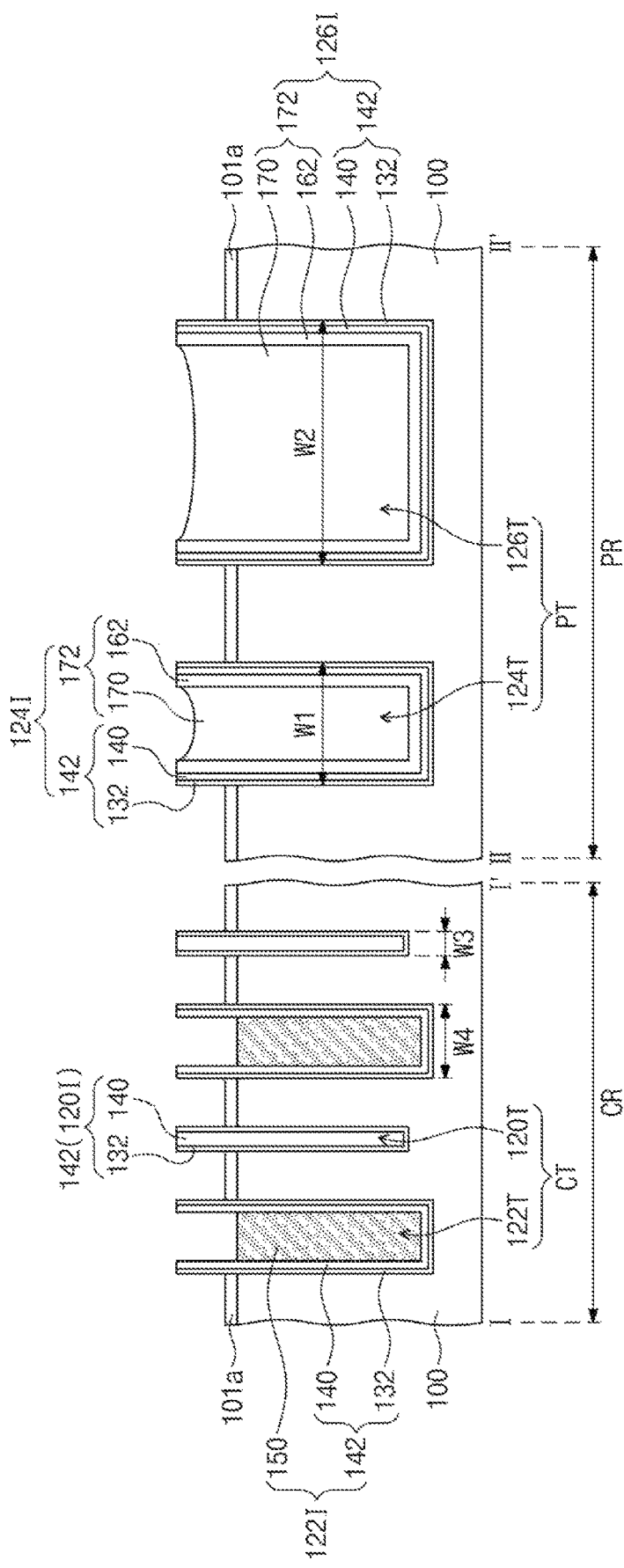

Referring to FIGS. 1 and 11, according to some embodiments, the second mask patterns 103a are removed. For example, the removal of the second mask patterns 103a includes performing a wet etching process using an etching solution that includes phosphoric acid. An upper portion of the remaining portion of the first nitride layer 150 is also removed during the removal of the second mask patterns 103a. Thus, a first cell insulating pattern 120I, a second cell insulating pattern 122I, a first peripheral insulating pattern 124I and a second peripheral insulating pattern 126I are formed in the first cell trench 120T, the second cell trench 122T, the first peripheral trench 124T and the second peripheral trench 126T, respectively. The first cell insulating pattern 120I includes the remaining portion of the first oxide layer 142, and the second cell insulating pattern 122I includes the remaining portions of the first oxide layer 142 and the first nitride layer 150. Each of the first and second peripheral insulating patterns 124I and 126I includes the remaining portions of the first oxide layer 142 and the second oxide layer 172.

According to some embodiments, the second cell insulating pattern 122I includes a material different from a material of each of the first cell insulating pattern 120I, the first peripheral insulating pattern 124I and the second peripheral insulating pattern 126I. The second cell insulating pattern 122I includes a nitride, but none of the first cell insulating pattern 120I, the first peripheral insulating pattern 124I and the second peripheral insulating pattern 126I includes a nitride. The first peripheral insulating pattern 124I and the second peripheral insulating pattern 126I have the first width W1 and the second width W2, respectively, and the first cell insulating pattern 120I and the second cell insulating pattern 122I have the third width W3 and the fourth width W4, respectively.

Figure 12A:
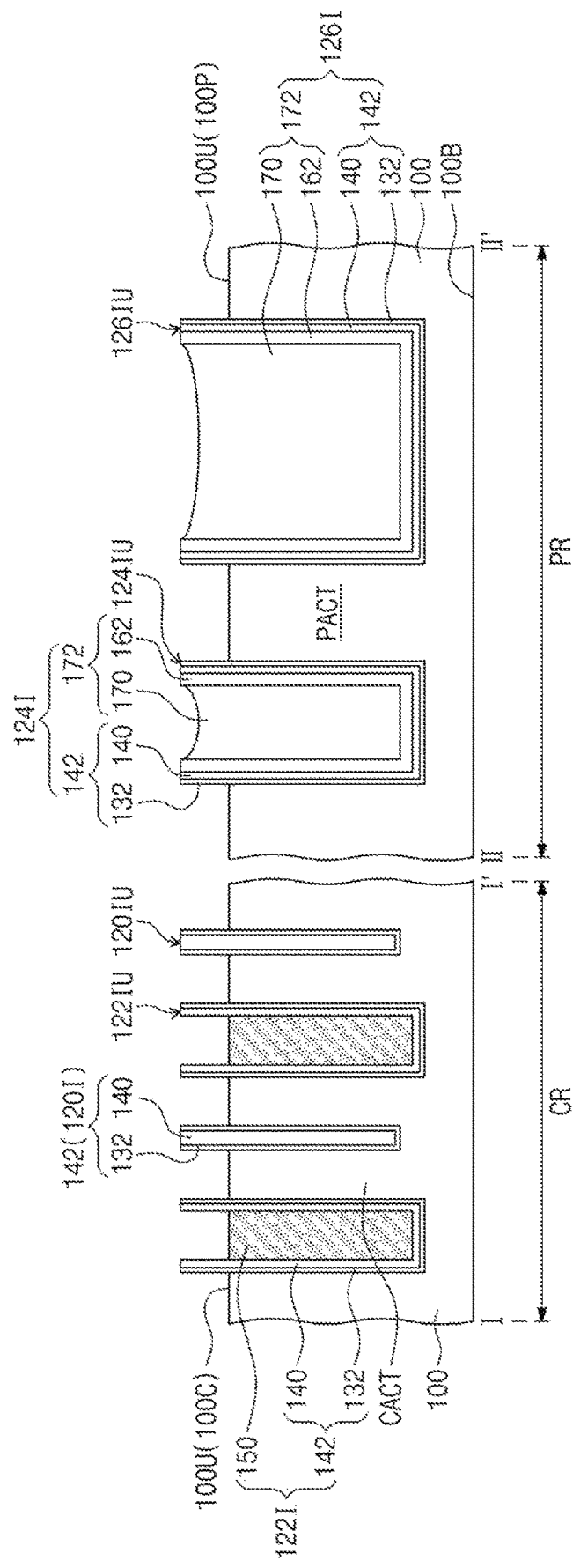

Referring to FIGS. 1 and 12A, according to some embodiments, the first mask patterns 101a are removed. The first mask patterns 101a are removed by, for example, a strip process. During the removal of the first mask patterns 101a, upper portions of the first cell insulating pattern 120I, the first peripheral insulating pattern 124I and the second peripheral insulating pattern 126I are removed and an upper portion of the first oxide layer 142 of the second cell insulating pattern 122I is removed. Since the first mask patterns 101a are removed, the top surface 100U of the substrate 100 is exposed. In other words, atop surface 100C of the cell active region CACT and a top surface 100P of the peripheral active region PACT are exposed.

In some embodiments, the top surface 100C of the cell active region CACT and the top surface 100P of the peripheral active region PACT are positioned at the same height from a bottom surface 100B of the substrate 100. In a present disclosure, a height of a surface is a distance measured from the bottom surface 100B of the substrate 100 in a direction perpendicular to the bottom surface 100I. Each of the first and second cell insulating patterns 120I and 122I protrudes from the top surface 100C of the cell active region CACT. Each of topmost surfaces 120IU and 122IU of the first and second cell insulating patterns 120I and 122I are positioned higher than the top surface 100C of the cell active region CACT. Each of the first and second peripheral insulating patterns 124I and 126I protrudes from the top surface 100P of the peripheral active region PACT. Each of topmost surfaces 124IU and 126IU of the first and second peripheral insulating patterns 124I and 126I are positioned higher than the top surface 100P of the peripheral active region PACT.

FIGS. 12B to 12E are cross-sectional views that correspond to the lines I-I' and II-II' of FIG. 1 that respectively illustrate methods for fabricating a semiconductor device according to some embodiments of the inventive concepts. Hereinafter, differences between embodiments of FIGS. 12B to 12E and embodiments of FIGS. 2 to 11 and 12A will be mainly described for the purpose of ease and convenience in explanation.

Figure 12B:
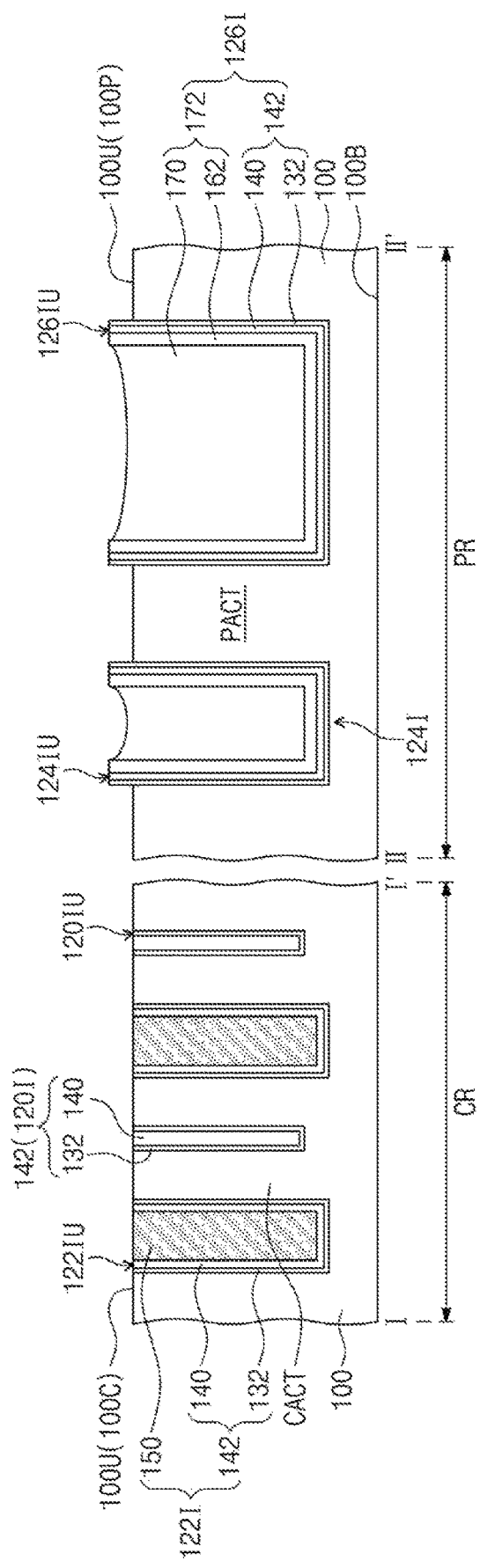
FIGS. 12B to 12E are cross-sectional views that correspond to lines I-I' and II-II' of FIG. 1 that respectively illustrate methods for fabricating a semiconductor device according to some embodiments of the inventive concepts.

Referring to FIGS. 1 and 12B, according to some embodiments, an upper portion of the first cell insulating pattern 120I and an upper portion of the first oxide layer 142 of the second cell insulating pattern 122I are removed while removing the first mask patterns 101a. According to a present embodiment, the removal process is performed such that a topmost surface 120IU of the first cell insulating pattern 120I and a topmost surface 122IU of the second cell insulating pattern 122I become substantially coplanar with the top surface 100C of the cell active region CACT. During the removal process, upper portions of the first and second peripheral insulating patterns 124I and 126I may be removed. Since the widths of the first and second peripheral insulating patterns 124I and 126I are greater than the widths of the first and second cell insulating patterns 120I and 122I, a removal rate during the removal process of each of the first and second peripheral insulating patterns 124I and 126I is less than the removal rates of the first and second cell insulating patterns 120I and 122I. Thus, after the removal process, each of topmost surfaces 124IU and 126IU of the first and second peripheral insulating patterns 124I and 126I are positioned higher than the top surface 100P of the peripheral active region PACT.

According to a present embodiment, the topmost surface 120IU of the first cell insulating pattern 120I and the topmost surface 122IU of the second cell insulating pattern 122I are positioned at substantially the same height as the top surface 100C of the cell active region CACT. Each of the topmost surfaces 124IU and 126IU of the first and second peripheral insulating patterns 124I and 126I are positioned higher than the top surface 100P of the peripheral active region PACT. Thus, each of the topmost surfaces 124IU and 126IU of the first and second peripheral insulating patterns 124I and 126I are positioned higher than the topmost surfaces 120IU and 122IU of the first and second cell insulating patterns 120I and 122I.

Figure 12C:
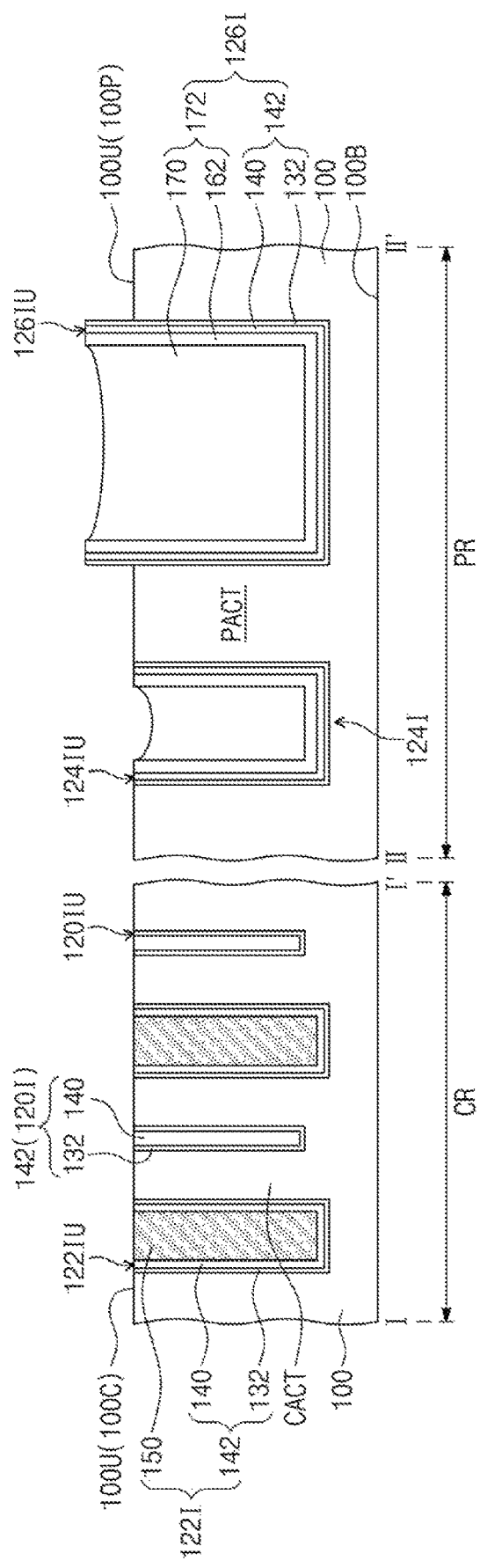

Referring to FIGS. 1 and 12C, according to some embodiments, an upper portion of the first cell insulating pattern 120I, an upper portion of the first oxide layer 142 of the second cell insulating pattern 122I and an upper portion of the first peripheral insulating pattern 124I are removed while removing the first mask patterns 101a. According to a present embodiment, the removal process is performed such that topmost surfaces 120IU and 122IU of the first and second cell insulating patterns 120I and 122I are substantially coplanar with the top surface 100C of the cell active region CACT and such that a topmost surface 124IU of the first peripheral insulating pattern 124I is substantially coplanar with the top surface 100P of the peripheral active region PACT. In this case, the removal process is performed using a mask pattern that selectively covers the second peripheral insulating pattern 126I as an etch mask. The second peripheral insulating pattern 126I is protected by the mask pattern, and thus an upper portion of the second peripheral insulating pattern 126I is not removed during the removal process. As a result, after the removal process, a topmost surface 126IU of the second peripheral insulating pattern 126I is positioned higher than the top surface 100P of the peripheral active region PACT.

According to a present embodiment, the topmost surface 120IU of the first cell insulating pattern 120I and the topmost surface 122IU of the second cell insulating pattern 122I are positioned at substantially the same height as the top surface 100C of the cell active region CACT. The topmost surface 124IU of the first peripheral insulating pattern 124I is positioned at substantially the same height as the top surface 100P of the peripheral active region PACT. The topmost surface 126IU of the second peripheral insulating pattern 126I is positioned higher than the top surface 100P of the peripheral active region PACT. The topmost surface 126IU of the second peripheral insulating pattern 126I is positioned higher than the topmost surface 120IU of the first cell insulating pattern 120I, the topmost surface 122IU of the second cell insulating pattern 122I and the topmost surface 124IU of the first peripheral insulating pattern 124I.

Figure 12D:
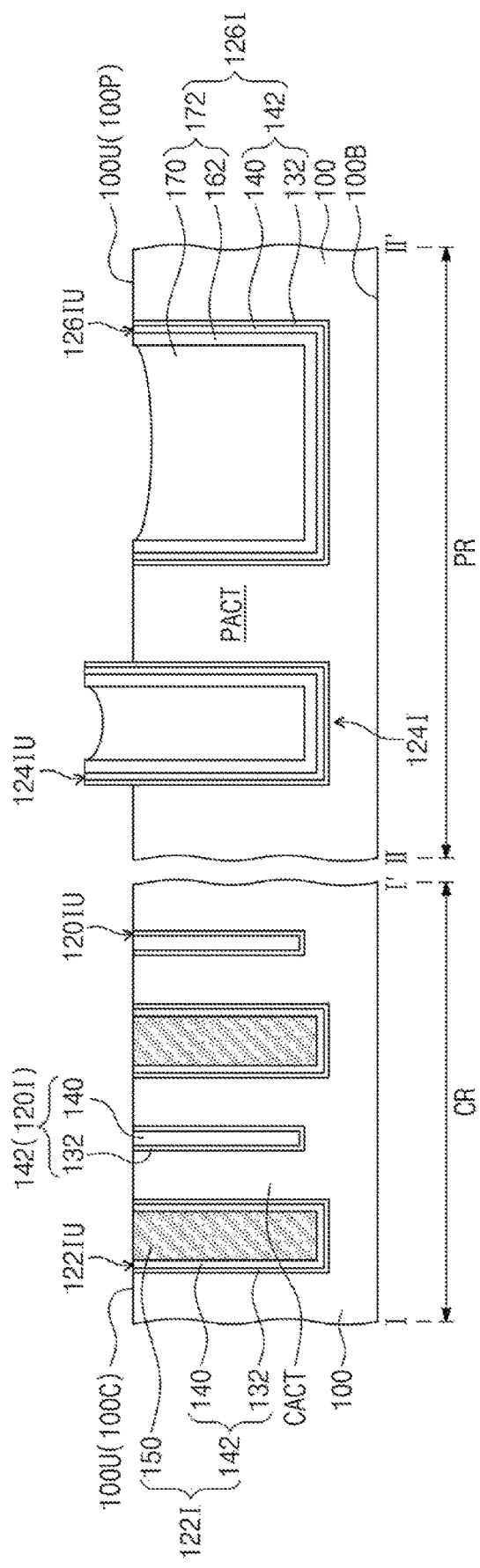

Referring to FIGS. 1 and 12D, according to some embodiments, an upper portion of the first cell insulating pattern 120I, an upper portion of the first oxide layer 142 of the second cell insulating pattern 122I and an upper portion of the second peripheral insulating pattern 126I are removed while removing the first mask patterns 101a. According to a present embodiment, the removal process is performed such that topmost surfaces 120IU and 122IU of the first and second cell insulating patterns 120I and 122I are substantially coplanar with the top surface 100C of the cell active region CACT, and such that a topmost surface 126IU of the second peripheral insulating pattern 126I is substantially coplanar with the top surface 100P of the peripheral active region PACT. In this case, the removal process is performed using a mask pattern that selectively covers the first peripheral insulating pattern 124I as an etch mask. The first peripheral insulating pattern 124I is protected by the mask pattern, and thus an upper portion of the first peripheral insulating pattern 124I is not removed during the removal process. As a result, after the removal process, a topmost surface 124IU of the first peripheral insulating pattern 124I is positioned higher than the top surface 100P of the peripheral active region PACT.

According to a present embodiment, the topmost surface 120IU of the first cell insulating pattern 120I and the topmost surface 122IU of the second cell insulating pattern 122I are positioned at substantially the same height as the top surface 100C of the cell active region CACT. The topmost surface 126IU of the second peripheral insulating pattern 126I is positioned at substantially the same height as the top surface 100P of the peripheral active region PACT. The topmost surface 124IU of the first peripheral insulating pattern 124I is positioned higher than the top surface 100P of the peripheral active region PACT. The topmost surface 124IU of the first peripheral insulating pattern 124I is positioned higher than the topmost surface 120IU of the first cell insulating pattern 120I, the topmost surface 122IU of the second cell insulating pattern 122I and the topmost surface 126IU of the second peripheral insulating pattern 126I.

Figure 12E:
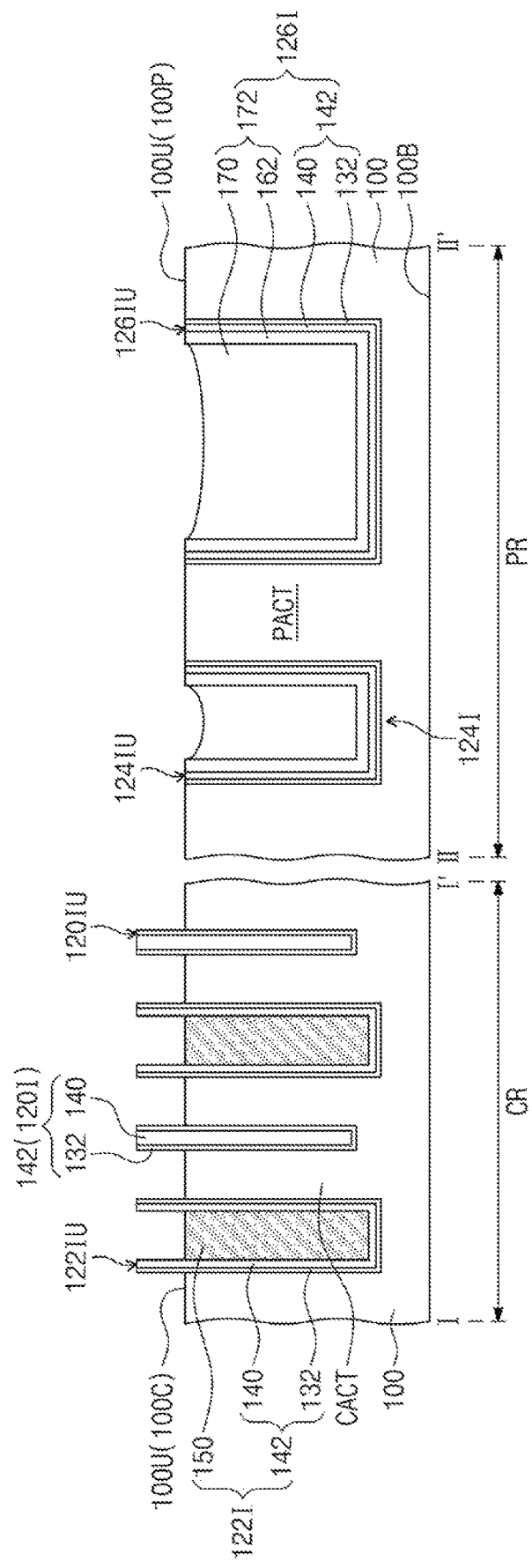

Referring to FIGS. 1 and 12E, according to some embodiments, an upper portion of the first peripheral insulating pattern 124I and an upper portion of the second peripheral insulating pattern 126I are removed while removing the first mask patterns 101a. According to a present embodiment, the removal process is performed such that a topmost surface 124IU of the first peripheral insulating pattern 124I and a topmost surface 126IU of the second peripheral insulating pattern 126I are substantially coplanar with the top surface 100P of the peripheral active region PACT. In this case, the removal process is performed using a mask pattern that selectively covers the first and second cell insulating patterns 120I and 122I as an etch mask. The first and second cell insulating patterns 120I and 122I are protected by the mask pattern, and thus upper portions of the first and second cell insulating patterns 120I and 122I are not removed during the removal process. As a result, after the removal process, each of topmost surfaces 120IU and 122IU of the first and second cell insulating patterns 120I and 122I are positioned higher than the top surface 100C of the cell active region CACT.

According to a present embodiment, the topmost surface 120IU of the first cell insulating pattern 120I and the topmost surface 122IU of the second cell insulating pattern 122I are positioned higher than the top surface 100C of the cell active region CACT. The topmost surface 124IU of the first peripheral insulating pattern 124I and the topmost surface 126IU of the second peripheral insulating pattern 126I are positioned at substantially the same height as the top surface 100P of the peripheral active region PACT. In other words, each of the topmost surfaces 124IU and 126IU of the first and second peripheral insulating patterns 124I and 126I are positioned lower than the topmost surfaces 120IU and 122IU of the first and second cell insulating patterns 120I and 122I.

Figure 13:
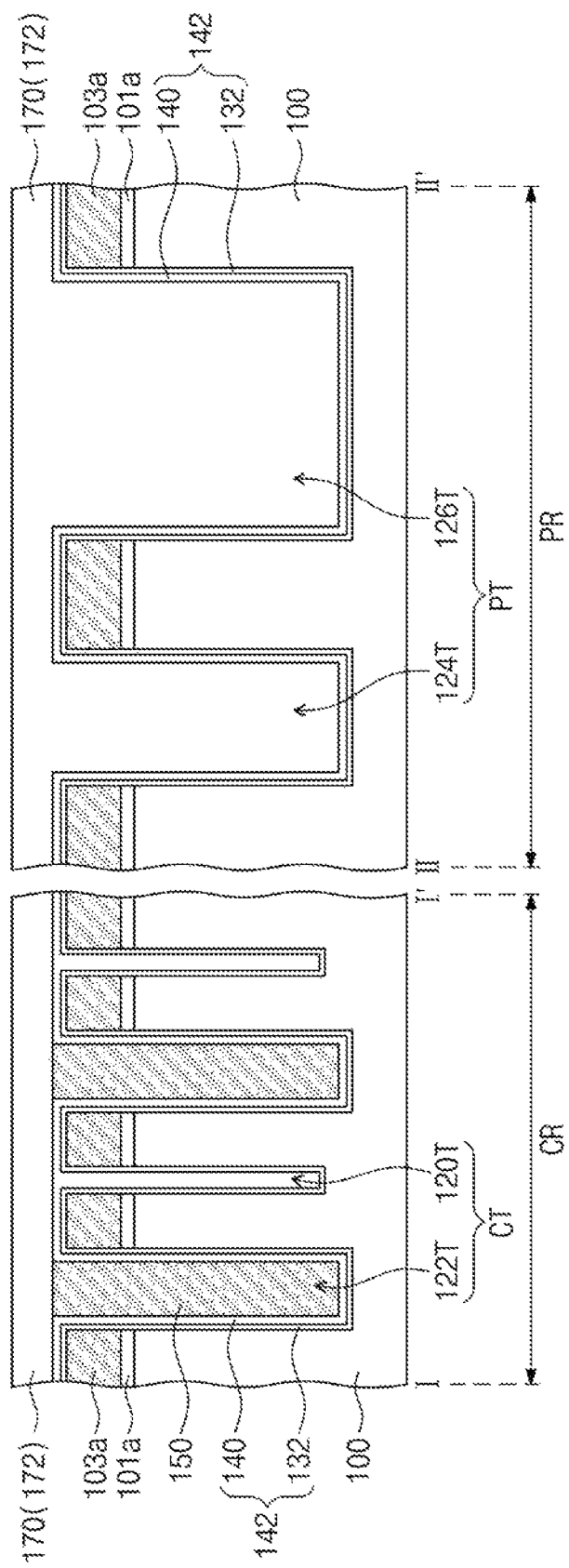
FIGS. 13 to 15 are cross-sectional views that correspond to lines I-I' and II-II' of FIG. 1 that illustrate a method for fabricating a semiconductor device according to some embodiments of the inventive concepts.
Figure 14:
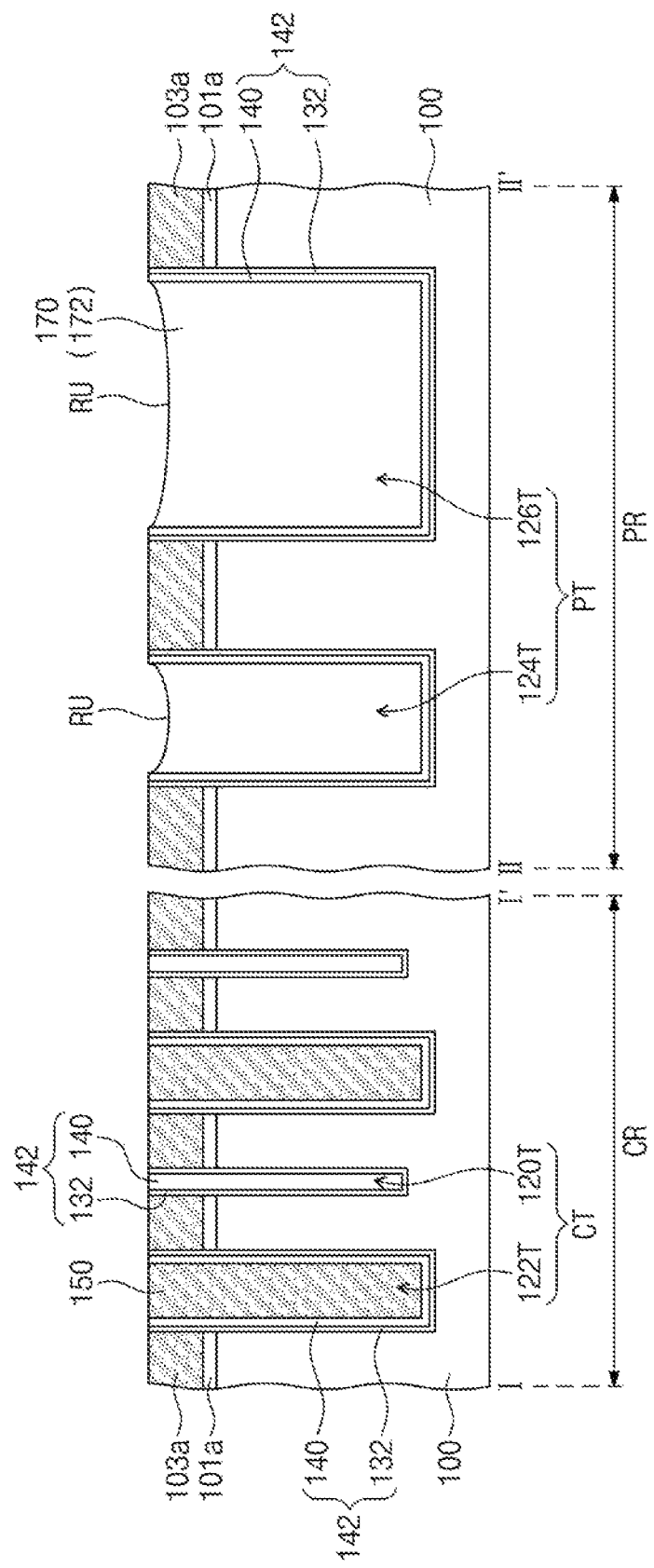
Figure 15:
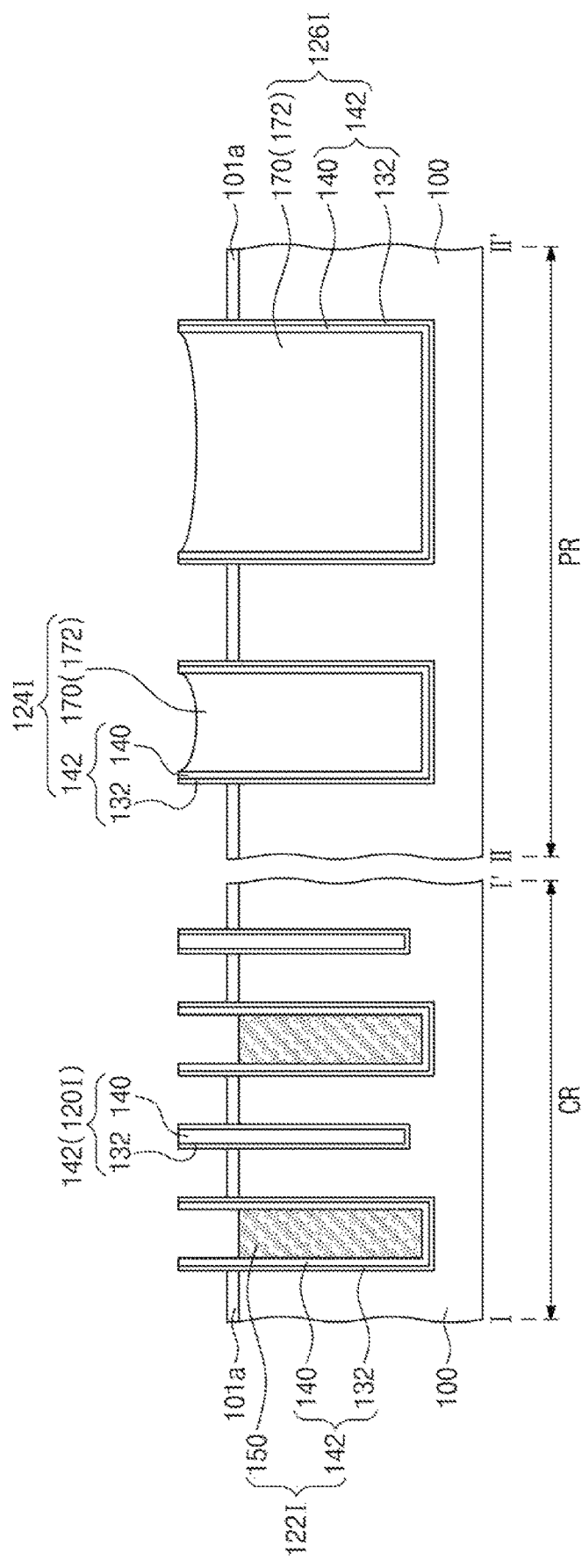

FIGS. 13 to 15 are cross-sectional views that correspond to lines I-I' and II-II' of FIG. 1 that illustrate a method for fabricating a semiconductor device according to some embodiments of the inventive concepts. Hereinafter, differences between embodiments of FIGS. 13-15 and embodiments of FIGS. 2 to 11 and 12A will be mainly described for the purpose of ease and convenience in explanation.

Referring to FIGS. 1 and 13, according to a present embodiment, the formation of the second semiconductor layer 160 and the third sub-oxide layer 162 is omitted. In this case, a process that forms the fourth sub-oxide layer 170 can be performed at a lower temperature. The fourth sub-oxide layer 170 covers the exposed portion of the first oxide layer 142 on the cell region CR and the remaining portion of the first nitride layer 150. The fourth sub-oxide layer 170 completely fills a remaining region of each of the first and second peripheral trenches 124T and 126T. The fourth sub-oxide layer 170 forms the second oxide layer 172. The first oxide layer 142 and the second oxide layer 172, i.e., the fourth sub-oxide layer 170, completely fill each of the first and second peripheral trenches 124T and 126T.

Referring to FIGS. 1 and 14, according to a present embodiment, a planarization process is performed on the substrate 100 to remove a portion of the second oxide layer 172 and a portion of the first oxide layer 142. The planarization process is performed until the second mask pattern 103a is exposed. The remaining portion of the first nitride layer 150 is exposed by the planarization process. After the planarization process, a portion of the second oxide layer 172, i.e., the fourth sub-oxide layer 170, remains in each of the first and second peripheral trenches 124T and 126T. Each of the first and second peripheral trenches 124T and 126T is completely filled with the remaining portion of the first oxide layer 142 and the remaining portion of the second oxide layer 172, i.e., the fourth sub-oxide layer 170. The remaining portion of the second oxide layer 172 includes a top surface RU that is recessed downward. Thereafter, a plasma treatment process is performed on the substrate 100.

Referring to FIGS. 1 and 15, according to a present embodiment, the second mask patterns 103a are removed. An upper portion of the remaining portion of the first nitride layer 150 is also removed during the removal of the second mask patterns 103a. Thus, the first cell insulating pattern 120I, the second cell insulating pattern 122I, the first peripheral insulating pattern 124I and the second peripheral insulating pattern 126I are formed in the first cell trench 120T, the second cell trench 122T, the first peripheral trench 124T and the second peripheral trench 126T, respectively. According to a present embodiment, each of the first and second peripheral insulating patterns 124I and 126I includes the remaining portion of the first oxide layer 142 and the remaining portion of the second oxide layer 172, i.e., the fourth sub-oxide layer 170.

According to a present embodiment, a subsequent process is substantially the same as one of the processes described with reference to FIGS. 12A to 12E.

FIGS. 16 to 20 are cross-sectional views that corresponding to lines I-I' and II-II' of FIG. 1 that illustrate a method for fabricating a semiconductor device according to some embodiments of the inventive concepts. Hereinafter, differences between embodiments of FIGS. 16-20 and embodiments of FIGS. 2 to 11 and 12A will be mainly described for the purpose of ease and convenience in explanation.

Figure 16:
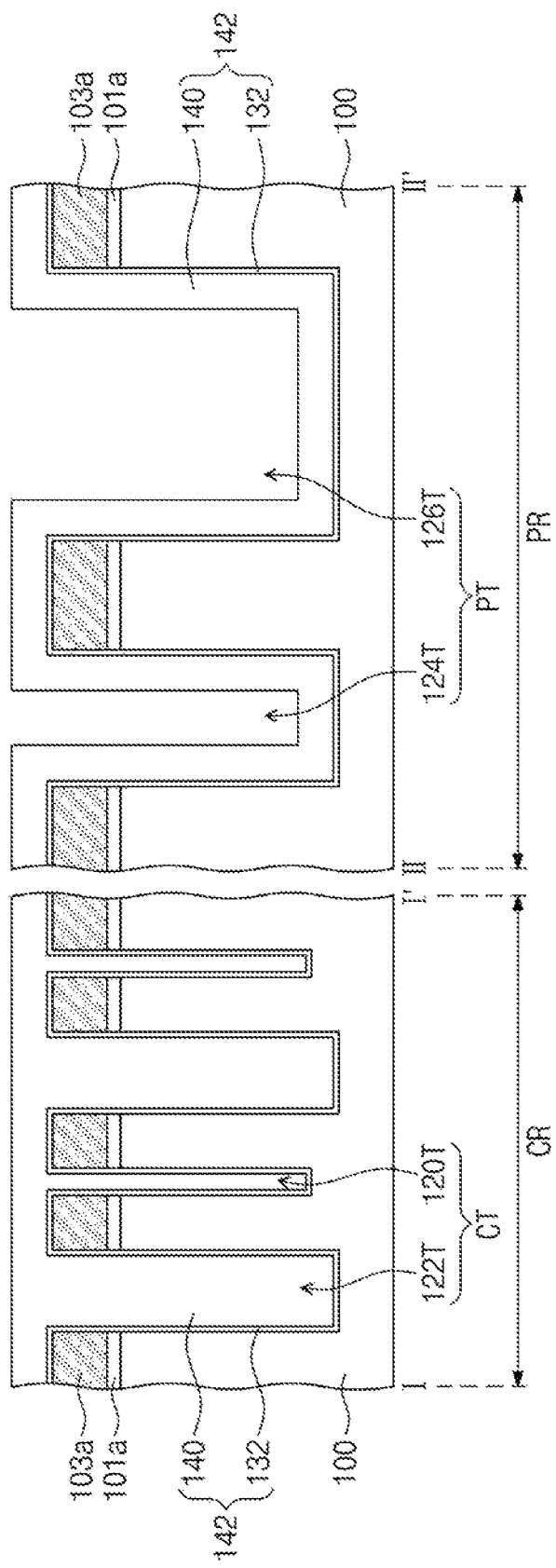
FIGS. 16 to 20 are cross-sectional views that correspond to lines I-I' and II-II' of FIG. 1 that illustrate a method for fabricating a semiconductor device according to some embodiments of the inventive concepts.

Referring to FIGS. 1 and 16, according to a present embodiment, the second sub-oxide layer 140 is formed on the first sub-oxide layer 132. According to the present embodiment, the second sub-oxide layer 140 completely fills a remaining region of the first cell trench 120T and a remaining region of the second cell trench 122T. The second sub-oxide layer 140 partially fills each of the first and second peripheral trenches 124T and 126T. The second sub-oxide layer 140 conformally covers the inner surface of each of the first and second peripheral trenches 124T and 126T.

According to a present embodiment, the first sub-oxide layer 132 and the second sub-oxide layer 140 form the first oxide layer 142. The first oxide layer 142 completely fills the first and second cell trenches 120T and 122T and conformally covers the inner surfaces of the first and second peripheral trenches 124T and 126T.

Figure 17:
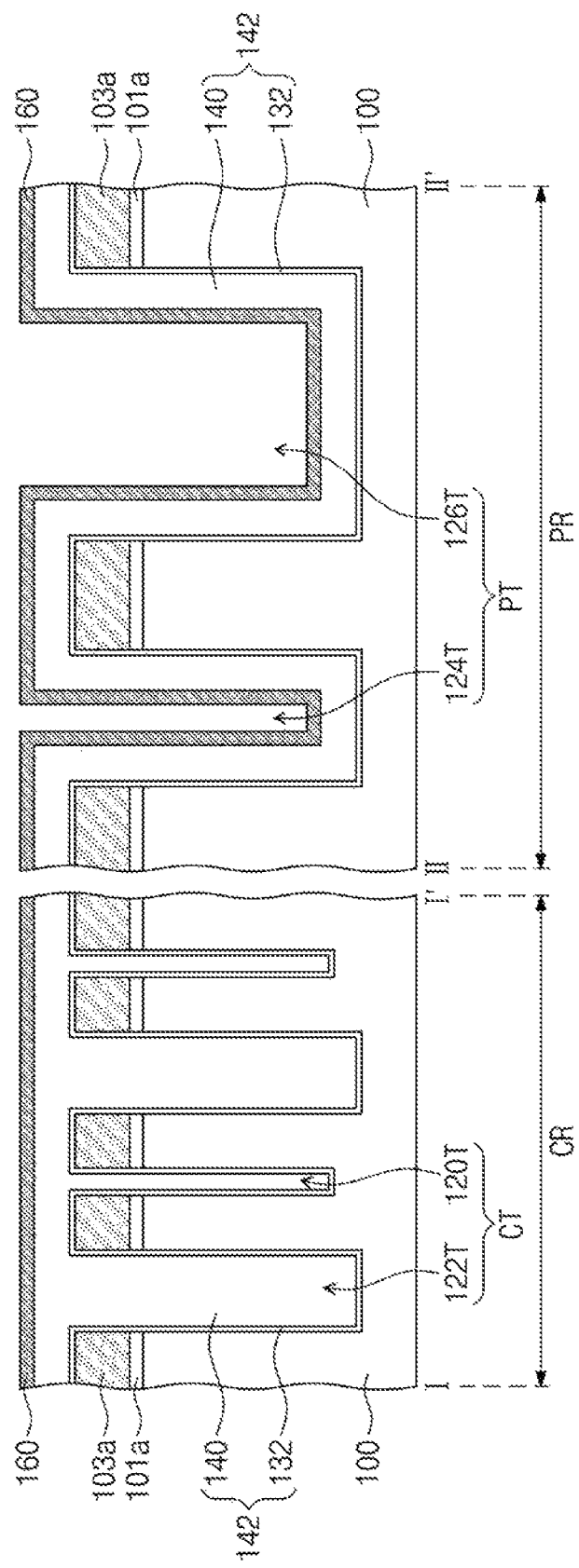

Referring to FIGS. 1 and 17, according to a present embodiment, the formation of the first nitride layer 150 and the removal of a portion of the first nitride layer 150 are omitted. The second semiconductor layer 160 is formed on the first oxide layer 142. The second semiconductor layer 160 is formed on the first oxide layer 142 in the cell region CR and the peripheral circuit region PR and partially fills each of the first and second peripheral trenches 124T and 126T. The second semiconductor layer 160 conformally covers the inner surface of each of the first and second peripheral trenches 124T and 126T.

Figure 18:
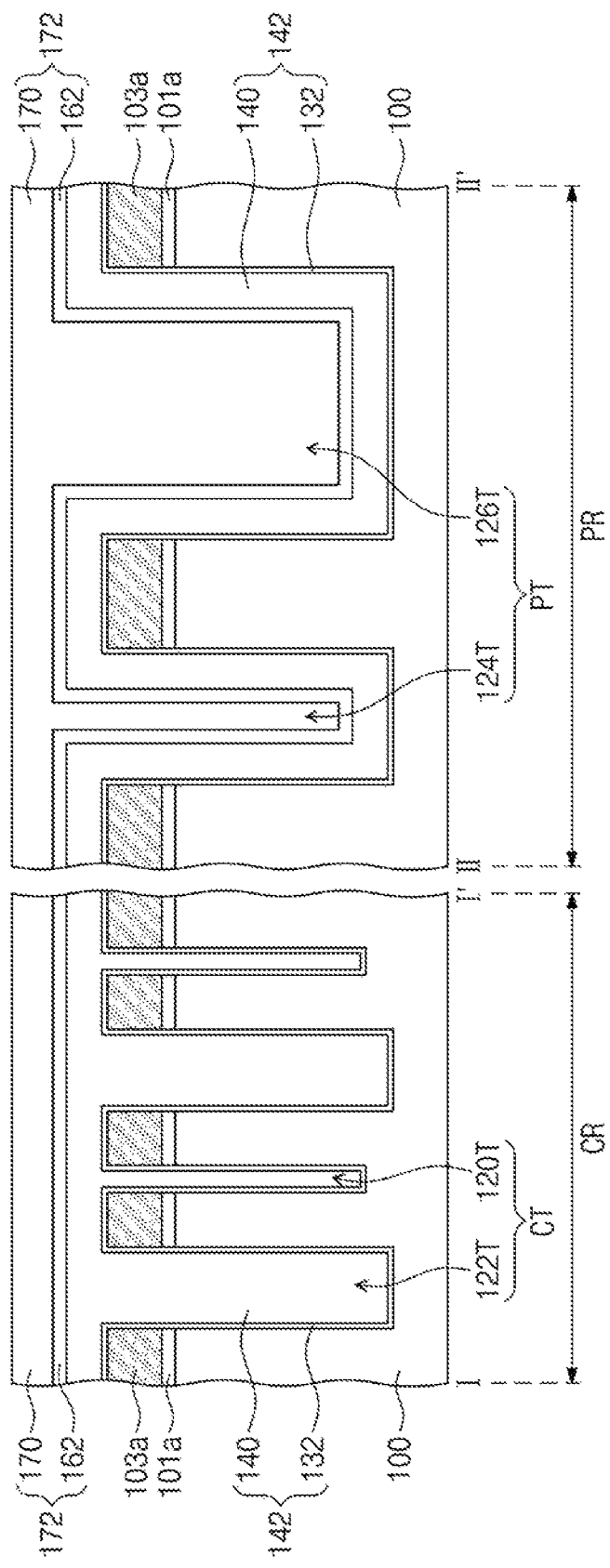

Referring to FIGS. 1 and 18, according to a present embodiment, the second semiconductor layer 160 is oxidized to form the third sub-oxide layer 162. The fourth sub-oxide layer 170 is formed on the third sub-oxide layer 162 that covers the cell region CR and the peripheral circuit region PR of the substrate 100. The fourth sub-oxide layer 170 fills a remaining region of each of the first and second peripheral trenches 124T and 126T. The third sub-oxide layer 162 is disposed on the cell region CR and the peripheral circuit region PR between the fourth sub-oxide layer 170 and the first oxide layer 142. The third sub-oxide layer 162 is disposed between the fourth sub-oxide layer 170 and the inner surface of each of the first and second peripheral trenches 124T and 126T.

According to a present embodiment, the third sub-oxide layer 162 and the fourth sub-oxide layer 170 form the second oxide layer 172. The first oxide layer 142 and the second oxide layer 172 completely fill each of the first and second peripheral trenches 124T and 126T.

Figure 19:
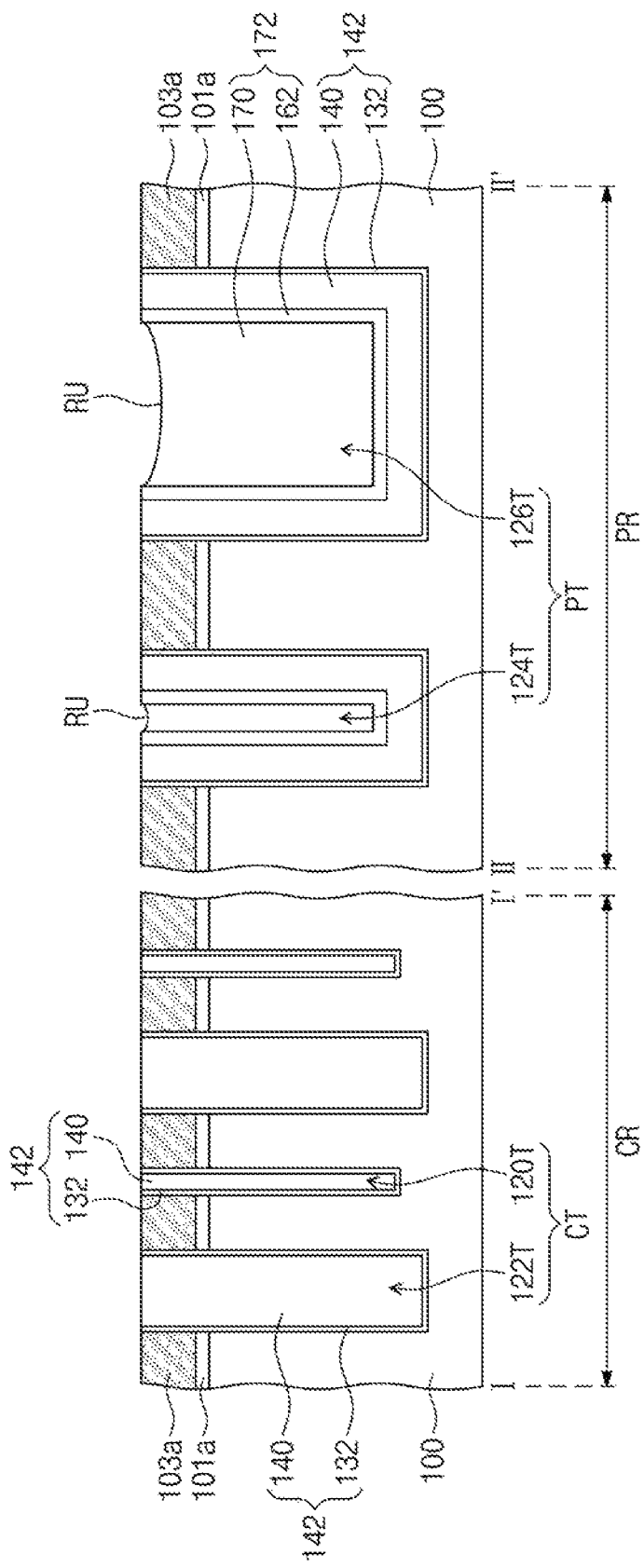

Referring to FIGS. 1 and 19, according to a present embodiment, the planarization process is performed on the substrate 100 that removes a portion of the second oxide layer 172 and a portion of the first oxide layer 142. The planarization process is performed until the second mask pattern 103a is exposed.

After the planarization process, according to a present embodiment, a portion of the first oxide layer 142 remains in each of the first cell trench 120T, the second cell trench 122T, the first peripheral trench 124T and the second peripheral trench 126T. According to a present embodiment, each of the first and second cell trenches 120T and 122T are completely filled with the remaining portion of the first oxide layer 142. After the planarization process, a portion of the second oxide layer 172 remains in each of the first and second peripheral trenches 124T and 126T. Each of the first and second peripheral trenches 124T and 126T are completely filled with the remaining portion of the first oxide layer 142 and the remaining portion of the second oxide layer 172. The remaining portion of the second oxide layer 172 includes a top surface RU that is recessed downward. Thereafter, a plasma treatment process may be performed on the substrate 100.

Figure 20:
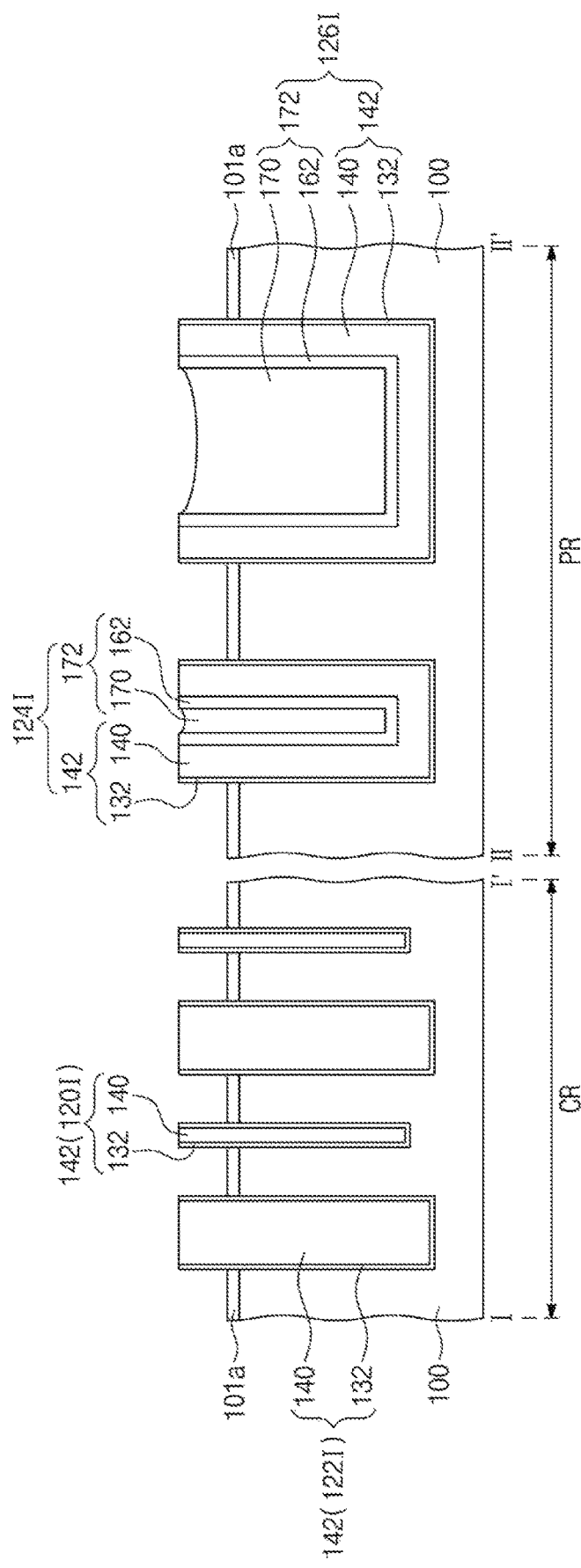

Referring to FIGS. 1 and 20, according to a present embodiment, the second mask patterns 103a are removed. As a result, the first cell insulating pattern 120I, the second cell insulating pattern 122I, the first peripheral insulating pattern 124I and the second peripheral insulating pattern 126I are formed in the first cell trench 120T, the second cell trench 122T, the first peripheral trench 124T and the second peripheral trench 126T, respectively. According to a present embodiment, each of the first and second cell insulating patterns 120I and 122I includes the remaining portion of the first oxide layer 142. Each of the first and second peripheral insulating patterns 124I and 126I includes the remaining portions of the first oxide layer 142 and the second oxide layer 172. According to a present embodiment, none of the first and second cell insulating patterns 120I and 122I and the first and second peripheral insulating patterns 124I and 126I include a nitride.

According to a present embodiment, a subsequent process is substantially the same as one of the processes described with reference to FIGS. 12A to 12E.

Figure 21:
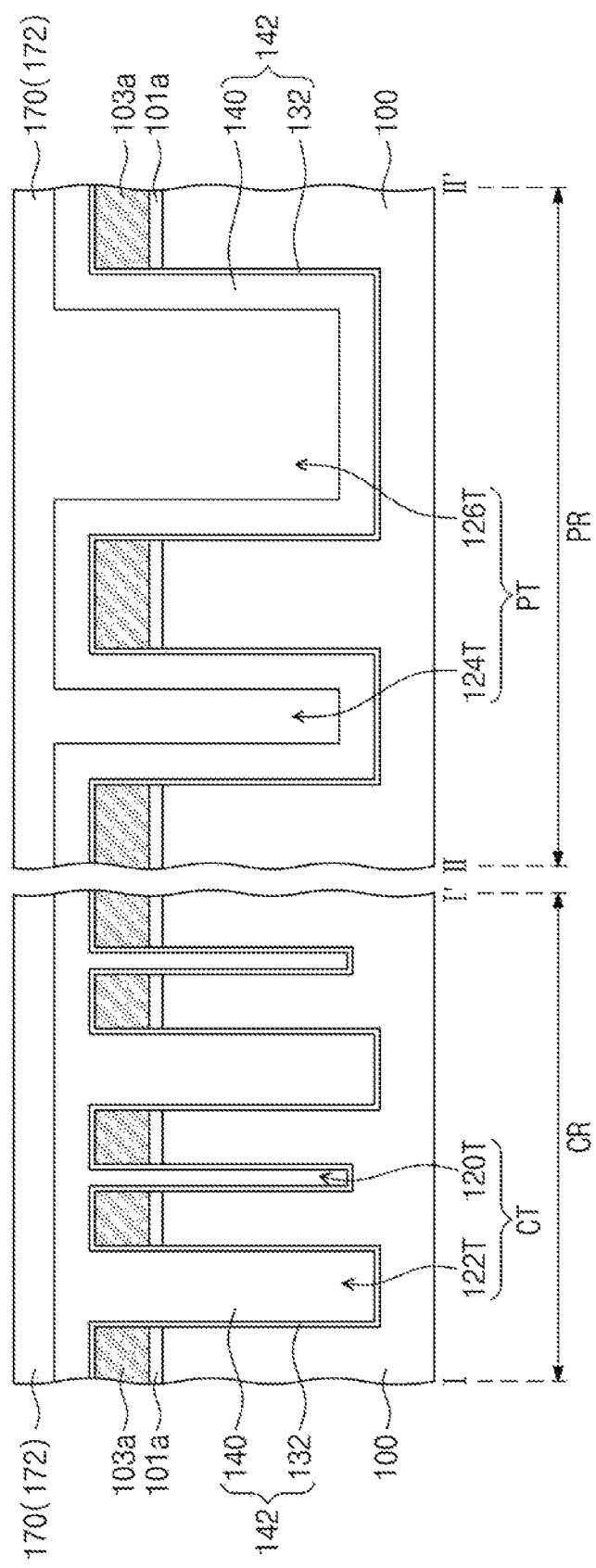
FIGS. 21 and 22 are cross-sectional views that correspond to lines I-I' and II-II' of FIG. 1 that illustrate a method for fabricating a semiconductor device according to some embodiments of the inventive concepts.
Figure 22:
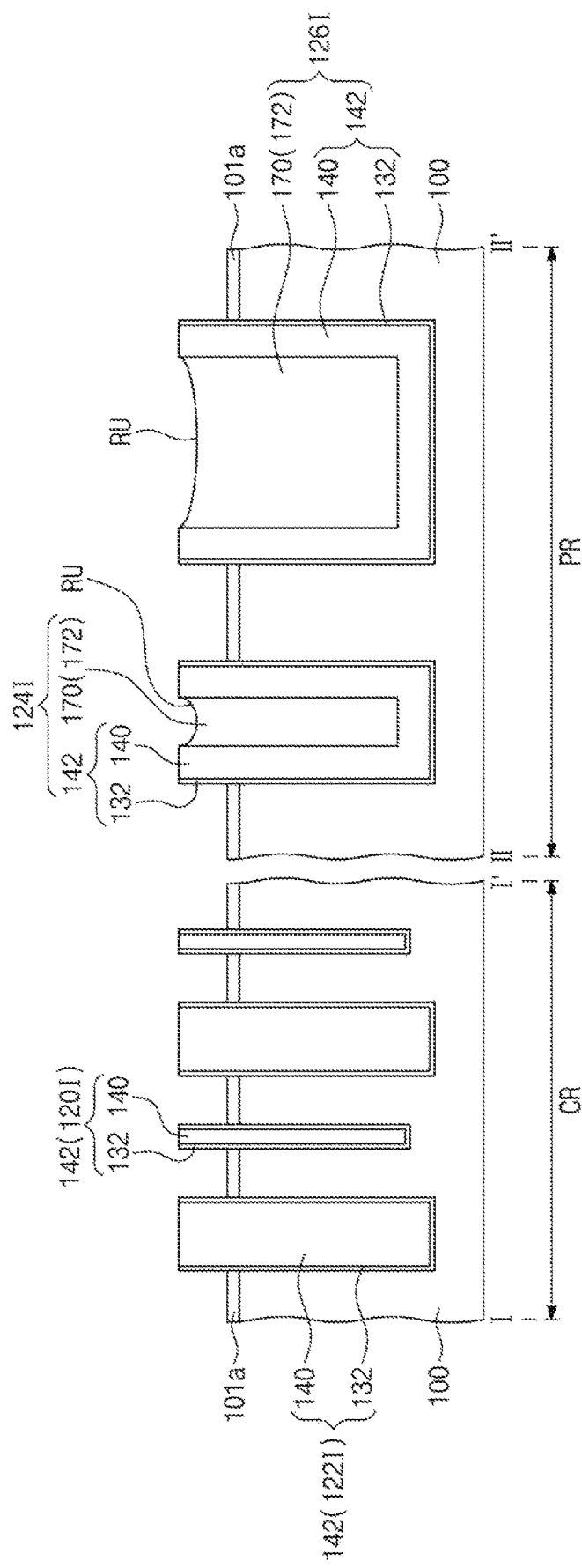

FIGS. 21 and 22 are cross-sectional views that correspond to lines I-I' and II-II' of FIG. 1 that illustrate a method for fabricating a semiconductor device according to some embodiments of the inventive concepts. Hereinafter, differences between embodiments of FIGS. 21-22 and embodiments of FIGS. 2 to 11 and 12A will be mainly described for the purpose of ease and convenience in explanation.

Referring to FIGS. 1 and 21, according to a present embodiment, the second sub-oxide layer 140 is formed on the first sub-oxide layer 132, as described with reference to FIG. 16. According to a present embodiment, the second sub-oxide layer 140 completely fills the remaining regions of the first cell trench 120T and the second cell trench 122T. The second sub-oxide layer 140 partially fills each of the first and second peripheral trenches 124T and 126T. The first sub-oxide layer 132 and the second sub-oxide layer 140 form the first oxide layer 142. The first oxide layer 142 completely fills the first and second cell trenches 120T and 122T and conformally covers the inner surfaces of the first and second peripheral trenches 124T and 126T.

According to a present embodiment, the formation of the first nitride layer 150 and the removal of a portion of the first nitride layer 150 is omitted. In addition, according to a present embodiment, the formation of the second semiconductor layer 160 and the third sub-oxide layer 162 is omitted. In this case, a process that forms the fourth sub-oxide layer 170 can be performed at a lower temperature. The fourth sub-oxide layer 170 is formed on the cell region CR and the peripheral circuit region PR on the first oxide layer 142 and fills the remaining regions of each of the first and second peripheral trenches 124T and 126T. The fourth sub-oxide layer 170 forms the second oxide layer 172. The first oxide layer 142 and the second oxide layer 172, i.e., the fourth sub-oxide layer 170, completely fill each of the first and second peripheral trenches 124T and 126T.

Referring to FIGS. 1 and 22, according to a present embodiment, a planarization process is performed on the substrate 100 to remove portions of the second oxide layer 172 and the first oxide layer 142. The planarization process is performed until the second mask pattern 103a is exposed.

After the planarization process, according to a present embodiment, a portion of the first oxide layer 142 remains in each of the first cell trench 120T, the second cell trench 122T, the first peripheral trench 124T and the second peripheral trench 126T. According to a present embodiment, each of the first and second cell trenches 120T and 122T is completely filled with the remaining portion of the first oxide layer 142. After the planarization process, a portion of the second oxide layer 172, i.e., the fourth sub-oxide layer 170, remains in each of the first and second peripheral trenches 124T and 126T. Each of the first and second peripheral trenches 124T and 126T is completely filled with the remaining portions of the first oxide layer 142 and the second oxide layer 172, i.e., the fourth sub-oxide layer 170. The remaining portion of the second oxide layer 172 includes a downward recessed top surface RU. Thereafter, a plasma treatment process is performed on the substrate 100, and the second mask patterns 103a is removed.

As a result, according to a present embodiment, the first cell insulating pattern 120I, the second cell insulating pattern 122I, the first peripheral insulating pattern 124I and the second peripheral insulating pattern 126I are formed in the first cell trench 120T, the second cell trench 122T, the first peripheral trench 124T and the second peripheral trench 126T, respectively. According to a present embodiment, each of the first and second cell insulating patterns 120I and 122I includes the remaining portion of the first oxide layer 142. Each of the first and second peripheral insulating patterns 124I and 126I includes the remaining portions of the first oxide layer 142 and the second oxide layer 172, i.e., the fourth sub-oxide layer 170. The first and second cell insulating patterns 120I and 122I and the first and second peripheral insulating patterns 124I and 126I do not include a nitride.

According to a present embodiment, a subsequent process is substantially the same as one of the processes described with reference to FIGS. 12A to 12E.

FIGS. 23 to 26 are cross-sectional views that correspond to lines I-I' and I-I' of FIG. 1 that respectively illustrate methods for fabricating a semiconductor device according to some embodiments of the inventive concepts. Hereinafter, differences between embodiments of FIGS. 23 to 26 and embodiments of FIGS. 2 to 11 and 12A will be mainly described for the purpose of ease and convenience in explanation.

Figure 23:
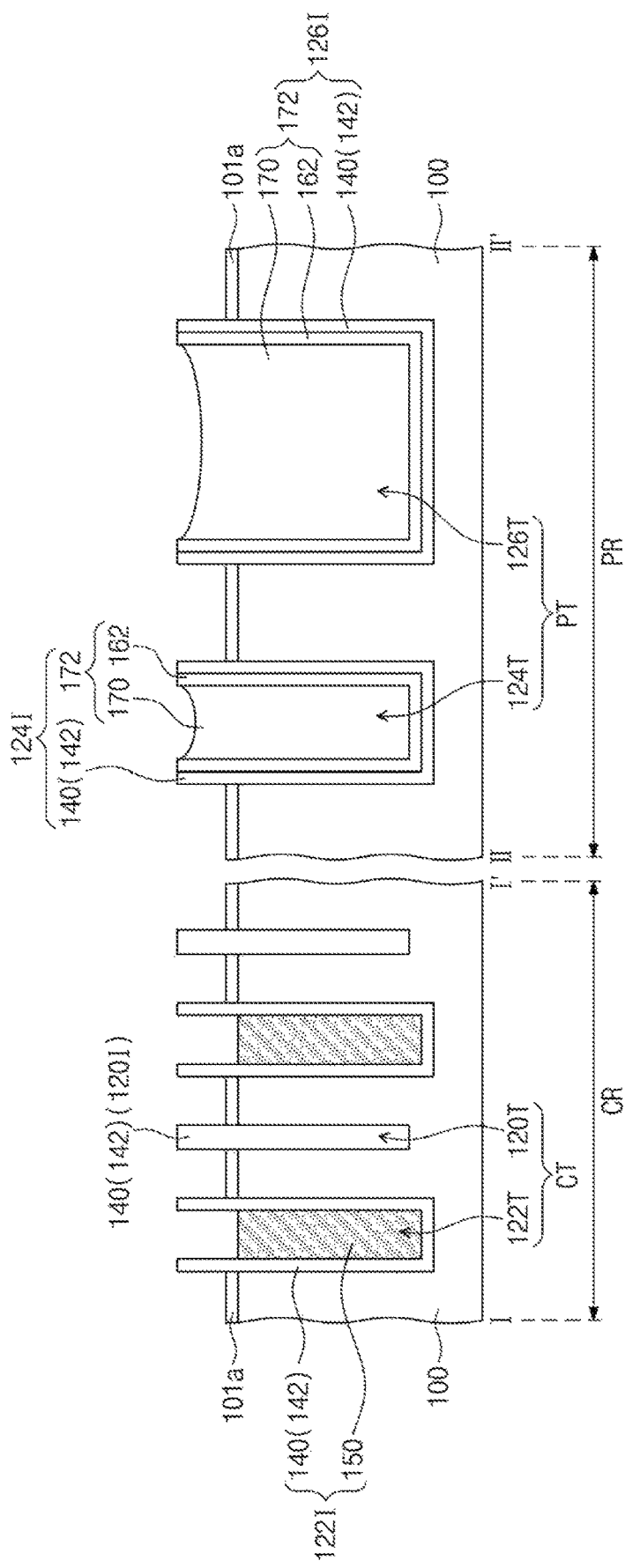
FIGS. 23 to 26 are cross-sectional views that correspond to lines I-I' and I-II' of FIG. 1 that respectively illustrate methods for fabricating a semiconductor device according to some embodiments of the inventive concepts.

Referring to FIGS. 1 and 23, according to a present embodiment, the formation of the first semiconductor layer 130 and the first sub-oxide layer 132 are omitted. In this case, the second sub-oxide layer 140 completely fills the first cell trench 120T, and other features of the second sub-oxide layer 140 are substantially the same as those described with reference to FIG. 5. According to a present embodiment, the second sub-oxide layer 140 forms the first oxide layer 142. The first oxide layer 142 completely fills the first cell trench 120T and conformally covers the inner surface of each of the second cell trench 122T, the first peripheral trench 124T and the second peripheral trench 126T. Thereafter, substantially the same processes as those described with reference to FIGS. 6 to 10 are performed.

According to a present embodiment, after a planarization process described with reference to FIG. 10 is performed, the second mask patterns 103a are removed. An upper portion of the remaining portion of the first nitride layer 150 is also removed while removing the second mask patterns 103a. Thus, the first cell insulating pattern 120I, the second cell insulating pattern 122I, the first peripheral insulating pattern 124I and the second peripheral insulating pattern 126I are formed in the first cell trench 120T, the second cell trench 122T, the first peripheral trench 124T and the second peripheral trench 126T, respectively. The first cell insulating pattern 120I includes the remaining portion of the first oxide layer 142, i.e., the second sub-oxide layer 140, and the second cell insulating pattern 122I includes the remaining portions of the first oxide layer 142 and the first nitride layer 150. Each of the first and second peripheral insulating patterns 124I and 126I includes the remaining portions of the first oxide layer 142 and the second oxide layer 172.

According to a present embodiment, a subsequent process is substantially the same as one of the processes described with reference to FIGS. 12A to 12E.

Figure 24:
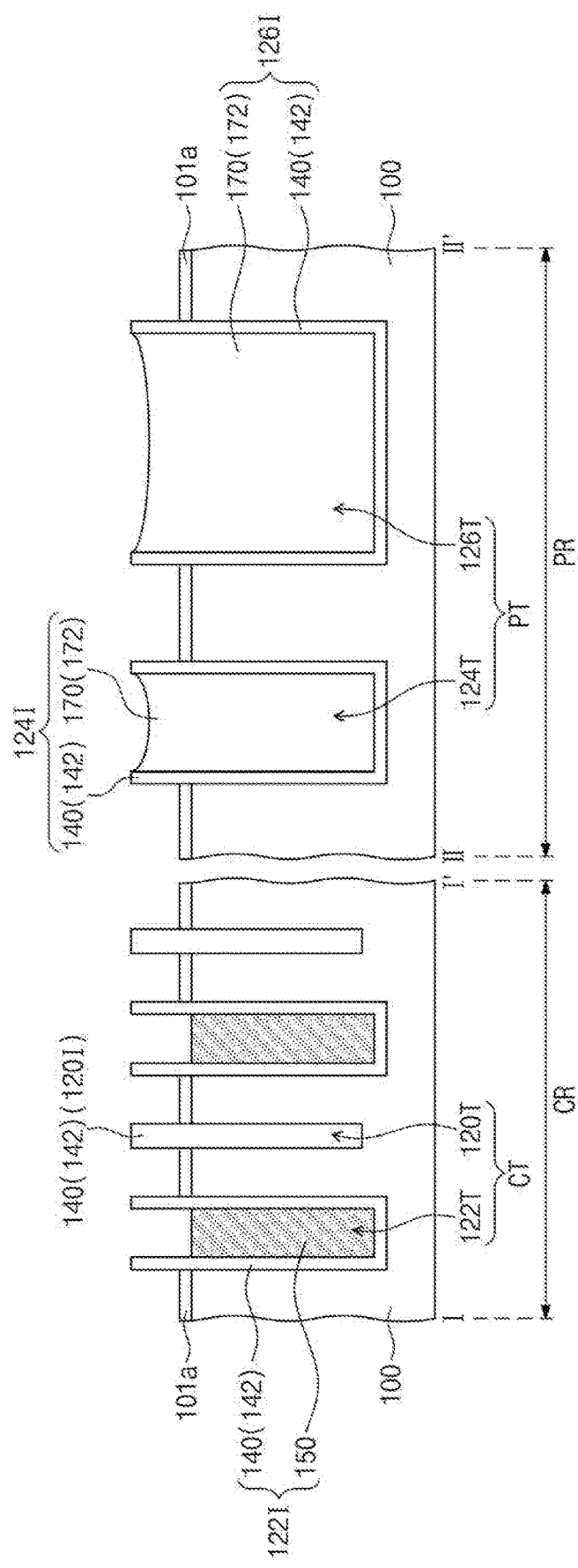

Referring to FIGS. 1 and 24, according to a present embodiment, the formation of the first semiconductor layer 130 and the first sub-oxide layer 132 is omitted. In this case, the second sub-oxide layer 140 completely fills the first cell trench 120T, and other features of the second sub-oxide layer 140 are substantially the same as those described with reference to FIG. 5. According to a present embodiment, the second sub-oxide layer 140 forms the first oxide layer 142. The first oxide layer 142, i.e., the second sub-oxide layer 140, completely fills the first cell trench 120T and conformally covers the inner surface of each of the second cell trench 122T, the first peripheral trench 124T and the second peripheral trench 126T. Thereafter, substantially the same processes as those described with reference to FIGS. 6 and 7 are performed.

According to a present embodiment, the formation of the second semiconductor layer 160 and the third sub-oxide layer 162 is omitted. In this case, the fourth sub-oxide layer 170 can be formed at a lower temperature, and other features of the fourth sub-oxide layer 170 are substantially the same as those described with reference to FIG. 9. The fourth sub-oxide layer 170 forms the second oxide layer 172. The first oxide layer 142, i.e., the second sub-oxide layer 140, and the second oxide layer 172, i.e., the fourth sub-oxide layer 170, completely fill each of the first and second peripheral trenches 124T and 126T. Subsequently, the same process as that described with reference to FIGS. 1 and 10 may be performed.

According to a present embodiment, after a planarization process described with reference to FIG. 10 is performed, the second mask patterns 103a are removed. An upper portion of the remaining portion of the first nitride layer 150 is also removed while removing the second mask patterns 103a. Thus, the first cell insulating pattern 120I, the second cell insulating pattern 122I, the first peripheral insulating pattern 124I and the second peripheral insulating pattern 126I are formed in the first cell trench 120T, the second cell trench 122T, the first peripheral trench 124T and the second peripheral trench 126T, respectively. The first cell insulating pattern 120I includes the remaining portion of the first oxide layer 142, i.e., the second sub-oxide layer 140, and the second cell insulating pattern 122I includes the remaining portion of the first oxide layer 142 and the remaining portion of the first nitride layer 150. Each of the first and second peripheral insulating patterns 124I and 126I include the remaining portions of the first oxide layer 142 and the second oxide layer 172, i.e., the fourth sub-oxide layer 170.

According to a present embodiment, a subsequent process is substantially the same as one of the processes described with reference to FIGS. 12A to 12E.

Figure 25:
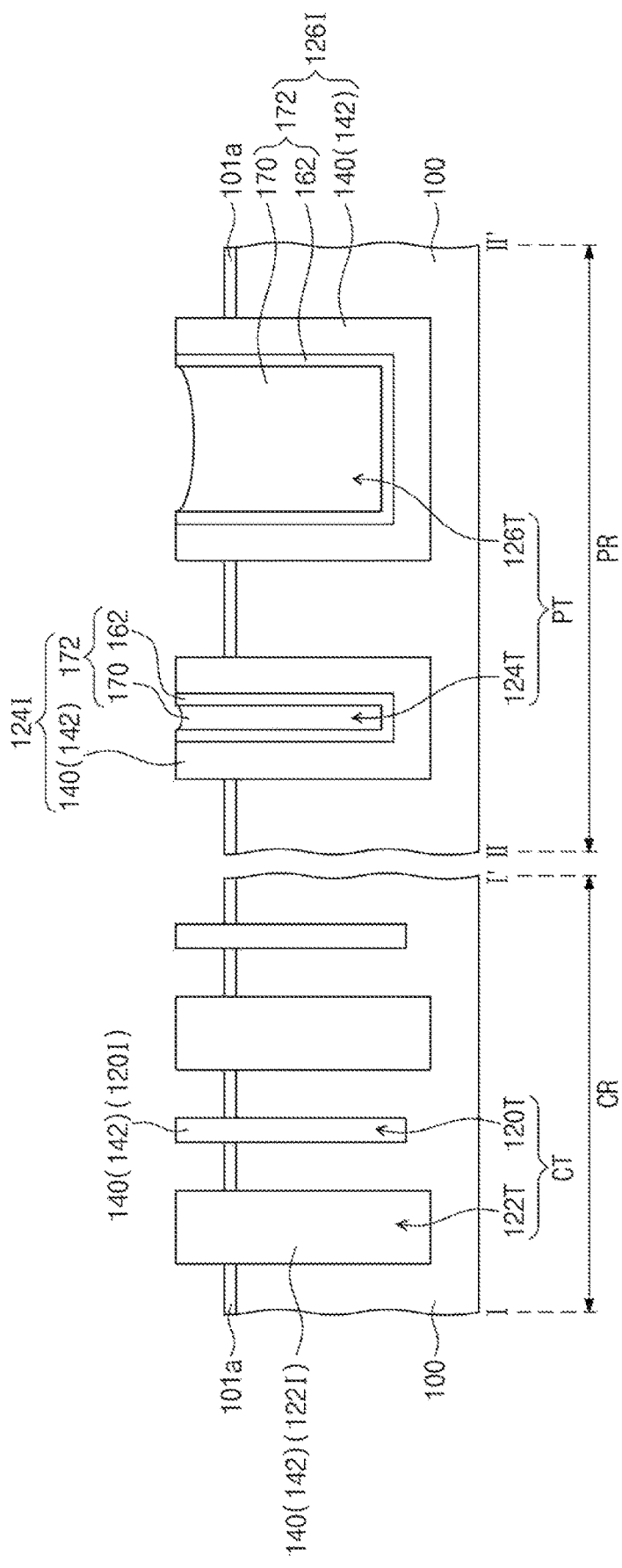

Referring to FIGS. 1 and 25, according to a present embodiment, the formation of the first semiconductor layer 130 and the first sub-oxide layer 132 is omitted. In addition, the second sub-oxide layer 140 completely fills the first cell trench 120T and the second cell trench 122T, and other features of the second sub-oxide layer 140 are substantially the same as those described with reference to FIG. 16. According to a present embodiment, the second sub-oxide layer 140 forms the first oxide layer 142. The first oxide layer 142 completely fills the first and second cell trenches 120T and 122T and conformally covers the inner surfaces of the first and second peripheral trenches 124T and 126T. Subsequently, the same processes as those described with reference to FIGS. 17 to 19 are performed.

According to a present embodiment, after a planarization process described with reference to FIG. 19 is performed, the second mask patterns 103a are removed. The first cell insulating pattern 120I, the second cell insulating pattern 122I, the first peripheral insulating pattern 124I and the second peripheral insulating pattern 126I are formed in the first cell trench 120T, the second cell trench 122T, the first peripheral trench 124T and the second peripheral trench 126T, respectively. According to a present embodiment, each of the first and second cell insulating patterns 120I and 122I include the remaining portions of the first oxide layer 142, i.e., the second sub-oxide layer 140. Each of the first and second peripheral insulating patterns 124 and 126I includes the remaining portions of the first oxide layer 142 and the second oxide layer 172. According to a present embodiment, the first and second cell insulating patterns 120I and 122I and the first and second peripheral insulating patterns 124I and 126I do not include a nitride.

According to a present embodiment, a subsequent process is substantially the same as one of the processes described with reference to FIGS. 12A to 12E.

Figure 26:
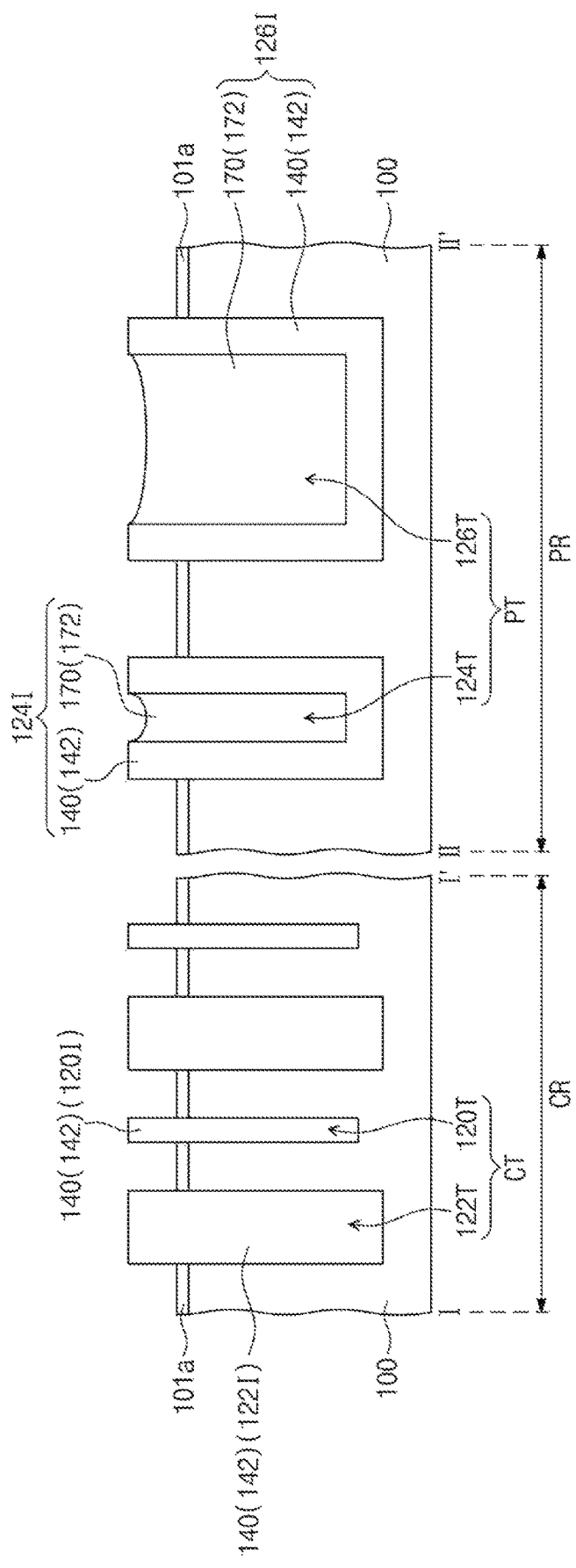

Referring to FIGS. 1 and 26, according to a present embodiment, the formation of the first semiconductor layer 130 and the first sub-oxide layer 132 is omitted. In addition, the second sub-oxide layer 140 completely fills the first cell trench 120T and the second cell trench 122T, and other features of the second sub-oxide layer 140 are substantially the same as those described with reference to FIG. 16. According to a present embodiment, the second sub-oxide layer 140 forms the first oxide layer 142. The first oxide layer 142 completely fills the first and second cell trenches 120T and 122T and conformally covers the inner surfaces of the first and second peripheral trenches 124T and 126T.

According to a present embodiment, the formation of the first nitride layer 150 and the removal of a portion of the first nitride layer 150 is omitted. In addition, the formation of the second semiconductor layer 160 and the third sub-oxide layer 162 is omitted. In this case, the fourth sub-oxide layer 170 can be formed at a lower temperature, and other features of the fourth sub-oxide layer 170 are substantially the same as those described with reference to FIG. 18. The fourth sub-oxide layer 170 forms the second oxide layer 172. The first oxide layer 142, i.e., the second sub-oxide layer 140, and the second oxide layer 172, i.e., the fourth sub-oxide layer 170, completely fill each of the first and second peripheral trenches 124T and 126T. Subsequently, a same process as that described with reference to FIG. 19 is performed.

According to a present embodiment, after a planarization process described with reference to FIG. 19 is performed, the second mask patterns 103a are removed. The first cell insulating pattern 120I, the second cell insulating pattern 122I, the first peripheral insulating pattern 124I and the second peripheral insulating pattern 126I are formed in the first cell trench 120T, the second cell trench 122T, the first peripheral trench 124T and the second peripheral trench 126T, respectively. According to a present embodiment, each of the first and second cell insulating patterns 120I and 122I includes the remaining portion of the first oxide layer 142, i.e., the second sub-oxide layer 140. Each of the first and second peripheral insulating patterns 124I and 126I includes the remaining portion of the first oxide layer 142 and the remaining portion of the second oxide layer 172, i.e., the fourth sub-oxide layer 170. According to a present embodiment, the first and second cell insulating patterns 120I and 122I and the first and second peripheral insulating patterns 124I and 126I do not include a nitride.

According to a present embodiment, a subsequent process is substantially the same as one of the processes described with reference to FIGS. 12A to 12E.

Figure 27:
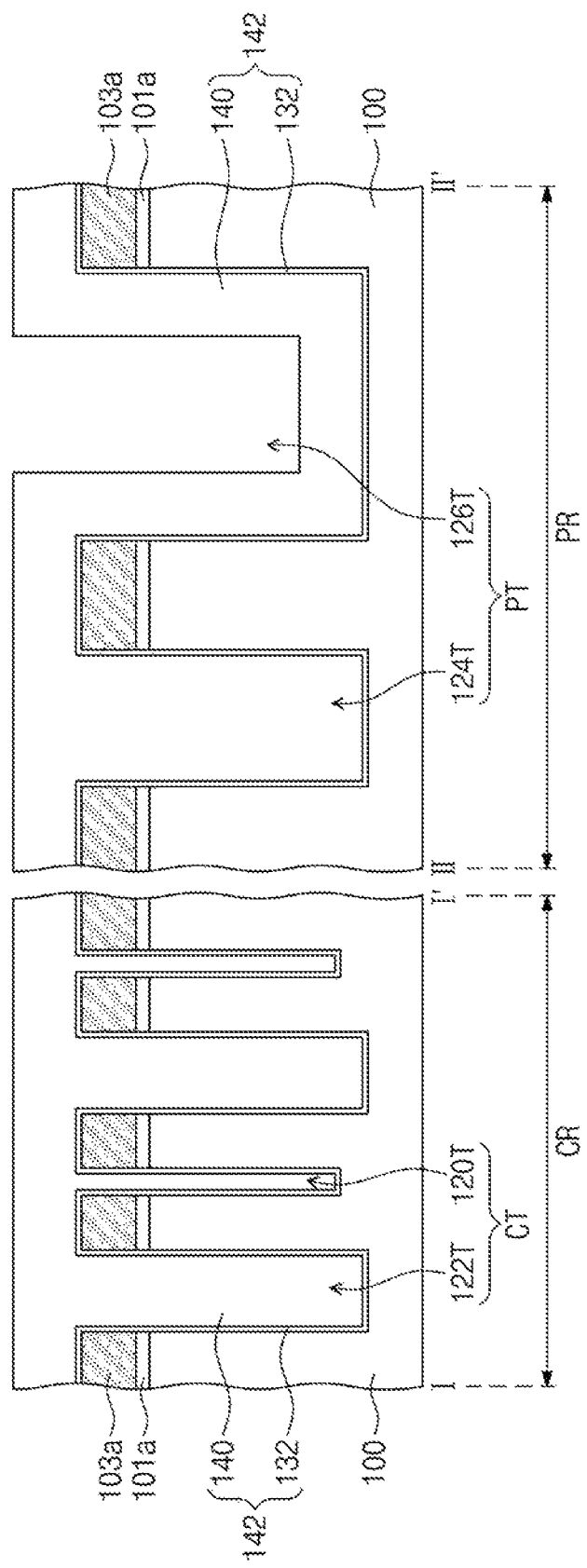
FIGS. 27 and 28 are cross-sectional views that correspond to lines I-I' and II-II' of FIG. 1 that illustrate a method for fabricating a semiconductor device according to some embodiments of the inventive concepts.
Figure 28:
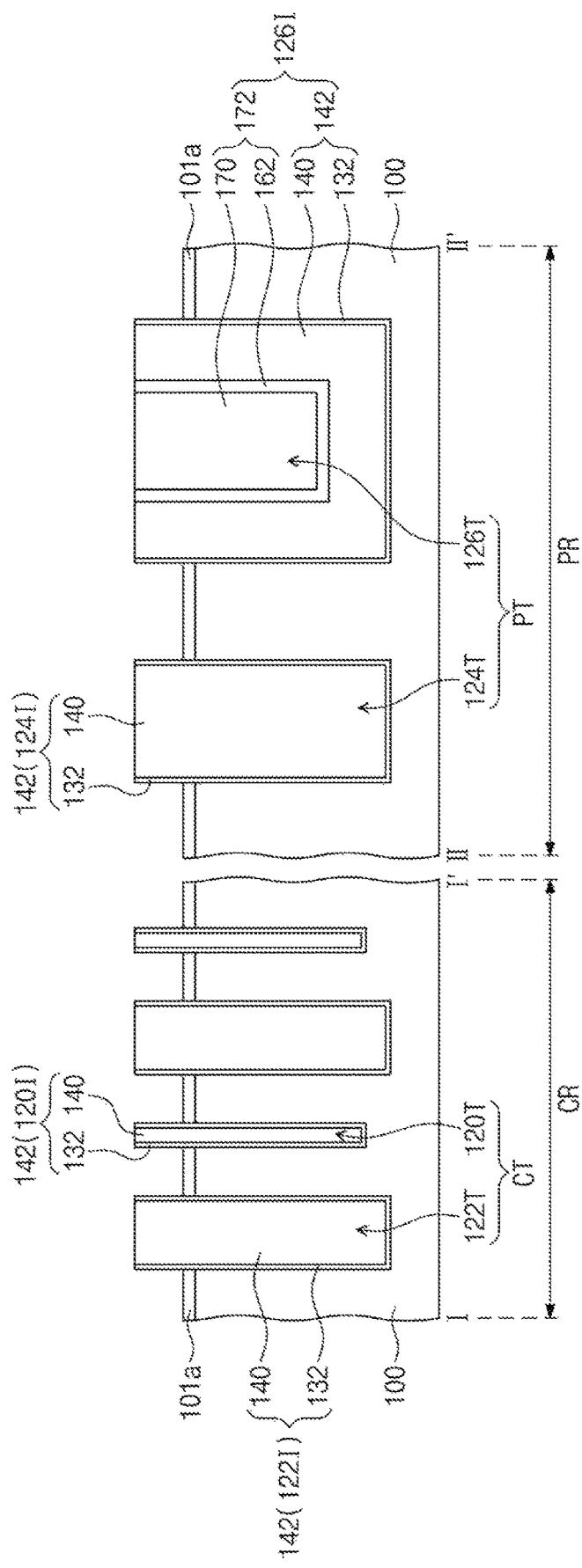

FIGS. 27 and 28 are cross-sectional views that corresponding to lines I-I' and II-II' of FIG. 1 that illustrate a method for fabricating a semiconductor device according to some embodiments of the inventive concepts. Hereinafter, differences between embodiments of FIGS. 27 and 28 and embodiments of FIGS. 2 to 11 and 12A will be mainly described for the purpose of ease and convenience in explanation.

Referring to FIGS. 1 and 27, according to a present embodiment, the second sub-oxide layer 140 is formed on the first sub-oxide layer 132. According to a present embodiment, the second sub-oxide layer 140 completely fills a remaining region of the first cell trench 120T, a remaining region of the second cell trench 122T, and a remaining region of the first peripheral trench 124T. The second sub-oxide layer 140 partially fills the second peripheral trench 126T. The second sub-oxide layer 140 conformally covers the inner surface of the second peripheral trench 126T. The first sub-oxide layer 132 and the second sub-oxide layer 140 form the first oxide layer 142. The first oxide layer 142 completely fills the first and second cell trenches 120T and 122T and the first peripheral trench 124T and conformally covers the inner surface of the second peripheral trench 126T.

According to a present embodiment, subsequent processes are substantially the same as those described with reference to FIGS. 17 to 19, except that the second semiconductor layer 160, the third sub-oxide layer 162 and the fourth sub-oxide layer 170 are not formed in the first peripheral trench 124T.

Referring to FIGS. 1 and 28, according to a present embodiment, the second mask patterns 103a are removed after a planarization process described with reference to FIG. 19. The first cell insulating pattern 120I, the second cell insulating pattern 122I, the first peripheral insulating pattern 124I and the second peripheral insulating pattern 126I are formed in the first cell trench 120T, the second cell trench 122T, the first peripheral trench 124T and the second peripheral trench 126T, respectively. According to a present embodiment, each of the first cell insulating pattern 120I, the second cell insulating pattern 122I and the first peripheral insulating pattern 124I includes the remaining portion of the first oxide layer 142. The second peripheral insulating pattern 126I includes the remaining portions of the first oxide layer 142 and the second oxide layer 172. In this case, the second peripheral insulating pattern 126I includes a material, i.e., the fourth sub-oxide layer 170, that is less dense than a material of the first peripheral insulating pattern 124I. According to a present embodiment, the first and second cell insulating patterns 120I and 122I and the first and second peripheral insulating patterns 124I and 126I do not include a nitride.

According to a present embodiment, a subsequent process is substantially the same as one of the processes described with reference to FIGS. 12A to 12E.

FIGS. 29 to 38 and 39A are cross-sectional views that correspond to lines I-I' and II-II' of FIG. 1 that illustrate a method for fabricating a semiconductor device according to some embodiments of the inventive concepts. Hereinafter, differences between embodiments of FIGS. 29-38 and 39A and embodiments of FIGS. 2 to 11 and 12A will be mainly described for the purpose of ease and convenience in explanation.

Figure 29:
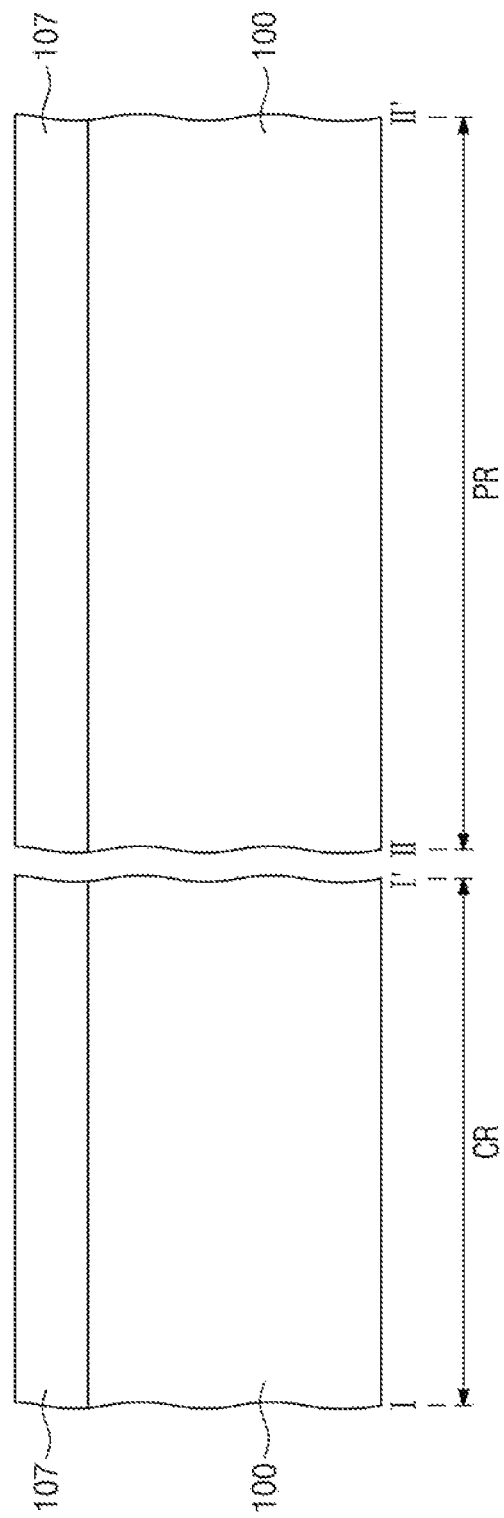

Referring to FIGS. 1 and 29, according to a present embodiment, a mask layer 107 is formed on the substrate 100. The mask layer 107 covers the cell region CR and the peripheral circuit region PR of the substrate 100. The mask layer 107 is a single-layered mask layer that includes an oxide, such as silicon oxide.

Figure 30:
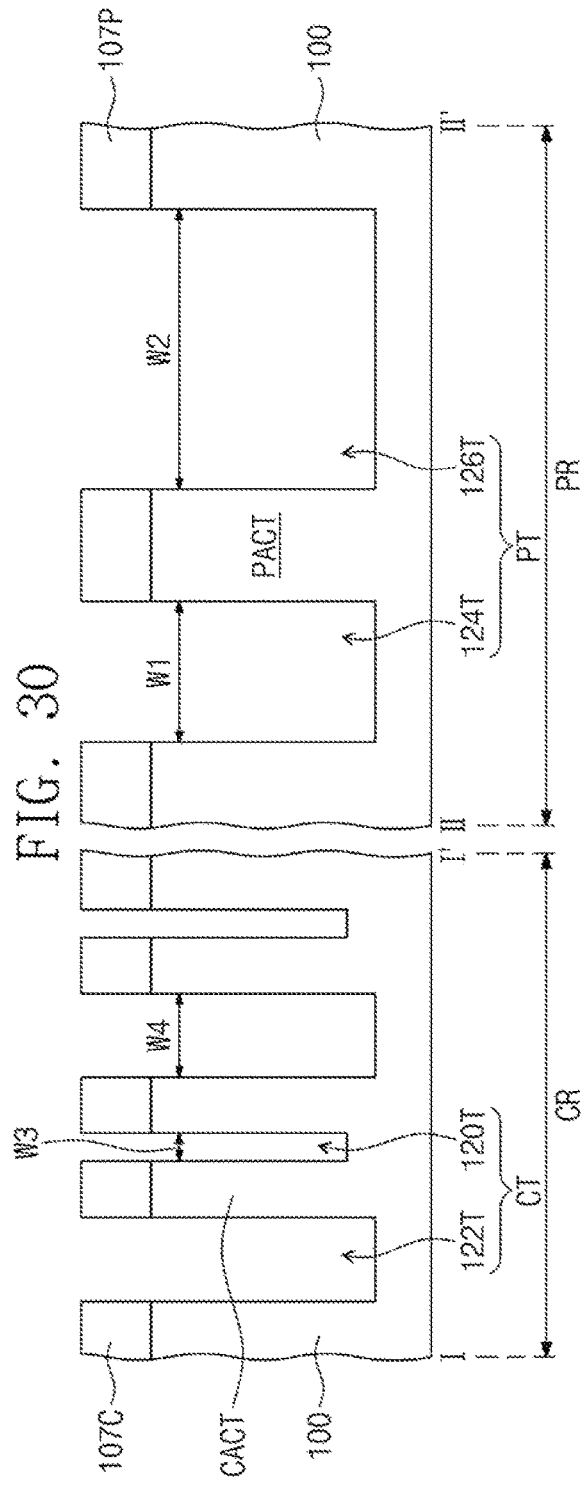

Referring to FIGS. 1 and 30, according to a present embodiment, the mask layer 107 is patterned to form a cell mask pattern 107C and a peripheral mask pattern 107P. The cell mask pattern 107C defines a region on the cell region CR of the substrate 100 in which the cell active region CACT will be formed. The peripheral mask pattern 107P defines a region on the peripheral circuit region PR of the substrate 100 in which the peripheral active region PACT will be formed.

According to a present embodiment, the cell trench CT and the peripheral trench PT are formed in the cell region CR and the peripheral circuit region PR of the substrate 100, respectively. The formation of the cell trench CT and the peripheral trench PT include etching the substrate 100 using the cell mask pattern 107C and the peripheral mask pattern 107P as etch masks. The peripheral trench PT includes the first peripheral trench 124T having the first width W1 and the second peripheral trench 126T having the second width W2 greater than the first width W1. The cell trench CT includes the first cell trench 120T having the third width W3 and the second cell trench 122T having the fourth width W4 greater than the third width W3.

Figure 31:
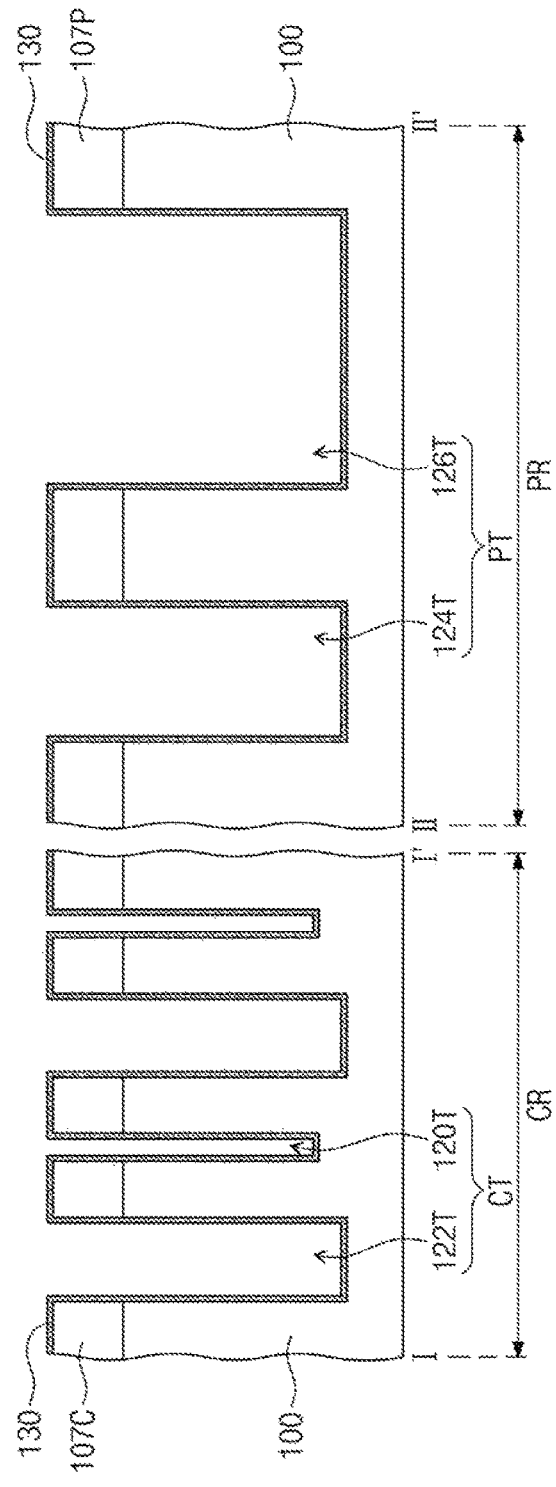

Referring to FIGS. 1 and 31, according to a present embodiment, the first semiconductor layer 130 is formed on the substrate 100. The first semiconductor layer 130 covers top surfaces and sidewalls of the cell mask pattern 107C and the peripheral mask pattern 107P. The first semiconductor layer 130 partially fills each of the first cell trench 120T, the second cell trench 122T, the first peripheral trench 124T and the second peripheral trench 126T. The first semiconductor layer 130 conformally covers an inner surface of each of the first cell trench 120T, the second cell trench 122T, the first peripheral trench 124T and the second peripheral trench 126T.

Referring to FIGS. 1 and 32, according to a present embodiment, the first semiconductor layer 130 is oxidized to form the first sub-oxide layer 132. The second sub-oxide layer 140 is formed on the first sub-oxide layer 132 that fills a remaining region of the first cell trench 120T. The second sub-oxide layer 140 covers the top surfaces and the sidewalls of the cell mask pattern 107C and the peripheral mask pattern 107P. The second sub-oxide layer 140 completely fills the remaining region of the first cell trench 120T. The second sub-oxide layer 140 partially fills each of the second cell trench 122T, the first peripheral trench 124T and the second peripheral trench 126T. The second sub-oxide layer 140 conformally covers the inner surface of each of the second cell trench 122T, the first peripheral trench 124T and the second peripheral trench 126T. The first sub-oxide layer 132 and the second sub-oxide layer 140 form the first oxide layer 142. The first oxide layer 142 completely fills the first cell trench 120T and conformally covers the inner surface of each of the second cell trench 122T, the first peripheral trench 124T and the second peripheral trench 126T.

According to some embodiments, the formation of the first semiconductor layer 130 and the first sub-oxide layer 132 is omitted. In this case, the second sub-oxide layer 140 forms the first oxide layer 142 and completely fills the first cell trench 120T.

Referring to FIGS. 1 and 33, according to a present embodiment, the first nitride layer 150 is formed on the first oxide layer 142 that fills a remaining region of the second cell trench 122T. The first nitride layer 150 covers the top surfaces and the sidewalls of the cell mask pattern 107C and the peripheral mask pattern 107P and completely fills the remaining region of the second cell trench 122T. The first nitride layer 150 partially fills each of the first peripheral trench 124T and the second peripheral trench 126T. The first nitride layer 150 conformally covers the inner surface of each of the first peripheral trench 124T and the second peripheral trench 126T.

Referring to FIGS. 1 and 34, according to a present embodiment, the first nitride layer 150 is removed from the first and second peripheral trenches 124T and 126T. For example, removing the first nitride layer 150 includes performing a wet etching process using an etching solution that includes phosphoric acid. The first nitride layer 150 on the peripheral circuit region PR is removed by the wet etching process, and thus the first oxide layer 142 on the peripheral circuit region PR is exposed. A portion of the first nitride layer 150 on the cell region CR is also removed by the wet etching process. Thus, a portion of the first oxide layer 142 on the cell region CR is exposed. A portion of the first nitride layer 150 that fills the second cell trench 122T is not removed by the wet etching process but remains on the cell region CR.

According to some embodiments, the formation of the first nitride layer 150 and the removal of a portion of the first nitride layer 150 is omitted. In this case, the first oxide layer 142 completely fills the first and second cell trenches 120T and 122T and conformally covers the inner surfaces of the first and second peripheral trenches 124T and 126T. Alternatively, the first oxide layer 142 completely fills the first and second cell trenches 120T and 122T and the first peripheral trench 124T and conformally covers the inner surface of the second peripheral trench 126T.

Referring to FIGS. 1 and 35, according to a present embodiment, the second semiconductor layer 160 is formed on the substrate 100. The second semiconductor layer 160 covers the exposed portion of the first oxide layer 142 on the cell region CR and the remaining portion of the first nitride layer 150 on the cell region CR. In addition, the second semiconductor layer 160 covers the first oxide layer 142 on the peripheral circuit region PR and partially fills each of the first and second peripheral trenches 124T and 126T. The second semiconductor layer 160 conformally covers the inner surfaces of each of the first and second peripheral trenches 124T and 126T.

Figure 36:
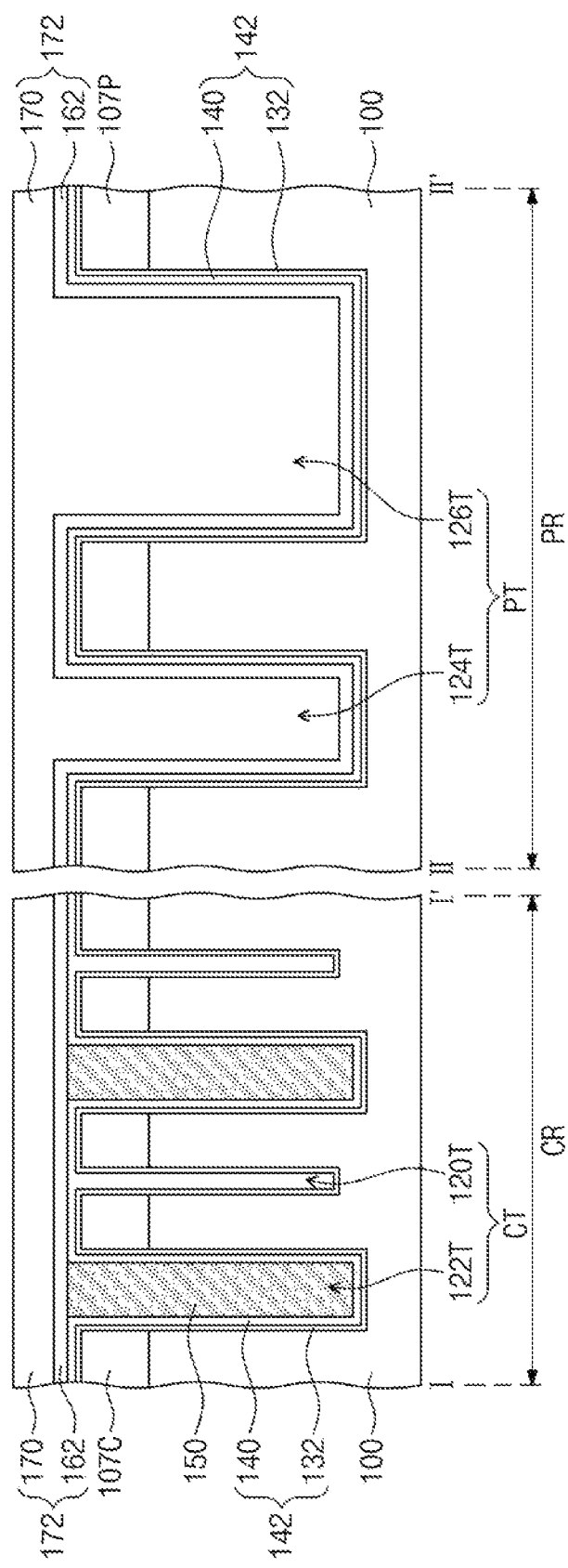

Referring to FIGS. 1 and 36, according to a present embodiment, the second semiconductor layer 160 is oxidized to form the third sub-oxide layer 162. The fourth sub-oxide layer 170 is formed on the third sub-oxide layer 162 that covers the cell region CR and the peripheral circuit region PR of the substrate 100. The fourth sub-oxide layer 170 fills a remaining region of each of the first and second peripheral trenches 124T and 126T. The third sub-oxide layer 162 and the fourth sub-oxide layer 170 form the second oxide layer 172. The first oxide layer 142 and the second oxide layer 172 completely fill each of the first and second peripheral trenches 124T and 126T.

According to some embodiments, the formation of the second semiconductor layer 160 and the third sub-oxide layer 162 is omitted. In this case, a process that forms the fourth sub-oxide layer 170 can be performed at a lower temperature, and the fourth sub-oxide layer 170 forms the second oxide layer 172.

Figure 37:
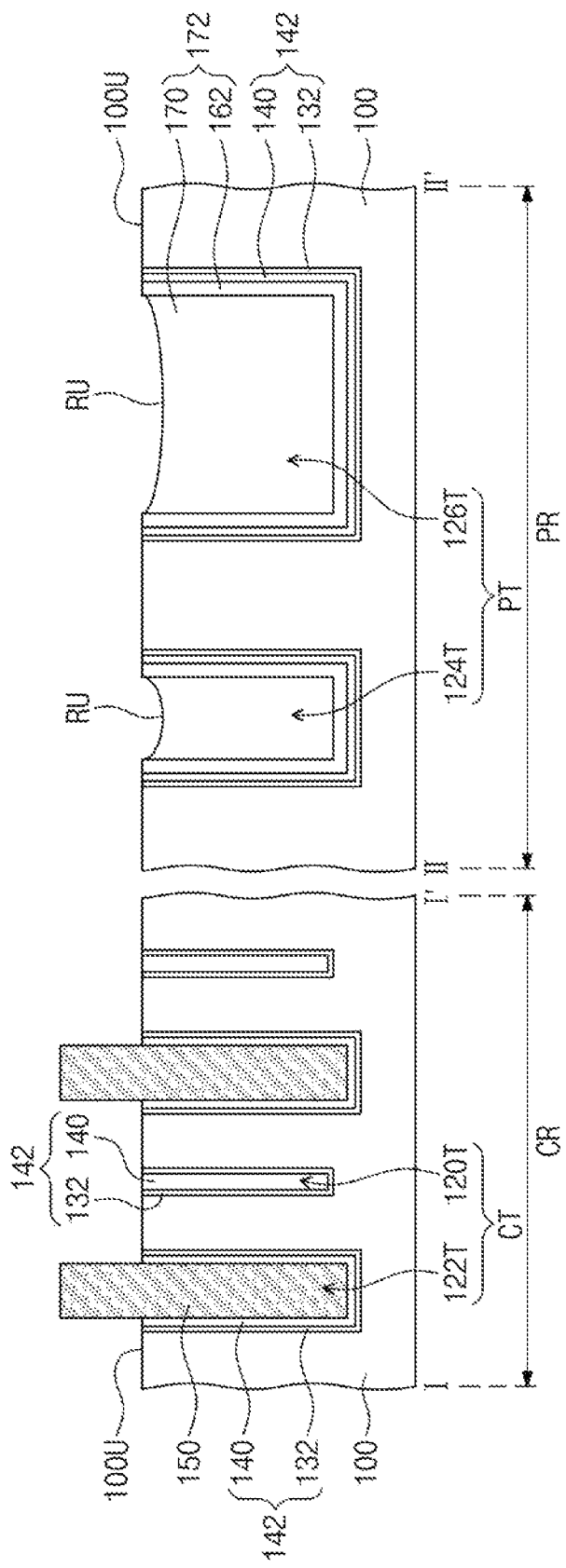

Referring to FIGS. 1 and 37, according to a present embodiment, a planarization process is performed on the substrate 100 that removes a portion of the second oxide layer 172 and a portion of the first oxide layer 142. The planarization process is performed until the top surface 100U of the substrate 100 is exposed. An upper portion of the remaining portion of the first nitride layer 150 is exposed by the planarization process.

According to a present embodiment, due to the planarization process, a portion of the first oxide layer 142 remains in each of the first cell trench 120T, the second cell trench 122T, the first peripheral trench 124T and the second peripheral trench 126T. The first cell trench 120T is completely filled with the remaining portion of the first oxide layer 142. The second cell trench 122T is completely filled with the remaining portion of the first oxide layer 142 and the remaining portion of the first nitride layer 150. Due to the planarization process, a portion of the second oxide layer 172 remains in each of the first and second peripheral trenches 124T and 126T. Each of the first and second peripheral trenches 124T and 126T is completely filled with the remaining portions of the first oxide layer 142 and the second oxide layer 172. The remaining portion of the second oxide layer 172 includes a downward recessed top surface RU. Thereafter, a plasma treatment process is performed on the substrate 100.

Figure 38:
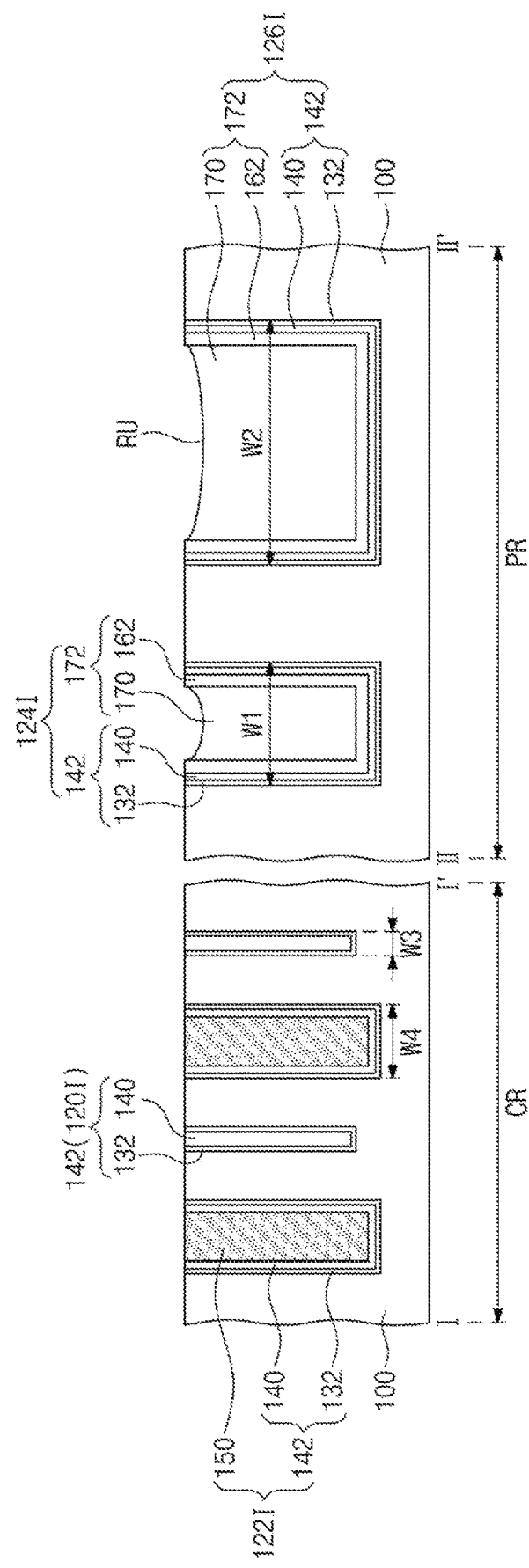

Referring to FIGS. 1 and 38, according to a present embodiment, the exposed upper portion of the remaining portion of the first nitride layer 150 is removed. For example, removing the exposed upper portion of the remaining portion of the first nitride layer 150 includes performing a wet etching process using an etching solution that includes phosphoric acid.

According to a present embodiment, the first cell insulating pattern 120I, the second cell insulating pattern 122I, the first peripheral insulating pattern 124I and the second peripheral insulating pattern 126I are formed in the first cell trench 120T, the second cell trench 122T, the first peripheral trench 124T and the second peripheral trench 126T, respectively. The first cell insulating pattern 120I includes the remaining portion of the first oxide layer 142, and the second cell insulating pattern 122I includes the remaining portions of the first oxide layer 142 and the first nitride layer 150. Each of the first and second peripheral insulating patterns 124I and 126I include the remaining portions of the first oxide layer 142 and the second oxide layer 172.

According to some embodiments, each of the first and second cell insulating patterns 120I and 122I includes the remaining portion of the first oxide layer 142, and each of the first and second peripheral insulating patterns 124I and 126I includes the remaining portions of the first oxide layer 142 and the second oxide layer 172. According to some embodiments, each of the first cell insulating pattern 120I, the second cell insulating pattern 122I and the first peripheral insulating pattern 124I includes the remaining portion of the first oxide layer 142, and the second peripheral insulating pattern 126I includes the remaining portions of the first oxide layer 142 and the second oxide layer 172. In these cases, none of the first and second cell insulating patterns 120I and 122I and the first and second peripheral insulating patterns 124I and 126I include a nitride.

Figure 39A:
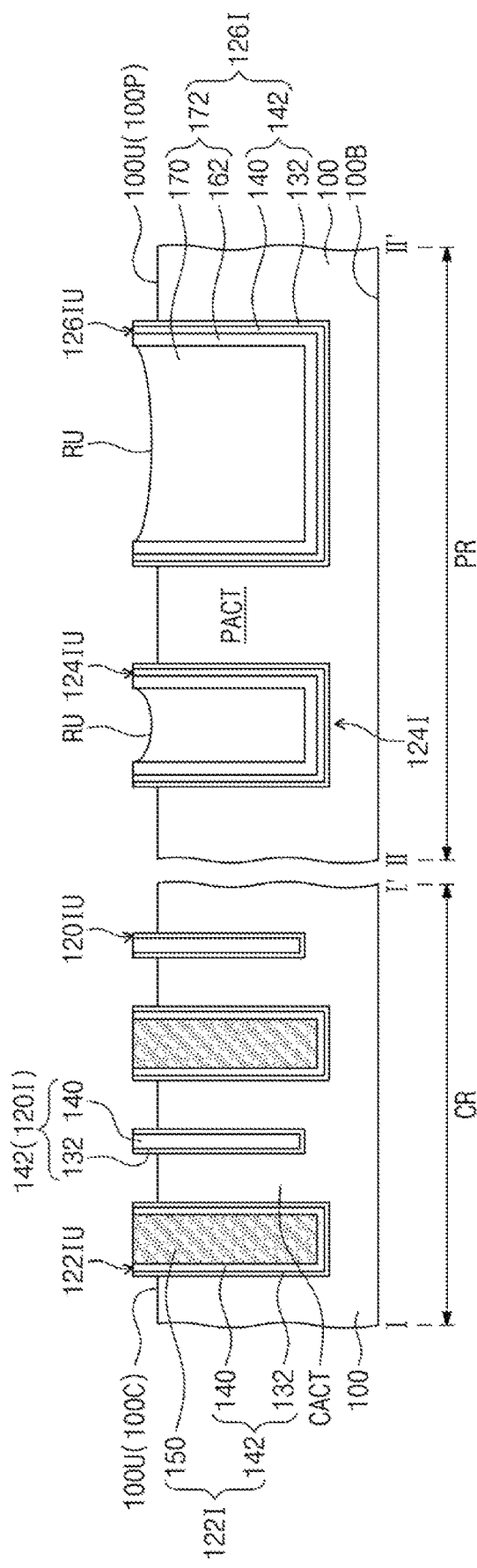

Referring to FIGS. 1 and 39A, according to a present embodiment, an upper portion of the substrate 100 is recessed. Since the upper portion of the substrate 100 of the cell region CR is recessed, upper portions of the first and second cell insulating patterns 120I and 122I protrude from the top surface 100U of the substrate 100, i.e., a top surface 100C of the cell active region CACT. Since the upper portion of the substrate 100 of the peripheral circuit region PR is recessed, upper portions of the first and second peripheral insulating patterns 124I and 126I protrude from the top surface 100U of the substrate 100, i.e., a top surface 100P of the peripheral active region PACT. In some embodiments, the top surface 100C of the cell active region CACT and the top surface 100P of the peripheral active region PACT are positioned at the same height from the bottom surface 100B of the substrate 100. Each of the topmost surfaces 120IU and 122IU of the first and second cell insulating patterns 120I and 122I is positioned higher than the top surface 100C of the cell active region CACT, and each of the topmost surfaces 124IU and 126IU of the first and second peripheral insulating patterns 124I and 126I is positioned higher than the top surface 100P of the peripheral active region PACT.

FIGS. 39B to 39E are cross-sectional views that correspond to lines I-I' and II-II' of FIG. 1 that respectively illustrate methods for fabricating a semiconductor device according to some embodiments of the inventive concepts. Hereinafter, differences between embodiments of FIGS. 39B to 39E and embodiments of FIGS. 29 to 38 and 39A will be mainly described for the purpose of ease and convenience in explanation.

Figure 39B:
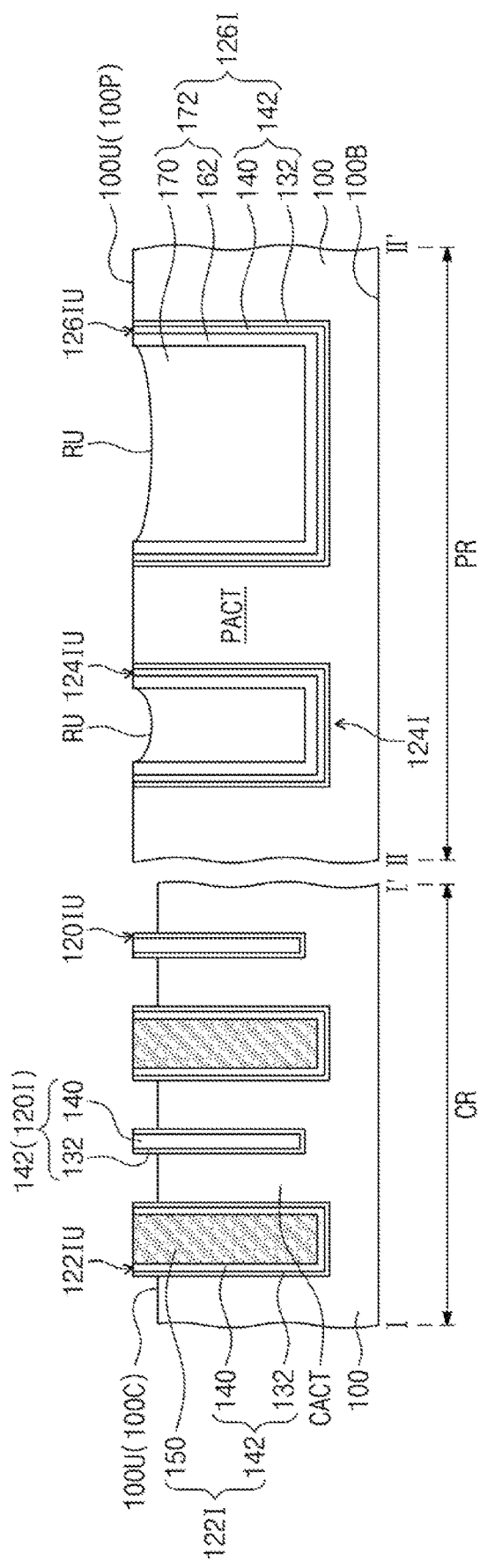
FIGS. 39B to 39E are cross-sectional views that correspond to lines I-I' and II-II' of FIG. 1 that respectively illustrate methods for fabricating a semiconductor device according to some embodiments of the inventive concepts.

Referring to FIGS. 1 and 39B, according to a present embodiment, the upper portion of the substrate 100 of the cell region CR is selectively recessed. Thus, the upper portions of the first and second cell insulating patterns 120I and 122I protrude from the top surface 100U of the substrate 100, i.e., the top surface 100C of the cell active region CACT. According to a present embodiment, the top surface 100C of the cell active region CACT is positioned lower than the top surface 100P of the peripheral active region PACT with respect to the bottom surface 100B of the substrate 100. Each of the topmost surfaces 120IU and 122IU of the first and second cell insulating patterns 120I and 122I are positioned higher than the top surface 100C of the cell active region CACT. The topmost surface 124IU of the first peripheral insulating pattern 124I and the topmost surface 126IU of the second peripheral insulating pattern 126I are substantially coplanar with the top surface 100P of the peripheral active region PACT. In other words, each of the topmost surfaces 124IU and 126IU of the first and second peripheral insulating patterns 124I and 126I are positioned at substantially a same height as the top surface 100P of the peripheral active region PACT.

Figure 39C:
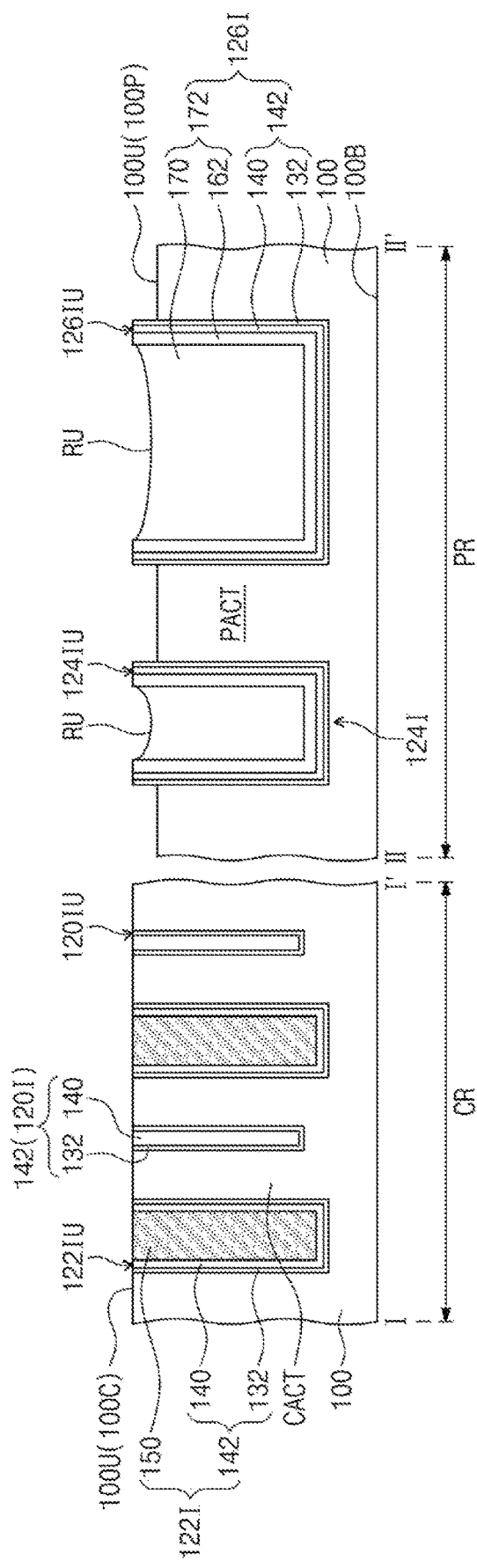

Referring to FIGS. 1 and 39C, according to a present embodiment, the upper portion of the substrate 100 of the peripheral circuit region PR is selectively recessed. Thus, the upper portions of the first and second peripheral insulating patterns 124I and 126I protrude from the top surface 100U of the substrate 100, i.e., the top surface 100P of the peripheral active region PACT. According to a present embodiment, the top surface 100P of the peripheral active region PACT are positioned lower than the top surface 100C of the cell active region CACT with respect to the bottom surface 100B of the substrate 100. Each of the topmost surfaces 124IU and 126IU of the first and second peripheral insulating patterns 124I and 126I are positioned higher than the top surface 100 of the peripheral active region PACT. The topmost surface 120IU of the first cell insulating pattern 120I and the topmost surface 122IU of the second cell insulating pattern 122I are substantially coplanar with the top surface 100C of the cell active region CACT. In other words, each of the topmost surfaces 120IU and 122IU of the first and second cell insulating patterns 120I and 122I are positioned at substantially a same height as the top surface 100C of the cell active region CACT.

Figure 39D:
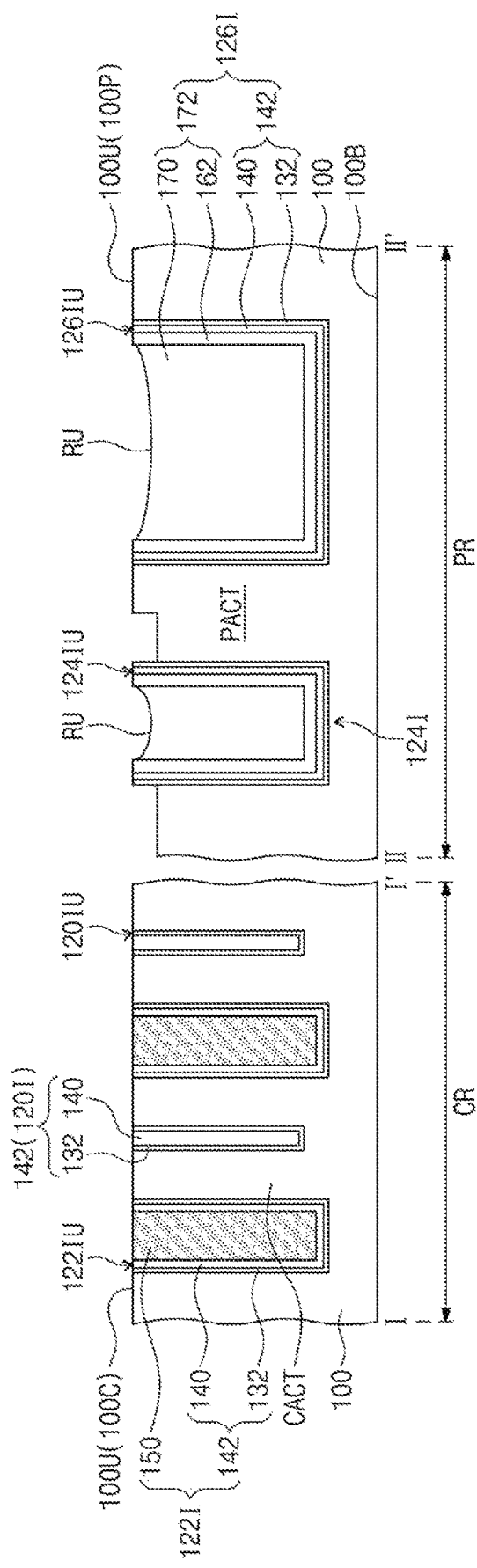

Referring to FIGS. 1 and 39D, according to a present embodiment, the upper portion of the substrate 100 of the peripheral circuit region PR is partially recessed. According to a present embodiment, a portion of the top surface 100P of the peripheral active region PACT is positioned lower with respect to the bottom surface 100B of the substrate 100 than another portion of the top surface 100P of the peripheral active region PACT and the top surface 100C of the cell active region CACT. Since the upper portion of the substrate 100 of the peripheral circuit region PR is partially recessed, the upper portion of the first peripheral insulating pattern 124I protrudes from the recessed portion of the top surface 100U of the substrate 100, i.e., the recessed portion of the top surface 100P of the peripheral active region PACT. In this case, the topmost surface 124IU of the first peripheral insulating pattern 124I is positioned higher than the the recessed portion of the top surface 100P of the peripheral active region PACT, and the topmost surface 126IU of the second peripheral insulating pattern 126I is positioned at substantially a same height as the other portion of the top surface 100P of the peripheral active region PACT.

According to a present embodiment, the topmost surface 120IU of the first cell insulating pattern 120I and the topmost surface 122IU of the second cell insulating pattern 122I are substantially coplanar with the top surface 100C of the cell active region CACT. In other words, each of the topmost surfaces 120IU and 122IU of the first and second cell insulating patterns 120I and 122I are positioned at substantially a same height as the top surface 100C of the cell active region CACT.

Figure 39E:
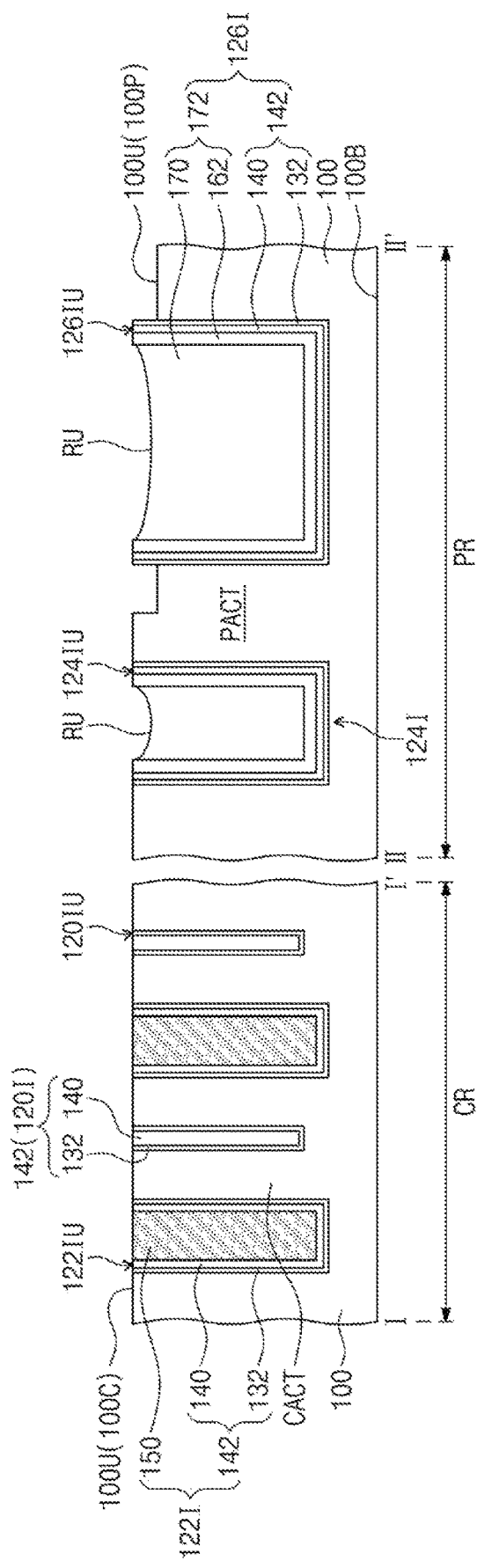

Referring to FIGS. 1 and 39E, according to a present embodiment, the upper portion of the substrate 100 of the peripheral circuit region PR is partially recessed. According to a present embodiment, a portion of the top surface 100P of the peripheral active region PACT is positioned lower with respect to the bottom surface 100B of the substrate 100 than another portion of the top surface 100P of the peripheral active region PACT and the top surface 100C of the cell active region CACT. Since the upper portion of the substrate 100 of the peripheral circuit region PR is partially recessed, the upper portion of the second peripheral insulating pattern 126I protrudes from the recessed portion of the top surface 100U of the substrate 100, i.e., the recessed portion of the top surface 100P of the peripheral active region PACT. In this case, the topmost surface 126IU of the second peripheral insulating pattern 126I is positioned higher than the recessed portion of the top surface 100P of the peripheral active region PACT, and the topmost surface 124IU of the first peripheral insulating pattern 124I is positioned at substantially a same height as the other portion of the top surface 100P of the peripheral active region PACT.

According to a present embodiment, the topmost surface 120IU of the first cell insulating pattern 120I and the topmost surface 122IU of the second cell insulating pattern 122I are substantially coplanar with the top surface 100C of the cell active region CACT. In other words, each of the topmost surfaces 120IU and 122IU of the first and second cell insulating patterns 120I and 122I are positioned at substantially a same height as the top surface 100C of the cell active region CACT.

In general, according to a present embodiment, if the first and second peripheral insulating patterns 124I and 126I include a nitride layer, an effective channel length of a peripheral transistor formed on the peripheral circuit region PR is reduced, such as a hot electron induced punch-through (HEIP) phenomenon. In this case, the nitride layer in the first and second peripheral insulating patterns 124I and 126I functions as an electron trap layer, and a HEIP phenomenon is caused by electrons trapped in the nitride layer. If the effective channel length of the peripheral transistor is reduced, electrical characteristics of a semiconductor device can deteriorate. In addition, when a gate electrode layer is formed to cover at least one of the first cell insulating pattern 120I, the second cell insulating pattern 122I, the first peripheral insulating pattern 124I or the second peripheral insulating pattern 126I, after patterning the gate electrode layer, a portion of the gate electrode layer may remain on the at least one of the first cell insulating pattern 120I, the second cell insulating pattern 122I, the first peripheral insulating pattern 124I or the second peripheral insulating pattern 126I. The remaining portion of the gate electrode layer can cause an electrical short between adjacent gate electrodes.

However, according to embodiments of the inventive concepts, the first and second peripheral insulating patterns 124I and 126I do not include the nitride layer 150. Thus, a HEIP phenomenon is prevented. In addition, according to embodiments of the inventive concepts, at least one of the first cell insulating pattern 120I, the second cell insulating pattern 122I, the first peripheral insulating pattern 124I or the second peripheral insulating pattern 126I protrudes from the top surface 100U of the substrate 100. In this case, it is easy to remove portions of the gate electrode layer which remain on the at least one of the first cell insulating pattern 120I, the second cell insulating pattern 122I, the first peripheral insulating pattern 124I or the second peripheral insulating pattern 126I while patterning the gate electrode layer. Thus, an electrical short between the gate electrodes can be prevented. As a result, electrical characteristics of the semiconductor device can be improved.

Figure 41:
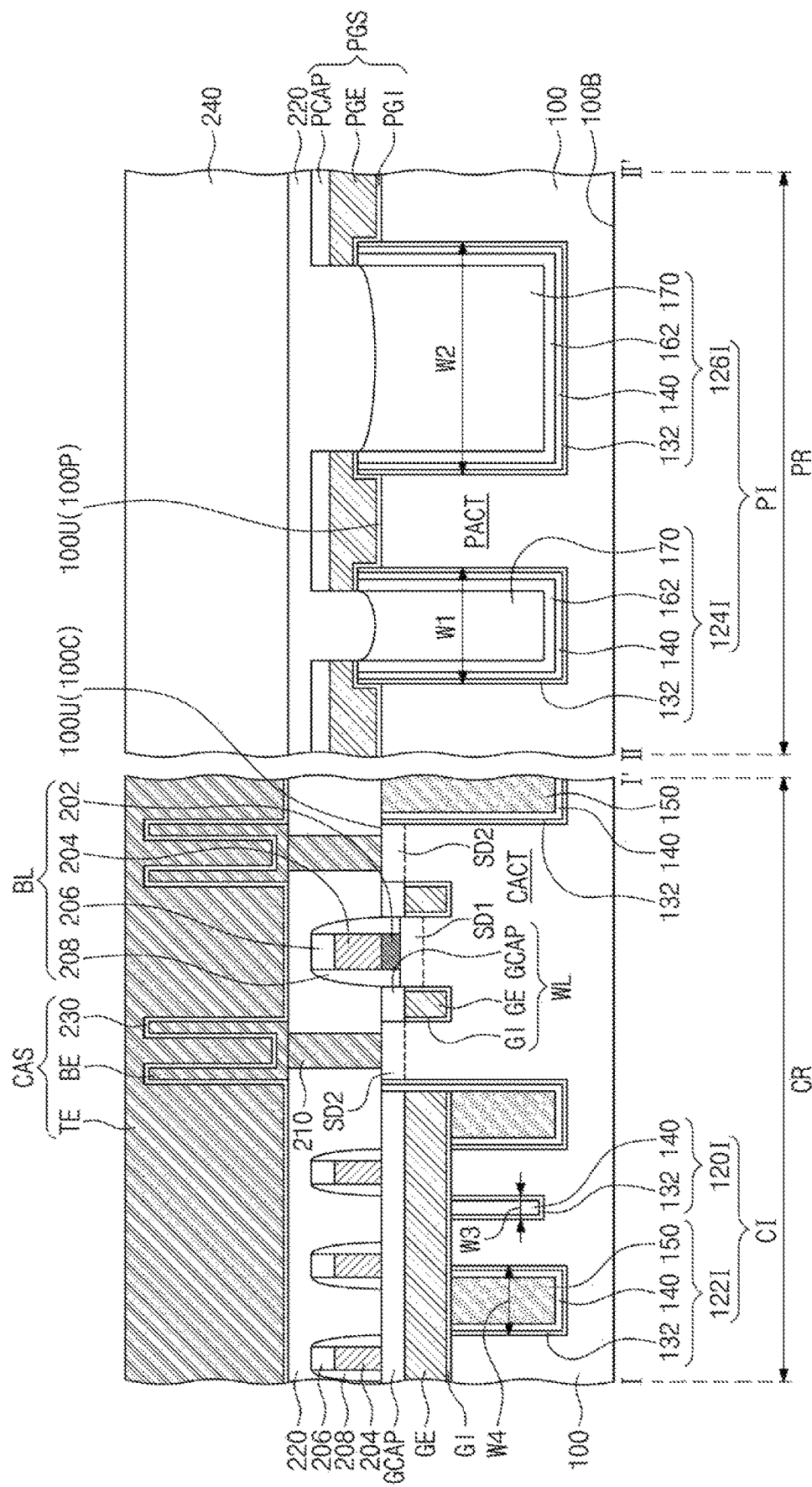
FIG. 41 is a cross-sectional view taken along lines I-I' and II-II' of FIG. 40.

FIG. 40 is a plan view that illustrates a semiconductor device according to some embodiments of the inventive concepts. FIG. 41 is a cross-sectional view taken along lines I-I' and II-II' of FIG. 40.

Referring to FIGS. 40 and 41, according to a present embodiment, a cell insulating pattern CI that defines the cell active region CACT is provided in the cell region CR of the substrate 100. The cell insulating pattern CI includes the first cell insulating pattern 120I and the second cell insulating pattern 122I. A peripheral insulating pattern P1 that defines the peripheral active region PACT is provided in the peripheral circuit region PR of the substrate 100. The peripheral insulating pattern P1 includes the first peripheral insulating pattern 124I and the second peripheral insulating pattern 126I. The cell active region CACT, the peripheral active region PACT, the first and second cell insulating patterns 120I and 122I and the first and second peripheral insulating patterns 124I and 126I can be formed according to at least one of the methods for fabricating the semiconductor device described with reference to FIGS. 1 to 11, 12A to 12E and 13 to 28. In this case, the top surface 100C of the cell active region CACT and the top surface 100P of the peripheral active region PACT are positioned at the same height from the bottom surface 100B of the substrate 100.

In some embodiments, upper portions of the first and second peripheral insulating patterns 124I and 126I protrude from the top surface 100U of the substrate 100, i.e., the top surface 100P of the peripheral active region PACT. In some embodiments, as described with reference to FIG. 12B, the topmost surface 120IU of the first cell insulating pattern 120I and the topmost surface 122IU of the second cell insulating pattern 122I are positioned at substantially the same height as the top surface 100C of the cell active region CACT. Each of the topmost surfaces 124IU and 126IU of the first and second peripheral insulating patterns 124I and 126I are positioned higher than the top surface 100P of the peripheral active region PACT. In other words, each of the topmost surfaces 124IU and 126IU of the first and second peripheral insulating patterns 124I and 126I are positioned higher than the topmost surfaces 120IU and 122IU of the first and second cell insulating patterns 120I and 122I.

According to a present embodiment, word lines WL that intersect the cell active region CACT are disposed on the cell region CR of the substrate 100. The word lines WL extend in the second direction D2 and are spaced apart along the first direction D1. Each of the word lines WL includes a cell gate electrode GE buried in the substrate 100, a cell gate dielectric pattern GI disposed between the cell gate electrode GE and the cell active region CACT and between the cell gate electrode GE and the cell insulating pattern CI, and a cell gate capping pattern GCAP on a top surface of the cell gate electrode GE. A top surface of the cell gate capping pattern GCAP is substantially coplanar with the top surface 100U of the substrate 100, i.e., the top surface 100C of the cell active region CACT. The cell gate electrode GE includes a conductive material. For example, the conductive material includes at least one of a doped semiconductor material, such as doped silicon or doped germanium, a conductive metal nitride, such as titanium nitride or tantalum nitride, a metal, such as tungsten, titanium, or tantalum, or a metal-semiconductor compound, such as tungsten silicide, cobalt silicide, or titanium silicide. The cell gate dielectric pattern GI includes at least one of silicon oxide, silicon nitride, or silicon oxynitride. The cell gate capping pattern GCAP includes at least one of silicon oxide, silicon nitride, or silicon oxynitride.

According to a present embodiment, a first dopant injection region SD1 and second dopant injection regions SD2 are provided in the cell active region CACT. The second dopant injection regions SD2 are spaced apart from each other with the first dopant injection region SD1 interposed therebetween. The first dopant injection region SD1 is provided between a pair of the word lines WL that intersect the cell active region CACT. The second dopant injection regions SD2 are spaced apart from each other with the pair of word lines WL interposed therebetween. The first dopant injection region SD1 is positioned deeper in the substrate 100 than the second dopant injection regions SD2. The first and second dopant injection regions SD1 and SD2 include dopants of the same conductivity type.

According to a present embodiment, bit lines BL that intersect the word lines WL are provided on the cell region CR of the substrate 100. The bit lines BL extend in the first direction D1 and are spaced apart in the second direction D2. Each of the bit lines BL includes a conductive contact 202 electrically connected to the first dopant injection region SD1, a conductive line 204 on the conductive contact 202 that extends in the first direction D1, a capping pattern 206 on a top surface of the conductive line 204, and spacer patterns 208 on sidewalls of the conductive line 204. The bit line BL is electrically connected to the first dopant injection region SD1 of the cell active region CACT through the conductive contact 202. The conductive contact 202 is in contact with the first dopant injection region SD1. The conductive contact 202 includes at least one of a doped semiconductor material, such as doped silicon or doped germanium, a conductive metal nitride, such as titanium nitride or tantalum nitride, a metal, such as tungsten, titanium, or tantalum, or a metal-semiconductor compound, such as tungsten silicide, cobalt silicide, or titanium silicide. The conductive line 204 includes at least one of a conductive metal nitride, such as titanium nitride or tantalum nitride, a metal, such as tungsten, titanium, or tantalum, or a metal-semiconductor compound, such as tungsten silicide, cobalt silicide, or titanium silicide. Each of the capping pattern 206 and the spacer pattern 208 includes at least one of silicon nitride, silicon oxide, or silicon oxynitride.

According to a present embodiment, a first interlayer insulating layer 220 is provided on the substrate 100 to cover the bit lines BL. The first interlayer insulating layer 220 includes at least one of a silicon oxide layer, a silicon nitride layer, or a silicon oxynitride layer. Buried contacts 210 are provided in the first interlayer insulating layer 220. The buried contacts 210 penetrate the first interlayer insulating layer 220 to be electrically connected to the second dopant injection regions SD2 of the cell active region CACT. The buried contacts 210 include a conductive material such as doped silicon or a metal.

According to a present embodiment, a capacitor structure CAS is provided on the first interlayer insulating layer 220. The capacitor structure CAS includes bottom electrodes BE on the first interlayer insulating layer 220 that are connected to the buried contacts 210. The bottom electrodes BE have a cup shape. However, embodiments of the inventive concepts are not limited thereto. The capacitor structure CAS includes a top electrode TE that covers the bottom electrodes BE. The bottom electrodes BE are buried in the top electrode TE. In addition, the capacitor structure CAS includes a dielectric layer 230 disposed between the top electrode TE and each of the bottom electrodes BE. The bottom electrodes BE and the top electrode TE include at least one of doped poly-silicon, a metal, a metal silicide, or a metal nitride. The dielectric layer 230 includes at least one of an oxide layer, such as a silicon oxide layer, a nitride layer, such as a silicon nitride layer, an oxynitride layer, such as a silicon oxynitride layer, or a high-k dielectric layer, such as a hafnium oxide layer.

According to a present embodiment, a peripheral gate structure PGS that intersects the peripheral active region PACT is disposed on the peripheral circuit region PR of the substrate 100. The peripheral gate structure PGS includes a peripheral gate electrode PGE that intersects the peripheral active region PACT, a peripheral gate dielectric pattern PGI between the substrate 100 and the peripheral gate electrode PGE, a peripheral gate capping pattern PCAP on a top surface of the peripheral gate electrode PGE, and peripheral gate spacers on sidewalls of the peripheral gate electrode PGE. Source/drain regions are provided in the peripheral active region PACT at both sides of the peripheral gate structure PGS.

According to a present embodiment, if the first and second peripheral insulating patterns 124I and 126I include a nitride layer, an HEIP phenomenon may occur at a peripheral transistor that includes the peripheral gate structure PGS and the source/drain regions. However, according to embodiments of the inventive concepts, the first and second peripheral insulating patterns 124I and 126I do not include a nitride, and thus it is possible to prevent an effective channel length of the peripheral transistor from being reduced. As a result, electrical characteristics of a semiconductor device that includes a peripheral transistor can be improved.

According to a present embodiment, the upper portions of the first and second peripheral insulating patterns 124I and 126I protrude from the top surface 100U of the substrate 100, i.e., the top surface 100P of the peripheral active region PACT. In this case, a remaining portion of a peripheral gate electrode layer on the first and second peripheral insulating patterns 124I and 126I can be easily removed during a patterning process that forms the peripheral gate electrode PGE. Thus, an electrical short between adjacent peripheral gate electrodes PGE can be prevented.

According to a present embodiment, the first interlayer insulating layer 220 extends along the top surface 100U of the substrate 100 and covers the peripheral gate structure PGS. A second interlayer insulating layer 240 is disposed on the peripheral circuit region PR of the substrate 100. The first interlayer insulating layer 220 is disposed between the peripheral gate structure PGS and the second interlayer insulating layer 240. The second interlayer insulating layer 240 includes at least one of a silicon oxide layer, a silicon nitride layer, or a silicon oxynitride layer.

Figure 42:
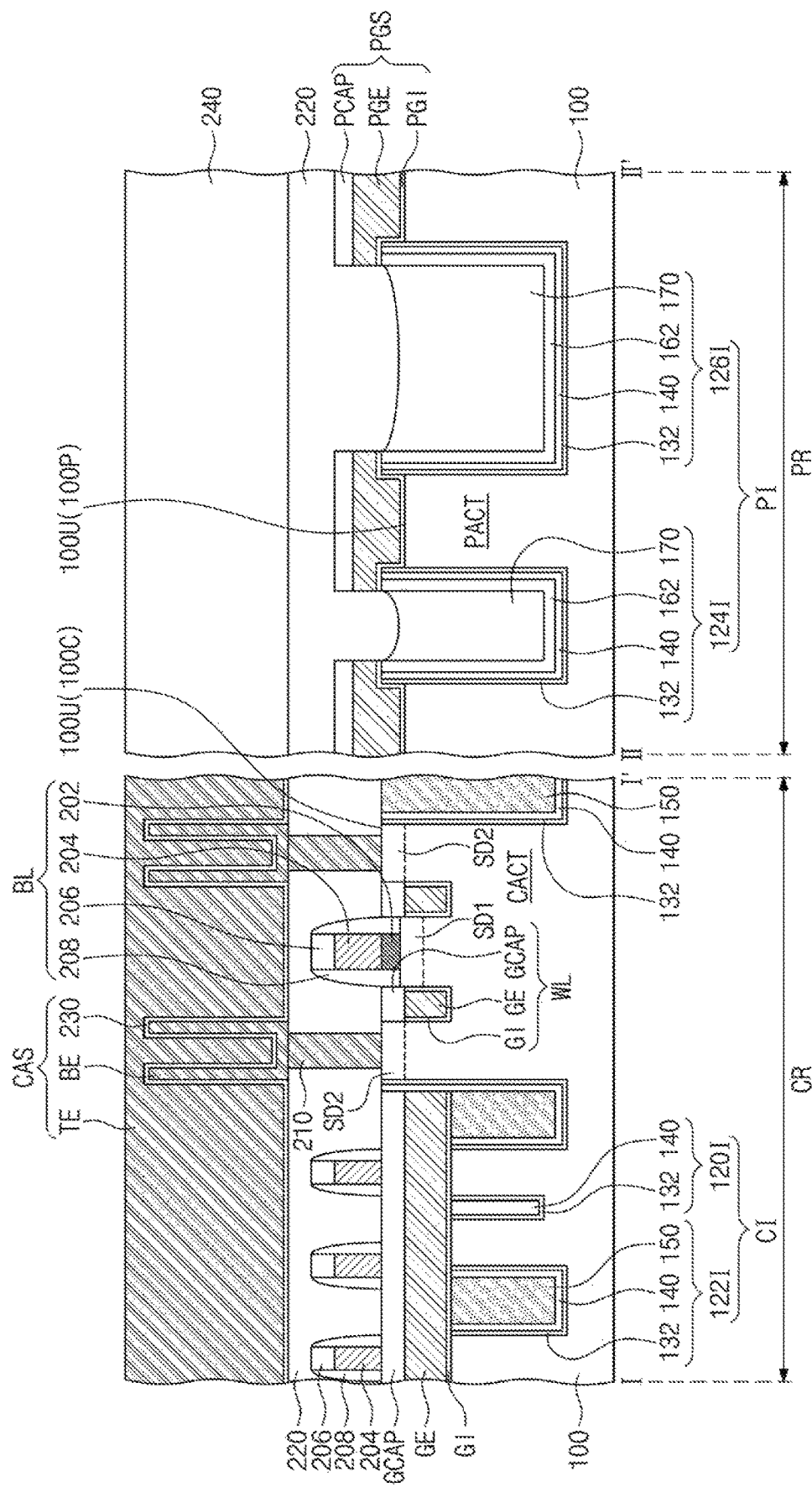
FIG. 42 is a cross-sectional view taken along lines I-I' and II-II' of FIG. 40 that illustrates a semiconductor device according to some embodiments of the inventive concepts.

FIG. 42 is a cross-sectional view that corresponds to lines I-I' and II-II' of FIG. 40 that illustrates a semiconductor device according to some embodiments of the inventive concepts. Hereinafter, differences between an embodiment of FIG. 42 and embodiments described with reference to FIGS. 40 and 41 will be mainly described for the purpose of ease and convenience in explanation.

Referring to FIGS. 40 and 42, according to a present embodiment, the cell active region CACT, the peripheral active region PACT, the first and second cell insulating patterns 120I and 122I and the first and second peripheral insulating patterns 124I and 126I are formed using at least one of the methods for fabricating the semiconductor device that was described with reference to FIGS. 29 to 38 and 39A to 39E. For example, the top surface 100P of the peripheral active region PACT is positioned lower with respect to the bottom surface 100B of the substrate 100 than the top surface 100C of the cell active region CACT. In this case, each of the first and second peripheral insulating patterns 124I and 126I protrudes from the top surface 100P of the peripheral active region PACT. Other features of a semiconductor device according to a present embodiment except these features are substantially the same as corresponding features of a semiconductor device described with reference to embodiments depicted in FIGS. 40 and 41.

According to embodiments of the inventive concepts, a reduction in effective channel length of the transistor can be prevented, and an electrical short between adjacent gate electrodes can be prevented. As a result, the electrical characteristics of a semiconductor device can be improved.

While embodiments of the inventive concepts have been described with reference to exemplary embodiments, it will be apparent to those skilled in the art that various changes and modifications may be made without departing from the spirits and scopes of the exemplary embodiments of the inventive concepts. Therefore, it should be understood that the exemplary embodiments are not limiting, but illustrative. Thus, the scopes of the embodiments of the inventive concepts are to be determined by the broadest permissible interpretation of the following claims and their equivalents, and shall not be restricted or limited by the foregoing description.

What is claimed is:

1. A semiconductor device, comprising:
   a substrate that includes a cell region and a peripheral circuit region;
   a cell insulating pattern disposed in the cell region of the substrate that defines a cell active region;
   a peripheral insulating pattern disposed in the peripheral circuit region of the substrate that defines a peripheral active region;
   a pair of word lines intersecting the cell active region and the cell insulating pattern;
   a first dopant injection region in the cell active region between the pair of word lines;
   second dopant injection regions in the cell active region, the second dopant injection regions spaced apart from each other with the pair of word lines interposed therebetween;
   a bit line connected to the first dopant injection region of the cell active region; and
   a capacitor connected to one of the second dopant injection regions of the cell active region,
   wherein the peripheral insulating pattern comprises: a first peripheral insulating pattern having a first width; and a second peripheral insulating pattern having a second width greater than the first width,
   wherein the cell insulating pattern comprises: a first cell insulating pattern having a third width; and a second cell insulating pattern having a fourth width greater than the third width, and
   wherein a topmost surface of at least one of the first peripheral insulating pattern and the second peripheral insulating pattern is positioned higher than a topmost surface of the cell insulating pattern.

2. The semiconductor device of claim 1, wherein each of the pair of word lines includes:
   a cell gate electrode buried in the cell active region and the cell insulating pattern,
   a cell gate dielectric pattern between the cell gate electrode and the cell active region and between the cell gate electrode and the cell insulating pattern, and
   a cell gate capping pattern on a top surface of the cell gate electrode.

3. The semiconductor device of claim 2, wherein a top surface of the cell gate capping pattern is substantially coplanar with a top surface of the cell active region.

4. The semiconductor device of claim 3, wherein the topmost surface of the cell insulating pattern is substantially coplanar with the top surface of the cell active region.

5. The semiconductor device of claim 4, wherein a top surface of the peripheral active region and the top surface of the cell active region are positioned at a same height with respect to a bottom surface of the substrate.

6. The semiconductor device of claim 5, wherein the at least one of the first peripheral insulating pattern and the second peripheral insulating pattern protrudes from the top surface of the peripheral active region.

7. The semiconductor device of claim 1, further comprising:
   a peripheral gate electrode intersecting the peripheral active region,
   a peripheral gate dielectric pattern between the peripheral gate electrode and the peripheral active region,
   a peripheral gate capping pattern on a top surface of the peripheral gate electrode, and peripheral gate spacers on sidewalls of the peripheral gate electrode.

8. The semiconductor device of claim 7, wherein the peripheral gate electrode extends on the topmost surface of the at least one of the first peripheral insulating pattern and the second peripheral insulating pattern.

9. The semiconductor device of claim 1, wherein the bit line includes:
a conductive contact connected to the first dopant injection region of the cell active region, and
a conductive line on the conductive contact and extending in a first direction.

10. The semiconductor device of claim 9, wherein the pair of word lines extend in a second direction crossing the first direction, and spaced apart from each other in the first direction.

11. The semiconductor device of claim 10, wherein the cell active region has a bar shape extending in a third direction crossing the first direction and the second direction.

12. The semiconductor device of claim 1, further comprising:
a buried contact connected to the one of the second dopant injection regions,
wherein the capacitor includes:
a bottom electrode connected to the buried contact,
a top electrode covering the bottom electrode, and
a dielectric layer between the bottom electrode and the top electrode.

13. The semiconductor device of claim 1,
wherein the second cell insulating pattern includes a nitride, and
wherein none of the first cell insulating pattern, the first peripheral insulating pattern and the second peripheral insulating pattern includes a nitride.

14. The semiconductor device of claim 1, wherein the at least one of the first peripheral insulating pattern and the second peripheral insulating pattern includes a downward recessed top surface.

15. The semiconductor device of claim 1, wherein the second peripheral insulating pattern includes a material that is less dense than a material of the first peripheral insulating pattern.

16. The semiconductor device of claim 1, wherein a topmost surface of one of the first peripheral insulating pattern and the second peripheral insulating pattern is positioned higher than the topmost surface of the cell insulating pattern, and wherein a topmost surface of the other of the first peripheral insulating pattern and the second peripheral insulating pattern is positioned lower than the topmost surface of the one of the first peripheral insulating pattern and the second peripheral insulating pattern.

17. A semiconductor device, comprising:
a substrate that includes a cell region and a peripheral circuit region;
a cell insulating pattern disposed in the cell region of the substrate that defines a cell active region;
a peripheral insulating pattern disposed in the peripheral circuit region of the substrate that defines a peripheral active region;
a pair of word lines intersecting the cell active region and the cell insulating pattern, the pair of word lines spaced apart from each other in a first direction and extending in a second direction crossing the first direction
a bit line intersecting the pair of word lines, the bit line extending in the first direction and connected to the cell active region; and
a capacitor connected to the cell active region,
wherein the peripheral insulating pattern comprises: a first peripheral insulating pattern having a first width; and a second peripheral insulating pattern having a second width greater than the first width,
wherein the cell insulating pattern comprises: a first cell insulating pattern having a third width; and a second cell insulating pattern having a fourth width greater than the third width, and
wherein a topmost surface of at least one of the first peripheral insulating pattern and the second peripheral insulating pattern is positioned higher than a topmost surface of the cell insulating pattern.

18. The semiconductor device of claim 17, wherein the at least one of the first peripheral insulating pattern and the second peripheral insulating pattern protrudes from a top surface of the peripheral active region.

19. The semiconductor device of claim 18, wherein the top surface of the peripheral active region and a top surface of the cell active region are positioned at a same height with respect to a bottom surface of the substrate.

20. The semiconductor device of claim 19, wherein the topmost surface of the cell insulating pattern is substantially coplanar with the top surface of the cell active region.

* * * * *